United States Patent
Tsuji et al.

(10) Patent No.: US 12,441,750 B2
(45) Date of Patent: Oct. 14, 2025

(54) ORGANIC METAL COMPLEX, ORGANIC LIGHT-EMITTING DEVICE INCLUDING THE SAME, DISPLAY APPARATUS, IMAGING APPARATUS, ELECTRONIC APPARATUS, ILLUMINATION APPARATUS, AND MOVING OBJECT

(71) Applicant: CANON KABUSHIKI KAISHA, Tokyo (JP)

(72) Inventors: Tomokazu Tsuji, Fukui (JP); Kenji Yamada, Kanagawa (JP); Akira Tsuboyama, Tokyo (JP); Yuto Ito, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 888 days.

(21) Appl. No.: 17/692,904

(22) Filed: Mar. 11, 2022

(65) Prior Publication Data

US 2022/0306666 A1    Sep. 29, 2022

(30) Foreign Application Priority Data

Mar. 17, 2021 (JP) ................. 2021-043285

(51) Int. Cl.
*H01L 51/50* (2006.01)
*C07F 15/00* (2006.01)
(Continued)

(52) U.S. Cl.
CPC ....... *C07F 15/0033* (2013.01); *H10K 85/342* (2023.02); *H10K 50/11* (2023.02);
(Continued)

(58) Field of Classification Search
CPC ........ H10K 50/10; H10K 50/15; H10K 50/30; H10K 50/113; H10K 50/622; H10K 50/631
See application file for complete search history.

(56) References Cited

U.S. PATENT DOCUMENTS

2008/0269491 A1\* 10/2008 Jabbour ............... H10K 85/342
546/4

FOREIGN PATENT DOCUMENTS

JP    2009114137 A    5/2009

\* cited by examiner

*Primary Examiner* — Gregory D Clark
(74) *Attorney, Agent, or Firm* — Canon U.S.A., Inc. IP Division

(57) ABSTRACT

An organic metal complex represented by formula (1) and having a ligand represented by formula (2).

$$ML_m L'_n L''_l \quad (1)$$

In formula (1), M represents a transition metal, and $L_m$, $L'_n$, and $L''_l$ represent ligands different from each other.

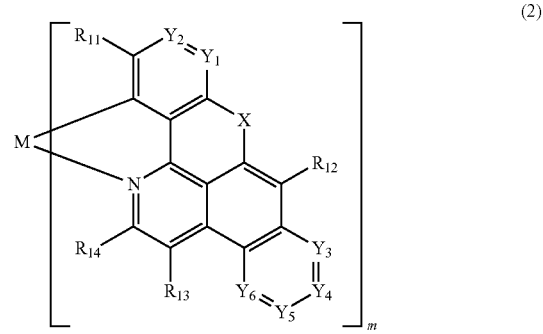

(2)

In formula (2), $R_{11}$ to $R_{14}$ are each independently selected from the group consisting of a hydrogen atom and a substituent. X is selected from the group consisting of CRR', SiRR', S, SO, and $SO_2$. $Y_1$ to $Y_6$ are each independently selected from the group consisting of a carbon atom and a (Continued)

nitrogen atom. When $Y_3$ to $Y_6$ are carbon atoms, each of the carbon atoms may be bound to a carbon atom adjacent to the carbon atom to form a ring structure.

21 Claims, 7 Drawing Sheets

(51) Int. Cl.
*H10K 85/30* (2023.01)
*H10K 50/11* (2023.01)
*H10K 50/84* (2023.01)
*H10K 59/80* (2023.01)
*H10K 101/10* (2023.01)

(52) U.S. Cl.
CPC ......... *H10K 50/841* (2023.02); *H10K 59/871* (2023.02); *H10K 2101/10* (2023.02)

ORGANIC METAL COMPLEX, ORGANIC LIGHT-EMITTING DEVICE INCLUDING THE SAME, DISPLAY APPARATUS, IMAGING APPARATUS, ELECTRONIC APPARATUS, ILLUMINATION APPARATUS, AND MOVING OBJECT

BACKGROUND OF THE INVENTION

Field of the Invention

The present disclosure relates to an organic metal complex having a small peak width of the emission spectrum, an organic light-emitting device including the same, a display apparatus, an imaging apparatus, an electronic apparatus, an illumination apparatus, and a moving object.

Description of the Related Art

Organic light-emitting devices (also referred to as organic electroluminescence devices or organic EL devices) are electronic devices each including a first electrode, a second electrode, and an organic compound layer disposed between the electrodes. The injection of electrons and holes from this pair of electrodes generates excitons of a light-emitting organic compound in the organic compound layer, and the organic light-emitting device emits light when the excitons return to the ground state. Recently, organic light-emitting devices have been remarkably progressed, and, for example, low drive voltage, a wide variety of emission wavelengths, high-speed response, and reduction in thickness and weight of light-emitting devices have been achieved.

To improve the performance of organic light-emitting devices, light-emitting organic compounds having higher performance have been desired, and developments have been actively performed. However, in phosphorescent materials typified by iridium complexes, it is known to be difficult to achieve both an improvement in color purity by a decrease in the peak width of the emission spectrum and an improvement in light emission efficiency. Japanese Patent Laid-Open No. 2009-114137 (hereinafter, PTL 1) describes a compound A below as a phosphorescent light-emitting material having high light emission efficiency. U.S. Patent Application Publication No. 2017/0012223 (hereinafter, PTL 2) describes a compound B below as a compound having a small peak width of the emission spectrum.

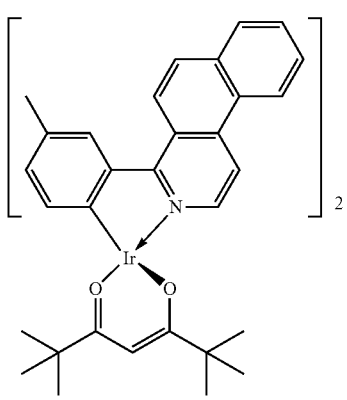

Compound A

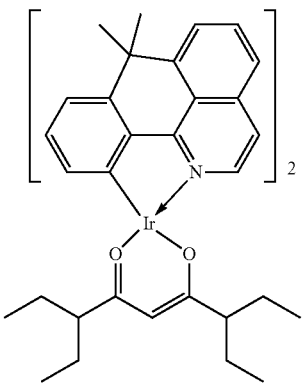

Compound B

Although the compound A described in PTL 1 is a compound having high light emission efficiency, the peak width of the emission spectrum is not insufficiently small. The compound B described in PTL 2 has a small peak width of the emission spectrum but has insufficient light emission efficiency.

It is known that when the steepness of the emission spectrum of a phosphorescent material is increased, the light emission efficiency decreases. Thus, an organic metal complex having both a small peak width of the emission spectrum and high light emission efficiency has been desired.

SUMMARY OF THE INVENTION

The present disclosure addresses the aforementioned issues and provides an organic metal complex having a small half-value width of a peak of the emission spectrum and having high light emission efficiency.

The present disclosure provides an organic metal complex represented by formula (1) below.

$$ML_m L'_n L''_l \qquad (1)$$

In formula (1), M represents a transition metal, and $L_m$, $L'_n$, and $L''_l$ represent ligands different from each other. m is an integer of 1 to 3, n is an integer of 0 to 2, and l is an integer of 0 to 2; and m+n+l=3. $ML_m$ is a structure represented by formula (2) below.

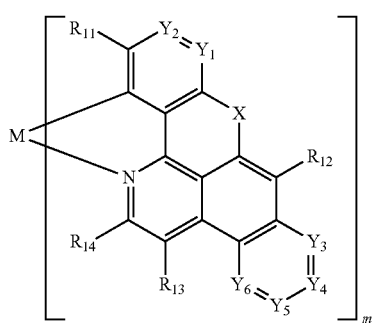

(2)

In formula (2), $R_{11}$ to $R_{14}$ are each independently selected from the group consisting of a hydrogen atom, a deuterium atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted aralkyl group, a substituted or unsubstituted amino group, a silyl group, and a cyano group.

X is selected from the group consisting of CRR', SiRR', S, SO, and SO$_2$. R and R' are each independently selected from the group consisting of a substituted or unsubstituted alkyl group, a substituted or unsubstituted aryl group, and a halogen atom.

$Y_1$ to $Y_6$ are each independently selected from the group consisting of a carbon atom and a nitrogen atom.

When $Y_1$ to $Y_6$ are carbon atoms, the carbon atoms may each be substituted with an alkyl group or an aryl group.

When $Y_3$ to $Y_6$ are carbon atoms, each of the carbon atoms may be bound to a carbon atom adjacent to the carbon atom to form a ring structure.

ML'$_n$ and ML"$_l$ are each independently selected from the group consisting of formulae (4) and (5) below.

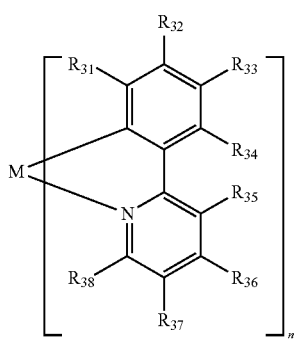

(4)

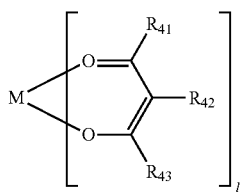

(5)

In formulae (4) and (5), $R_{31}$ to $R_{38}$ and $R_{41}$ to $R_{43}$ are each independently selected from the group consisting of a hydrogen atom, a deuterium atom, a halogen atom, a substituted or unsubstituted alkyl group, a substituted or unsubstituted alkoxy group, a substituted or unsubstituted aralkyl group, a substituted amino group, a substituted or unsubstituted aryl group, and a substituted or unsubstituted heterocyclic group.

Further features of the present disclosure will become apparent from the following description of exemplary embodiments with reference to the attached drawings.

DESCRIPTION OF THE EMBODIMENTS

Figure 1:
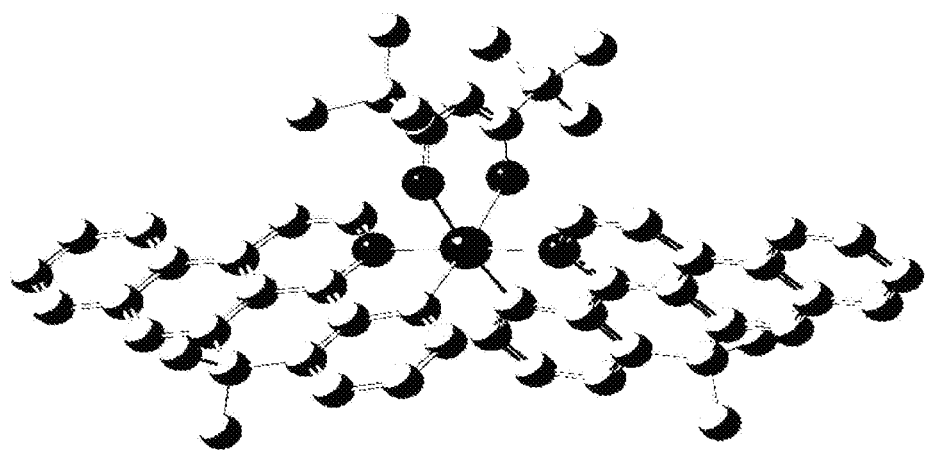
FIG. 1 illustrates a molecular structure model of exemplary compound A-1.

An organic metal complex according to one embodiment of the present disclosure is represented by formula (1) below.

$$ML_mL'_nL''_l \quad (1)$$

In formula (1), M represents a transition metal, and $L_m$, $L'_n$, and $L''_l$ represent ligands different from each other. m is an integer of 1 to 3, n is an integer of 0 to 2, and l is an integer of 0 to 2; and m+n+l=3. $ML_m$ is a structure represented by formula (2) below.

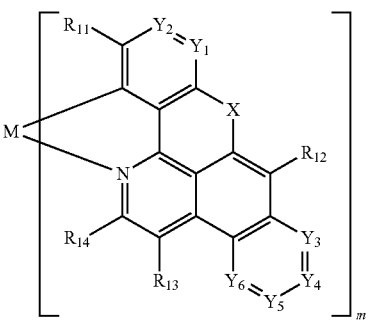

(2)

In formula (2), $R_{11}$ to $R_{14}$ are each independently selected from the group consisting of a hydrogen atom, a deuterium atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted aralkyl group, a substituted or unsubstituted amino group, a silyl group, and a cyano group.

X is selected from the group consisting of CRR', SiRR', S, SO, and SO$_2$. R and R' are each independently selected from the group consisting of a substituted or unsubstituted alkyl group, a substituted or unsubstituted aryl group, and a halogen atom.

$Y_1$ to $Y_6$ are each independently selected from the group consisting of a carbon atom and a nitrogen atom.

When $Y_1$ to $Y_6$ are carbon atoms, each of the carbon atoms may be substituted with an alkyl group or an aryl group. When the carbon atom is not substituted with an alkyl group or an aryl group, the carbon atom has a hydrogen atom.

When $Y_3$ to $Y_6$ are carbon atoms, each of the carbon atoms may be bound to a carbon atom adjacent to the carbon atom to form a ring structure. When carbon atoms are bound together to form a ring structure, the ring structure may be an alicyclic structure, an aromatic ring, or a heterocyclic ring, and the number of fused rings constituting the ring structure may be 1 to 3 and is preferably 1.

$Y_1$ may be a nitrogen atom. When $Y_1$ is a nitrogen atom, the highest occupied molecular orbital (HOMO) of the organic metal complex is lowered, and thus the emission wavelength is shifted to shorter wavelengths. On the other hand, $Y_4$ or $Y_{10}$ may be a nitrogen atom. When these are nitrogen atoms, the lowest unoccupied molecular orbital (LUMO) of the organic metal complex is lowered, and thus the emission wavelength is further shifted to longer wavelengths.

When carbon atoms of $Y_3$ to $Y_6$ are bound to adjacent carbon atoms together to form a ring structure, the organic metal complex may be represented by formula (3) below. This is because an organic metal complex having high light emission efficiency is provided compared with the case where the ring structure is formed at other positions.

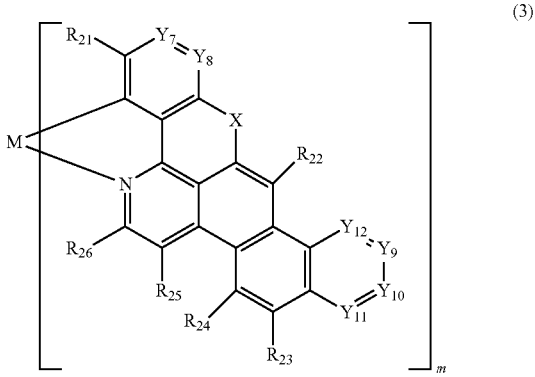

(3)

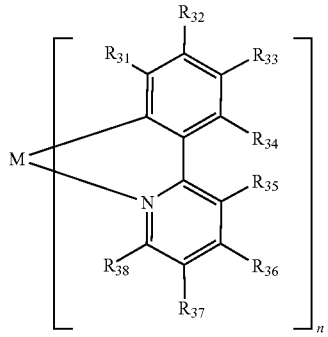

(4)

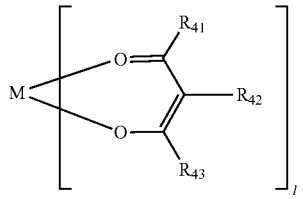

(5)

In formula (3), $R_{21}$ to $R_{26}$ are each independently selected from the group consisting of a hydrogen atom, a deuterium atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted aralkyl group, a substituted or unsubstituted amino group, a silyl group, and a cyano group.

X is selected from the group consisting of CRR', SiRR', S, SO, and $SO_2$. R and R' are each independently selected from the group consisting of a substituted or unsubstituted alkyl group, a substituted or unsubstituted aryl group, and a halogen atom.

$Y_7$ to $Y_{12}$ are each independently selected from the group consisting of a carbon atom and a nitrogen atom.

When $Y_7$ to $Y_{12}$ are carbon atoms, the carbon atoms may each be substituted with an alkyl group or an aryl group.

$Y_1$ to $Y_{12}$ may be all carbon atoms. When $Y_1$ to $Y_{12}$ are all carbon atoms, the organic metal complex has high stability.

$ML'_n$ and $ML''_l$ are each independently selected from the group consisting of formulae (4) and (5) below.

In formulae (4) and (5), $R_{31}$ to $R_{38}$ and $R_{41}$ to $R_{43}$ are each independently selected from the group consisting of a hydrogen atom, a deuterium atom, a halogen atom, a substituted or unsubstituted alkyl group, a substituted or unsubstituted alkoxy group, a substituted or unsubstituted aralkyl group, a substituted amino group, a substituted or unsubstituted aryl group, and a substituted or unsubstituted heterocyclic group.

In formula (5), $R_{41}$ and $R_{43}$ may each independently be an alkyl having 1 to 8 carbon atoms. $R_{41}$ and $R_{43}$ may each independently be a methyl group, an ethyl group, an isopropyl group, a t-butyl group, or —$CH(C_2H_5)_2$. When the substituents represented by $R_{41}$ to $R_{43}$ are bulky substituents, the organic metal complex can have improved heat resistance and sublimability in some cases. In particular, the combination of $R_{41}$, $R_{42}$, and $R_{43}$ may be a combination of an isopropyl group, a hydrogen atom, and an isopropyl group. The combination of $R_{41}$, $R_{42}$, and $R_{43}$ may be a combination of —$CH(C_2H_5)_2$, a hydrogen atom, and —$CH(C_2H_5)_2$. The combination of $R_{41}$, $R_{42}$, and $R_{43}$ may be a combination of a t-butyl group, a hydrogen atom, and a t-butyl group. The combination of $R_{41}$, $R_{42}$, and $R_{43}$ may be a combination of an ethyl group, a hydrogen atom, and a methyl group.

In the present specification, the transition metal atom may be trivalent, and specific examples thereof include Ir, Co, Ru, Os, Rh, and Re. The transition metal atom may be Ir.

In the present specification, examples of the halogen atom include, but are not limited to, fluorine, chlorine, bromine, and iodine. Of these halogen atoms, a fluorine atom may be provided.

In the present specification, examples of the alkyl group include alkyl groups having 1 to 10 carbon atoms. Alkyl groups having 1 to 8 carbon atoms are more preferred, and alkyl groups having 1 to 4 carbon atoms are still more preferred. Specific examples thereof include, but are not limited to, a methyl group, an ethyl group, a normal propyl group, an isopropyl group, a normal butyl group, a tertiary butyl group, a secondary butyl group, an octyl group, a cyclopentyl group, a cyclohexyl group, a 1-adamantyl group, and a 2-adamantyl group.

In the present specification, examples of the alkoxy group include alkoxy groups having 1 to 10 carbon atoms. Alkoxy groups having 1 to 6 carbon atoms are more preferred, and alkoxy groups having 1 to 4 carbon atoms are still more preferred. Specific examples thereof include, but are not limited to, a methoxy group, an ethoxy group, a propoxy group, a 2-ethylhexyloxy group, and a benzyloxy group.

In the present specification, examples of the amino group include an unsubstituted amino group and amino groups substituted with any of an alkyl group, an aryl group, and an amino group. The alkyl group, aryl group, and amino group each may have a halogen atom as a substituent. The aryl group and amino group each may have an alkyl group as a substituent. Alkyl groups serving as substituents of the amino group may be bound together to form a ring. Specific examples thereof include, but are not limited to, an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisolylamino group, an N-mesityl-N-phenylamino group, an N,N-dimesitylamino group, an N-phenyl-N-(4-tert-butylphenyl) amino group, an N-phenyl-N-(4-trifluoromethylphenyl) amino group, and an N-piperidyl group.

In the present specification, examples of the aryl group include aryl groups having 6 to 18 carbon atoms. Specific examples thereof include a phenyl group, a naphthyl group, an indenyl group, a biphenyl group, a terphenyl group, a fluorenyl group, a phenanthryl group, and a triphenylenyl group.

In the present specification, examples of the heterocyclic group include heterocyclic groups having 3 to 15 carbon atoms.

The heterocyclic group may have nitrogen, sulfur, or oxygen as a heteroatom. Specific examples thereof include, but are not limited to, a pyridyl group, a pyrazyl group, a pyrimidyl group, a triazyl group, an imidazolyl group, an oxazolyl group, an oxadiazolyl group, a thiazolyl group, a thiadiazolyl group, a carbazolyl group, an acridinyl group, a phenanthrolyl group, a furanyl group, a thiophenyl group, a dibenzofuranyl group, and a dibenzothiophenyl group.

In the present specification, examples of the aryloxy group include, but are not limited to, a phenoxy group and a thienyloxy group.

In the present specification, examples of the silyl group include, but are not limited to, a trimethylsilyl group and a triphenylsilyl group.

The alkyl group, alkoxy group, amino group, aryl group, heterocyclic group, and aryloxy group each may have a deuterium atom as a substituent. Examples of the alkyl group having deuterium atoms as substituents include, but are not limited to, —CD$_3$, —CD$_2$CH$_3$, and —CD$_2$CD$_3$.

The alkyl group, alkoxy group, amino group, aryl group, heterocyclic group, and aryloxy group each may have a halogen atom as a substituent. Examples of the halogen atom include fluorine, chlorine, bromine, and iodine. The halogen atom may be a fluorine atom. In particular, an alkyl group having fluorine atoms may be a trifluoromethyl group (—CF$_3$) or a pentafluoroethyl group (—C$_2$F$_5$).

The amino group, aryl group, heterocyclic group, and aryloxy group each may have an alkyl group as a substituent. The alkyl group may have 1 to 10 carbon atoms. More specifically, the alkyl group may be a methyl group, an ethyl group, a normal propyl group, an isopropyl group, a normal butyl group, or a tertiary butyl group.

The alkyl group, alkoxy group, amino group, aryl group, heterocyclic group, and aryloxy group each may have an aryl group as a substituent. The aryl group may have 6 to 12 carbon atoms. More specifically, the aryl group may be a phenyl group, a biphenyl group, or a naphthyl group.

The alkyl group, alkoxy group, amino group, aryl group, heterocyclic group, and aryloxy group each may have a heterocyclic group as a substituent. The heterocyclic group may have 3 to 9 carbon atoms. The heterocyclic group may have nitrogen, sulfur, or oxygen as a heteroatom. More specifically, the heterocyclic group may be a pyridyl group or a pyrrolyl group.

The alkyl group, alkoxy group, amino group, aryl group, heterocyclic group, and aryloxy group each may have an amino group as a substituent. The amino group may have an alkyl group or an aryl group. The alkyl groups may be bound to each other to form a ring. Specifically, the amino group may be a dimethylamino group, a diethylamino group, a dibenzylamino group, a diphenylamino group, or a ditolylamino group.

The alkyl group, alkoxy group, amino group, aryl group, heterocyclic group, and aryloxy group each may have, as a substituent, for example, an aralkyl group such as a benzyl group, an alkoxy group such as a methoxy group, an ethoxy group, or a propoxy group, an aryloxy group such as a phenoxy group, or a cyano group. The substituent is not limited thereto.

Next, characteristics of the organic metal complex represented by formula (1) will be described. FIG. 1 is a view illustrating a molecular model of an organic metal complex represented by a chemical structural formula below.

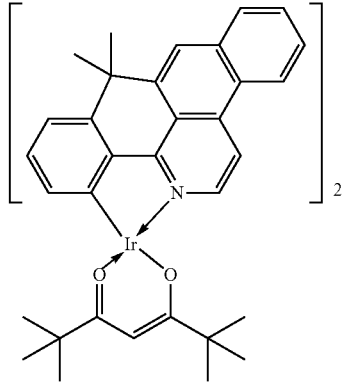

Chemical structure

The above chemical structural formula represents a three-dimensional structure of a molecule in which R$^{11}$ to R$^{26}$ are each a hydrogen atom, X is a C(CH$_3$)$_2$ group, and Y$_1$ to Y$_8$ are each a carbon atom in formulae (2) and (3). In the organic metal complex represented by the chemical structural formula, a benzoisoquinoline (hereinafter, referred to as BIQ) ring bound to Ir and a phenyl group bound to Ir are bound to each other. The organic metal complex has a ligand (hereinafter, referred to as a main ligand) having a cyclic structure in which the phenyl group and the BIQ ring are also bound to each other at another position. The compound represented by the above chemical structural formula is an organic metal complex having the two main ligands and one ligand (hereinafter, referred to as an auxiliary ligand) formed of dipivaloylmethane.

The organic metal complex represented by this chemical structural formula is exemplary compound A-1 described below. In the following description, the organic metal complex represented by this chemical structural formula is referred to as "exemplary compound A-1".

The three-dimensional structure illustrated in FIG. 1 and each parameter of molecular orbital calculations described below were determined by structural optimization calculation in the ground state using electronic state calculation software, Gaussian 09*Revision C.01. For the calculation, the density functional theory was employed as a quantum chemical calculation method, and LC-BLYP was used as the functional. For Gaussian 09, Revision C.01, 6-31$^+$G** was used as the basis function.

Gaussian 09, Revision C.01, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr. J. E. Peralta, F. Ogliaro, M. Bearpark, J. J. Heyd, E. Brothers, K. N. Kudin, V. N. Staroverov, T. Keith, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc. Wallingford CT, 2010.

In FIG. 1, exemplary compound A-1 has two main ligands and one auxiliary ligand. The main ligands each have a BIQ ring and a phenyl ring bound to the BIQ ring, and a carbon atom adjacent to a carbon atom on the BIQ ring to which the phenyl ring is bound and a carbon atom adjacent to a carbon atom on the phenyl ring to which the BIQ ring is bound form a six-membered ring. The auxiliary ligand is dipivaloylmethane.

The BIQ ring and the phenyl ring have not only a single bond but also another bridged structure to form a cyclic ligand. This provides a small peak width of the emission spectrum and a performance with high light emission efficiency.

Having a BIQ ring is advantageous to improve the emission quantum yield. To enhance the efficiency of the emission quantum yield of a phosphorescent material such as an iridium complex, it is effective to increase the transition dipole moment of the complex in the excited state and improve the oscillator strength.

In the iridium complex having a BIQ ring, the conjugation is appropriately extended in a direction in which the center of gravity of the conjugated plane becomes more distant from the metal atom. Accordingly, in the excited state of the complex, the moving distance of an electron from the metal atom to the ligand increases, and the transition dipole moment can be increased to improve the oscillator strength. Therefore, an organic metal complex having high light emission efficiency is provided.

The following demonstrates that the organic metal complex according to the present disclosure has a large dipole moment. For Ref-1 described in PTL 2, comparative compounds 1 and 2 in which one ring structure was fused to Ref-1, and exemplary compound A-1, the oscillator strength of each of the compounds was calculated by molecular orbital calculations.

The structures of Ref-1, comparative compounds 1 and 2, and exemplary compound A-1 are shown below. Table 1 shows the values of the highest occupied molecular orbital (HOMO), the lowest unoccupied molecular orbital (LUMO), the maximum emission peak wavelength (λmax. calc.), and the oscillator strength of each of the structures, the values being calculated by the molecular orbital calculations.

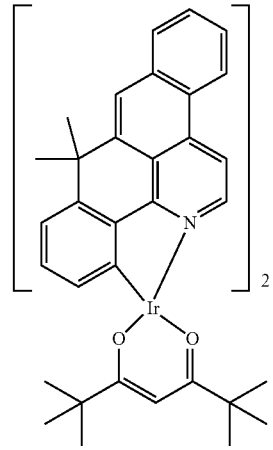

A-1

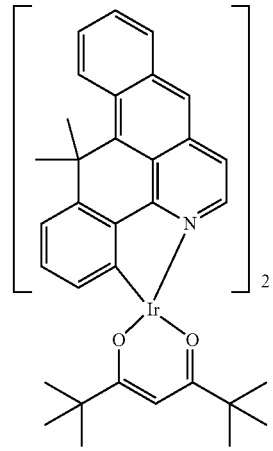

A-1'

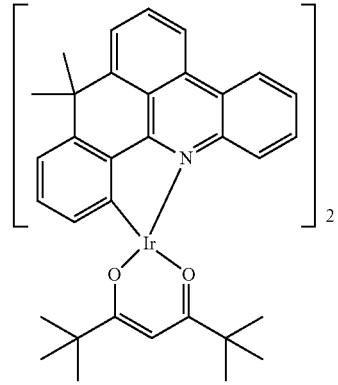

A-1"

-continued

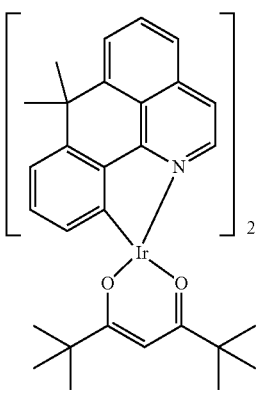

Ref-1 small difference in structure between the ground state and the excited state has a small peak width of the emission spectrum. Iridium complexes having cyclic ligands have rigid structures of the compounds, and thus the change in the structure between the ground state and the excited state is reduced. Therefore, the organic metal complex according to the present disclosure having a cyclic ligand has a small peak width of the emission spectrum. The small peak width may mean that the half-value width is 40 nm or less.

As illustrated in FIG. 1, the structure of exemplary compound A-1 has increased rigidity due to the cyclic ligands, and exemplary compound A-1 has a structure with very high planarity. To demonstrate the planarity of compounds, the dihedral angle of exemplary compound A-1 was compared with the dihedral angle of comparative compound 3 having ligands that were not cyclic. The dihedral angles were each calculated by molecular orbital calculations. Table 2 shows the results. Here, the dihedral angle means an

TABLE 1

| Structure | A-1 | Comparative compound 1 | Comparative compound 2 | Ref-1 |
|---|---|---|---|---|
| HOMO | −4.86 eV | −4.88 eV | −4.90 eV | −4.86 eV |
| LUMO | −1.77 eV | −2.24 eV | −1.90 eV | −1.82 eV |
| $\lambda_{max}$ (calc.) | 569 nm | 769 nm | 594 nm | 590 nm |
| Oscillator strength | $1.07 \times 10^{-3}$ | $0.81 \times 10^{-3}$ | $0.41 \times 10^{-3}$ | $0.80 \times 10^{-3}$ |

The results show that the oscillator strength of exemplary compound A-1 is 1.3 times the oscillator strength of Ref-1, 1.3 times the oscillator strength of comparative compound 1, and 2.6 times the oscillator strength of comparative compound 2.

That is, the BIQ rings included in exemplary compound A-1 maximally increase the transition dipole moment of the organic metal complex and increase the oscillator strength. The increase in the oscillator strength most significantly affects an increase in the light emission efficiency.

Comparing the HOMO-LUMO energy levels of the compounds in Table 1, there is no significant difference in value of HOMO between the compounds, but the values of LUMO are significantly different from each other. In particular, the emission wavelength of comparative compound 1 is within a wavelength range that is not suitable as a light-emitting material for organic EL displays. This is because the magnitude of conjugation varies depending on the difference in position of the fused ring.

In addition, the cyclic ligand serving as a ligand contributes to the reduction in the peak width of the emission spectrum. A broad peak of the emission spectrum of an organic compound is due to the difference between the structure of the compound in the ground state and the structure in the excited state. That is, a compound having a small difference in structure between the ground state and the excited state has a small peak width of the emission spectrum.

angle formed by a BIQ ring and a phenyl ring. The dihedral angle is denoted by τ(1234). This indicates that the numbers of 1 to 4 were assigned to each of the structures in Table 2, and the dihedral angle was calculated using these four points.

TABLE 2

| Structure | A-1 | Comparative compound 3 |
|---|---|---|
| Dihedral angle: τ(1234) | 0.2° | 15.1° |

The results show that the dihedral angle of exemplary compound A-1 is 0.2°, which is very smaller than that of comparative compound 3, namely, 15.1°. It was clarified that exemplary compound A-1 has a rigid structure with very high planarity. That is, the organic metal complex according to the present disclosure in which the structural change between the ground state and the excited state is reduced has a small peak width of the emission spectrum.

Thus, considering the above comparison of the magnitude of the oscillator strength in combination, exemplary compound A-1 was found to be suitable as an organic metal complex having high light emission efficiency and a small peak width of the emission spectrum.

Examples of the specific structural formula of the organic metal complex according to the present disclosure are described below. However, the organic metal complex according to the present disclosure are not limited thereto.

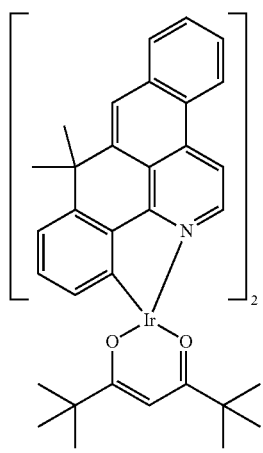

A-1

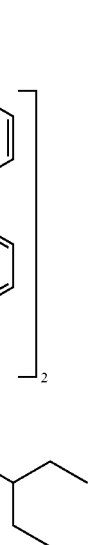

A-2

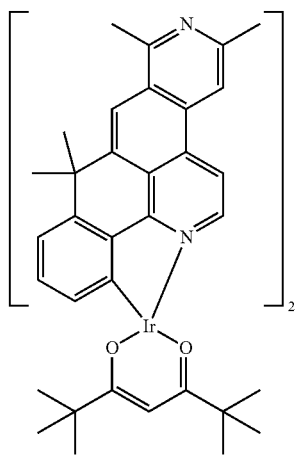

A-3

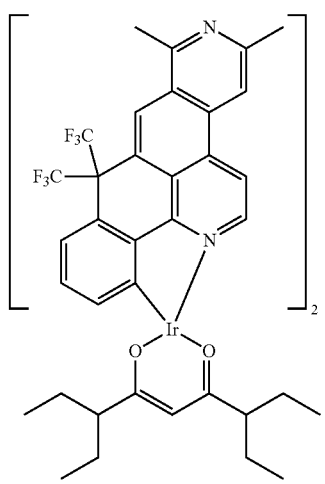

A-4

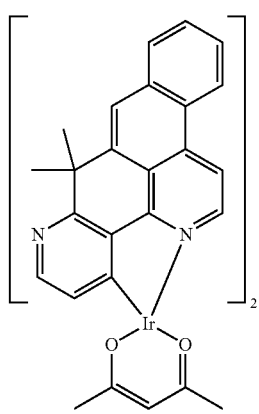

A-5

-continued
A-6
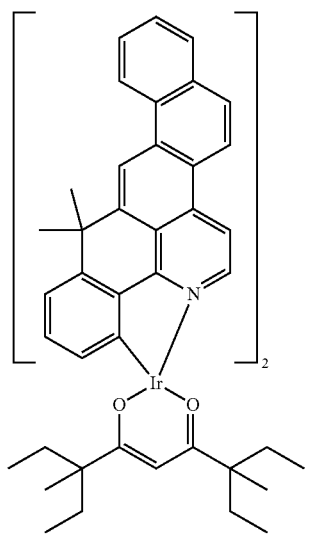
A-7
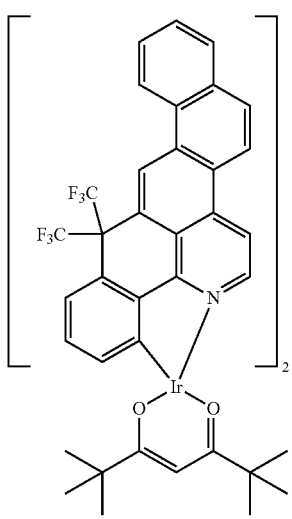
A-8
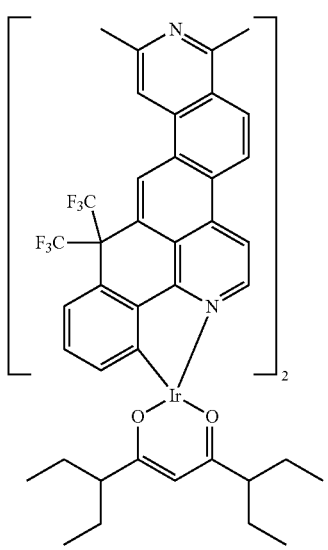
A-9
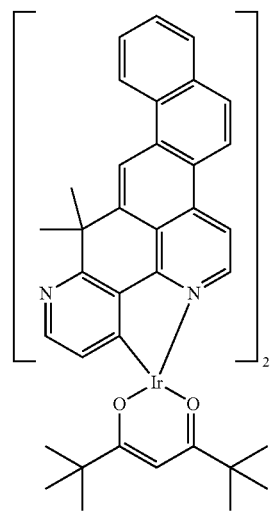
A-10
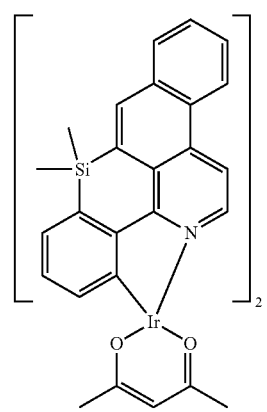
A-11
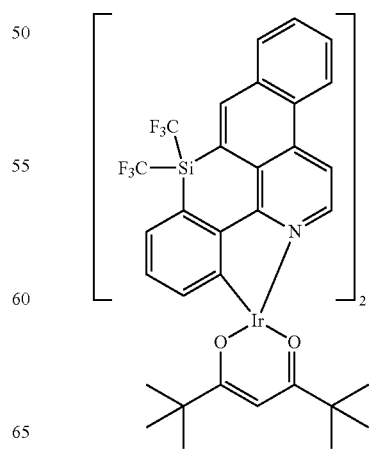

-continued
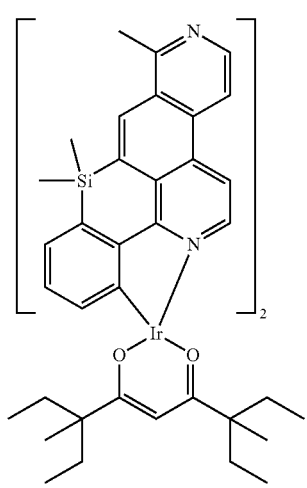
A-12
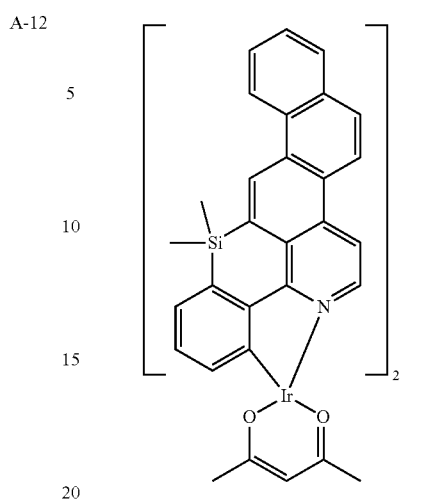
A-15
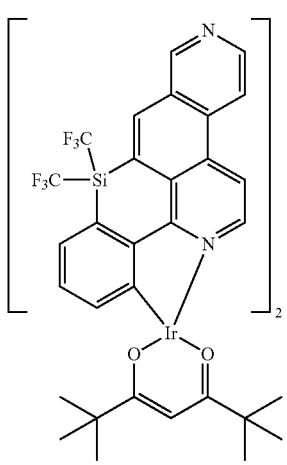
A-13
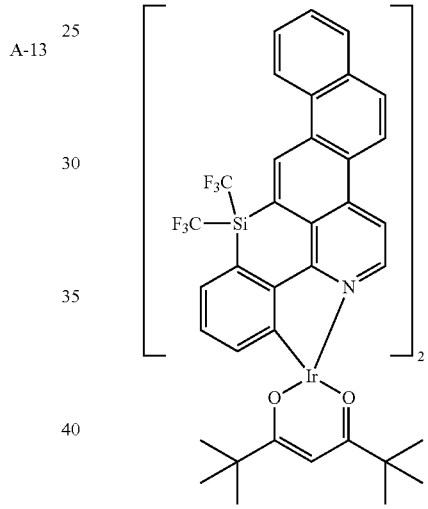
A-16
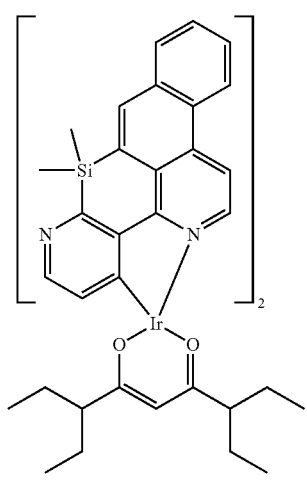
A-14
A-17

-continued
A-18
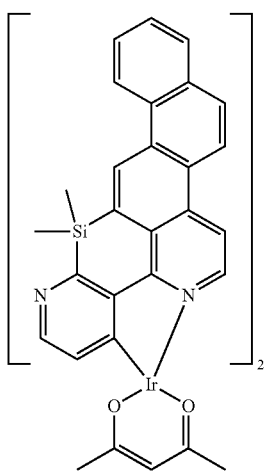
A-19
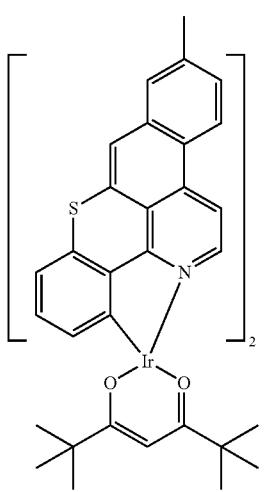
A-20
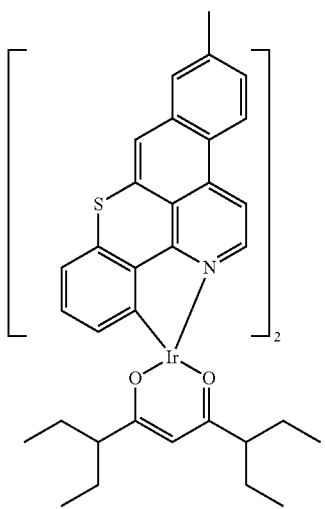
-continued
A-21
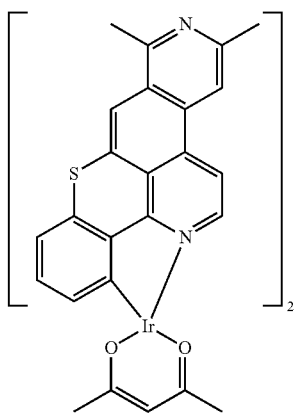
A-22
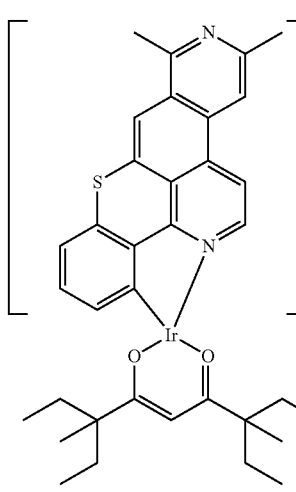
A-23
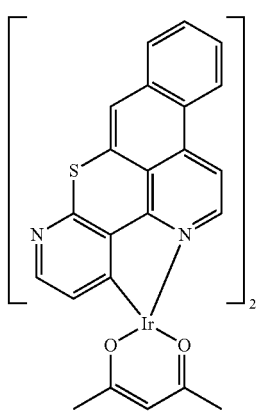

A-24
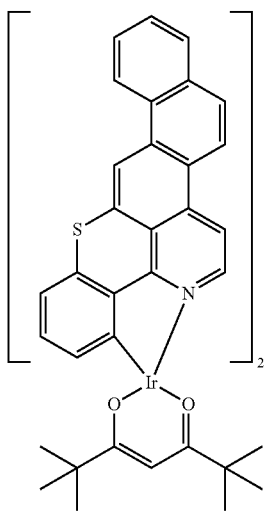
A-25
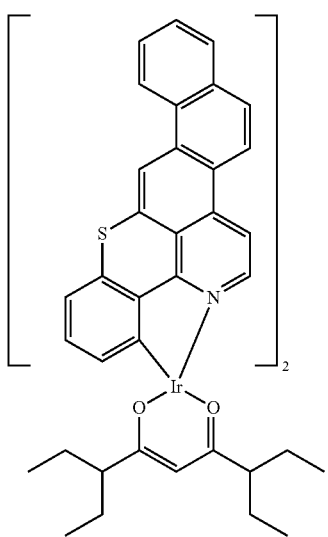
A-26
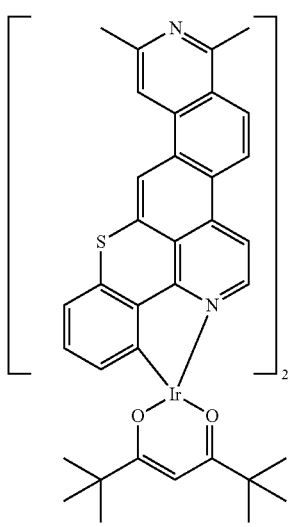
A-27
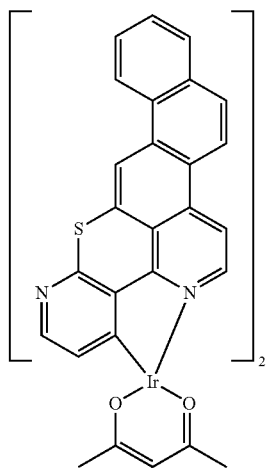
A-28
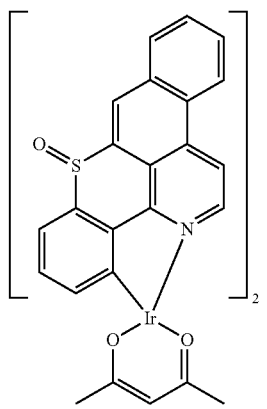
A-29
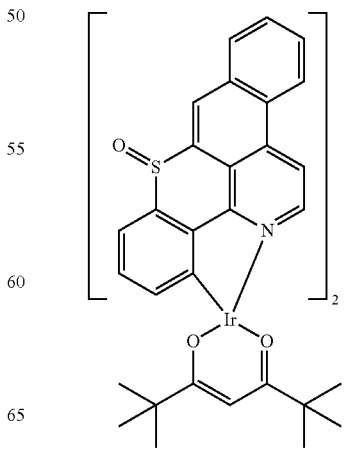

A-30
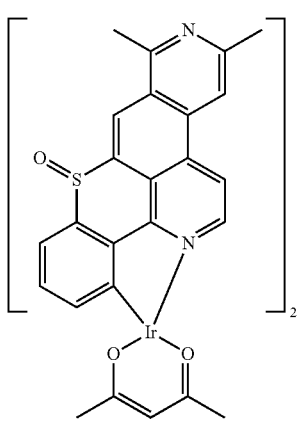
A-31
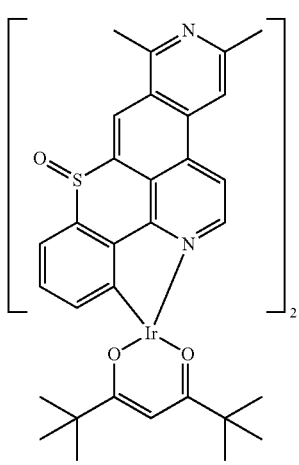
A-32
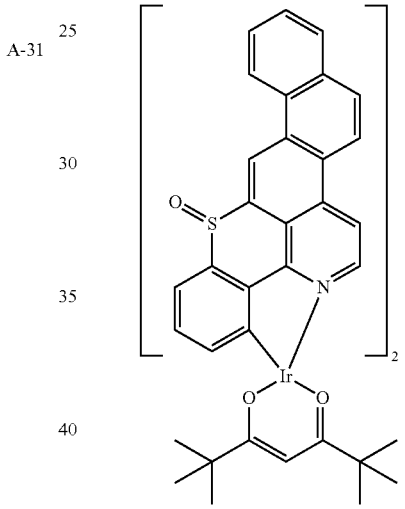
A-33
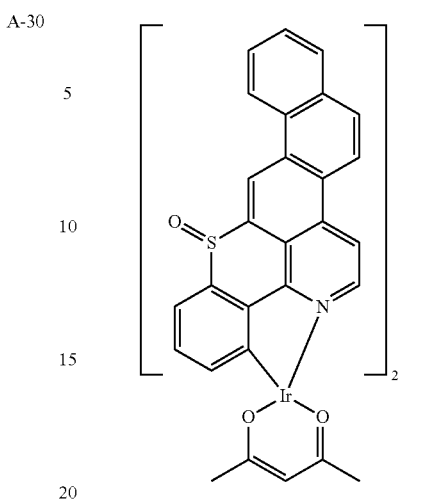
A-34
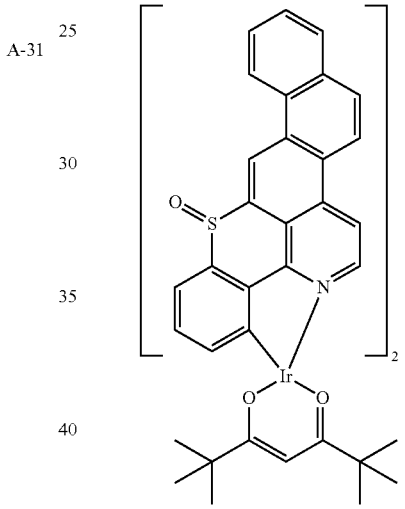
A-35
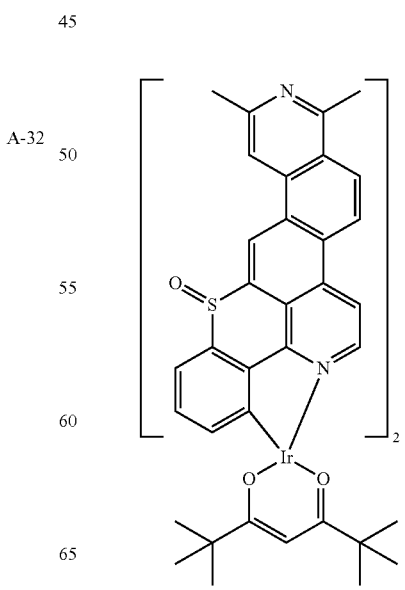

A-36
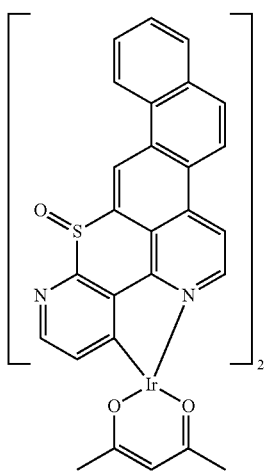
A-37
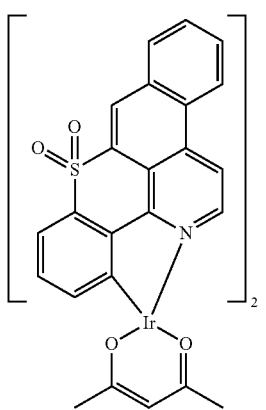
A-38
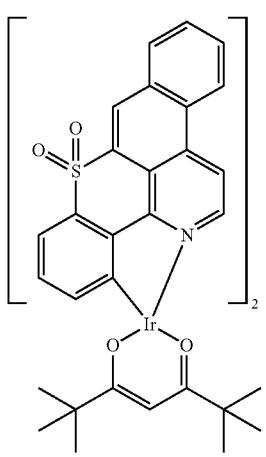
A-39
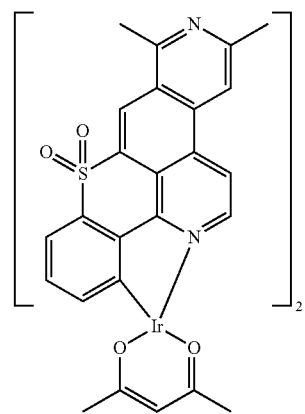
A-40
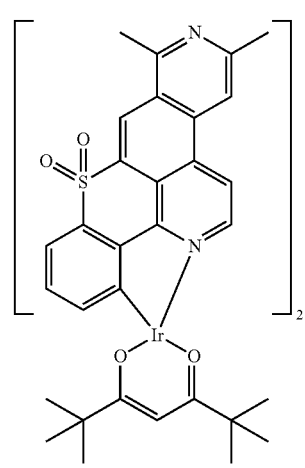
A-41
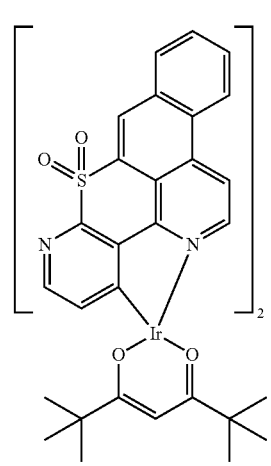

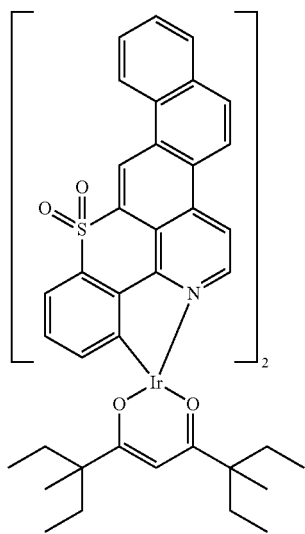
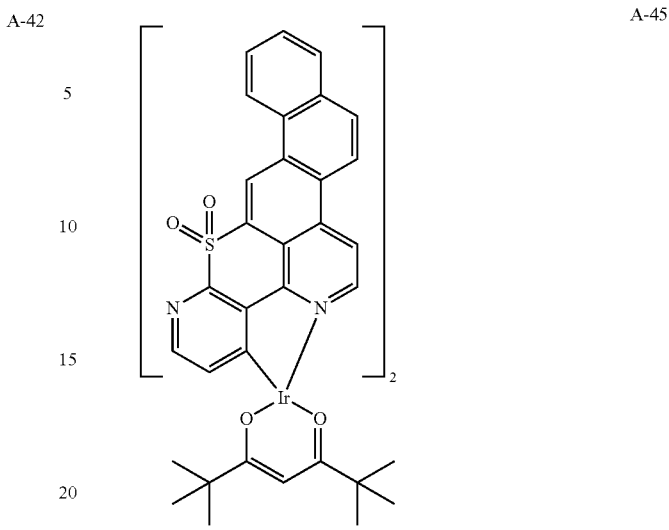

A-48
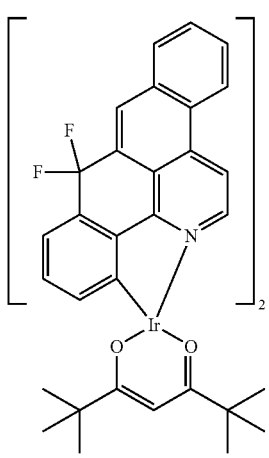
A-49
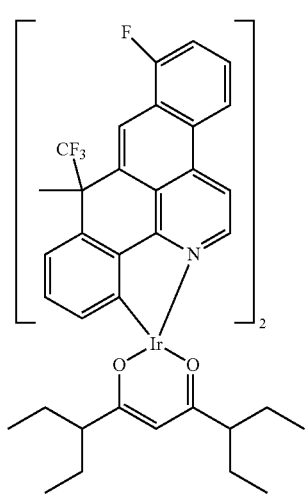
A-50
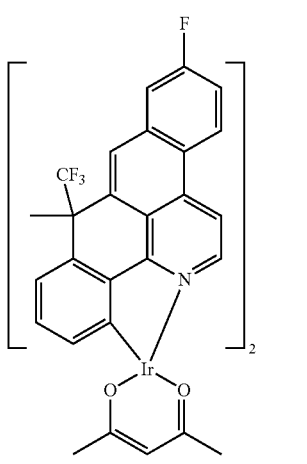
A-51
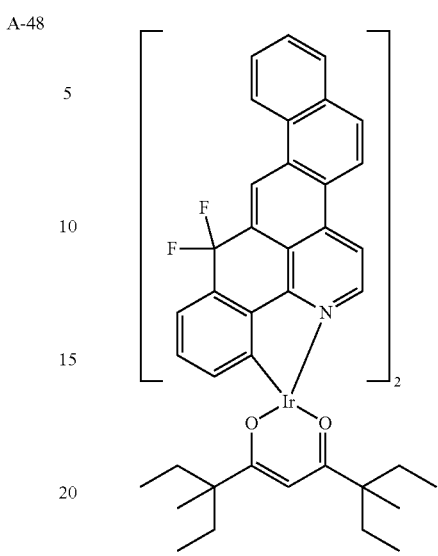
A-52
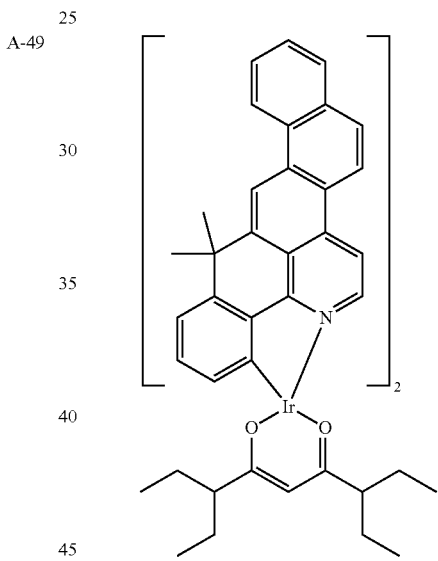
A-53
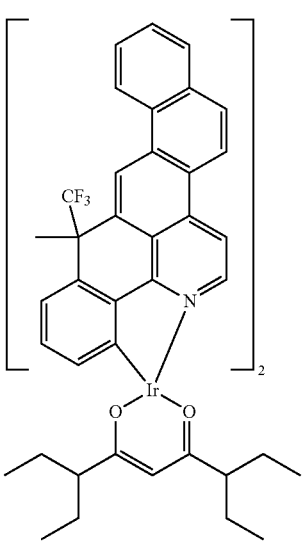

-continued
B-1
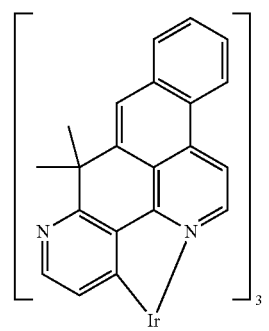
B-2
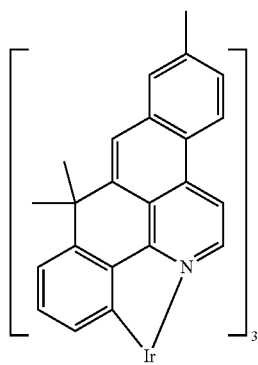
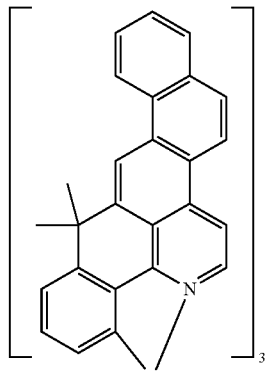
B-5
B-3
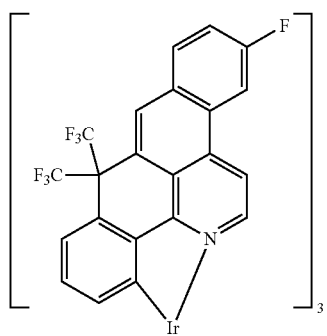
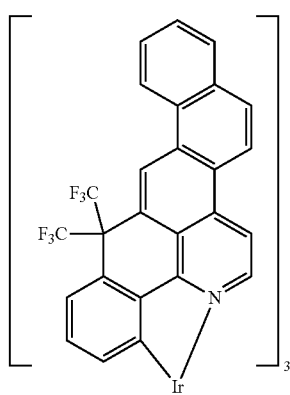
B-6
B-4
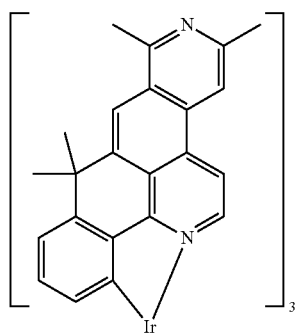
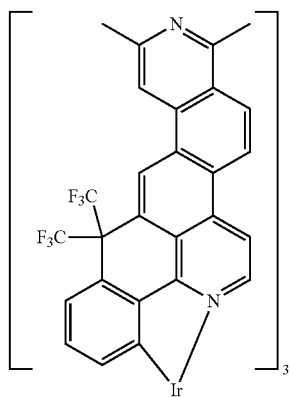
B-7
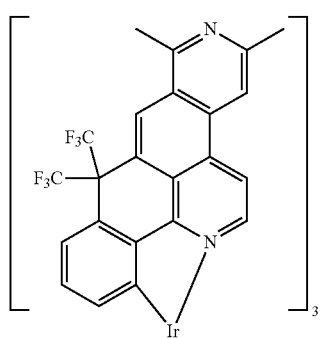
B-8

-continued
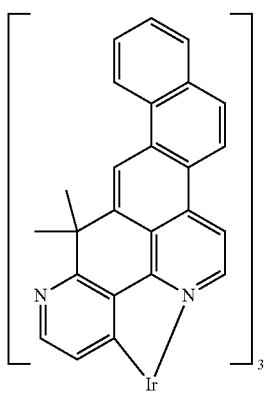
B-9
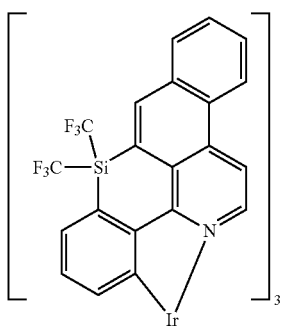
B-10
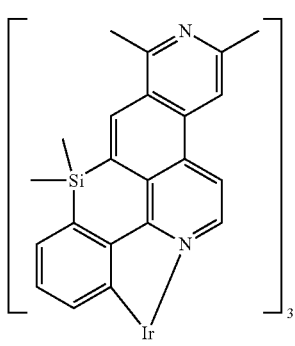
B-11
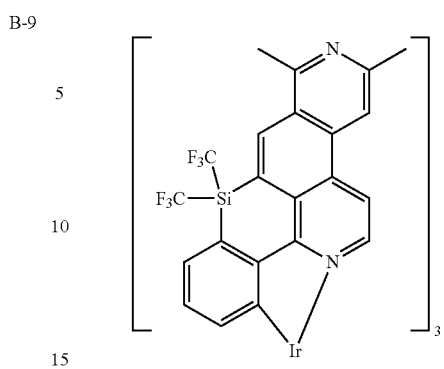
B-12
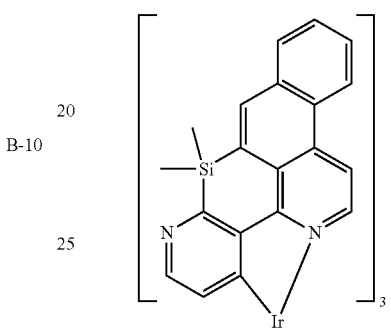
B-13
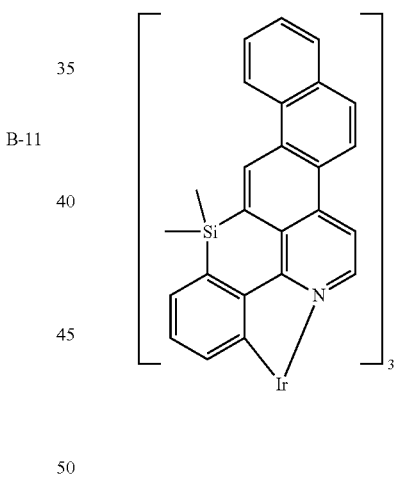
B-14
B-15
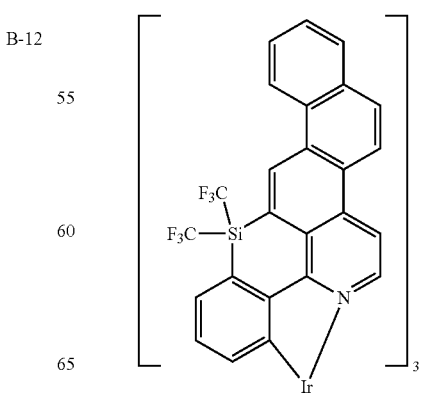
B-16

B-17 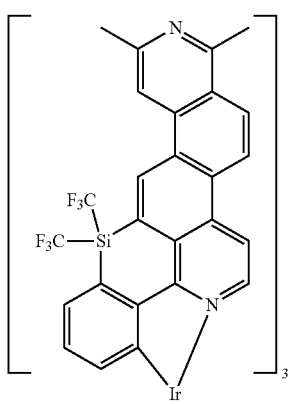
B-18 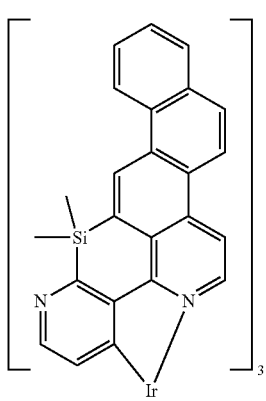
B-19 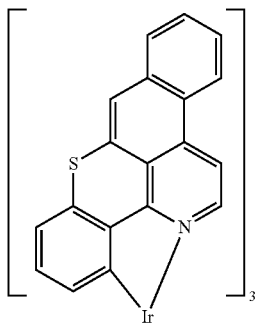
B-20 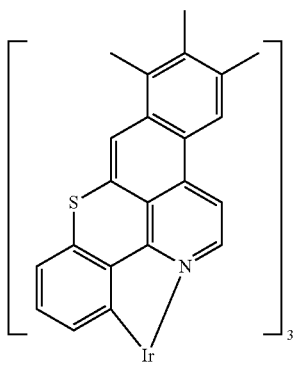
B-21 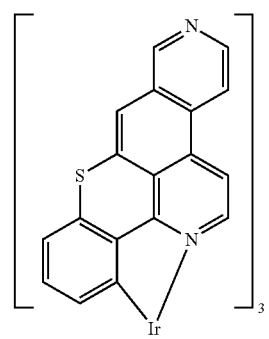
B-22 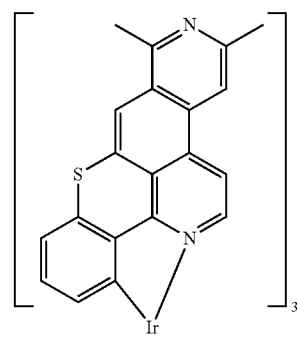
B-23 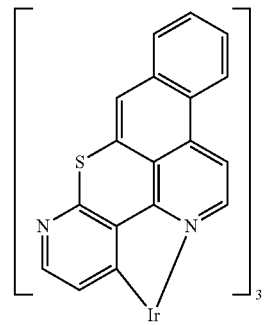
B-24 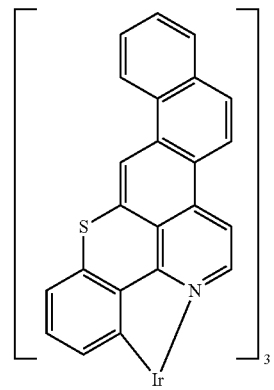

B-25
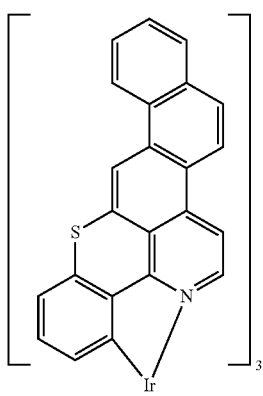
B-26
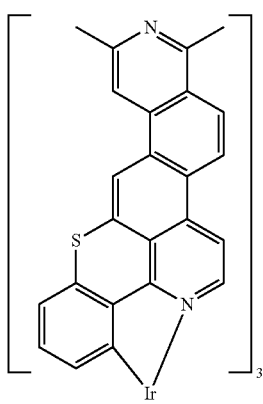
B-27
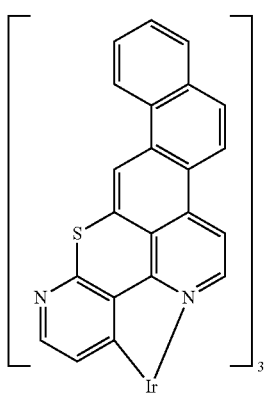
B-28
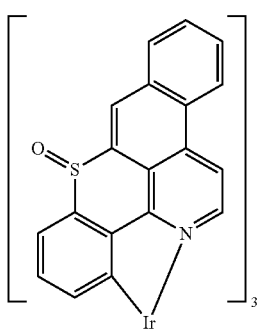
B-29
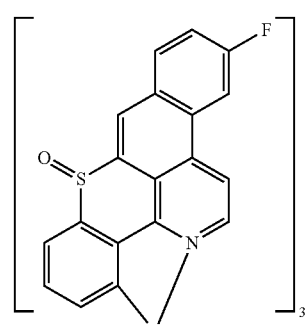
B-30
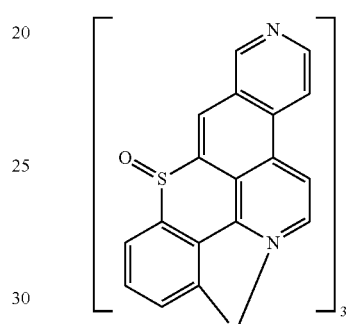
B-31
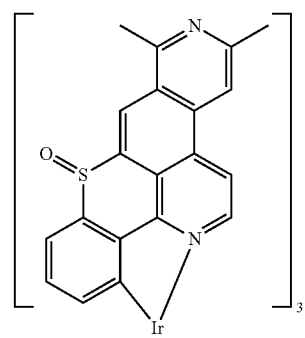
B-32
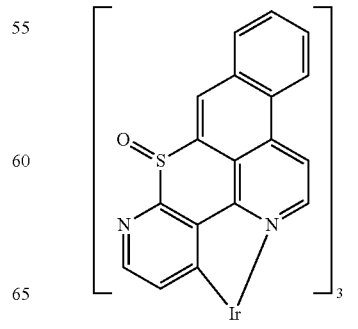

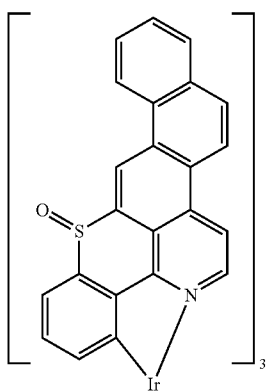
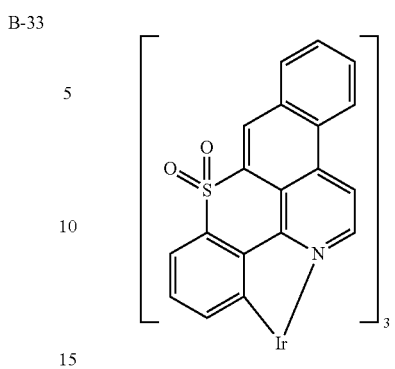

B-41
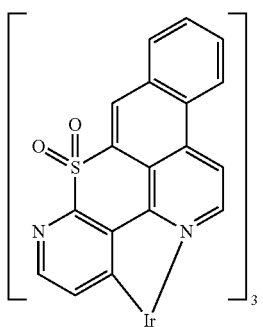
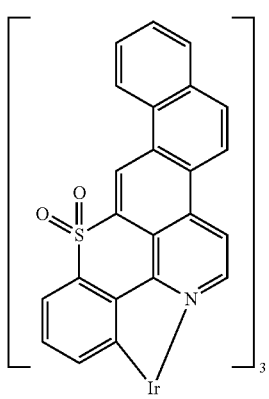
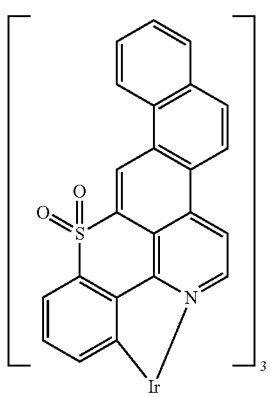
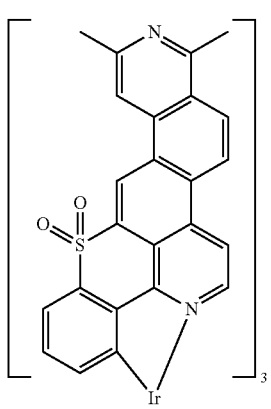
B-45
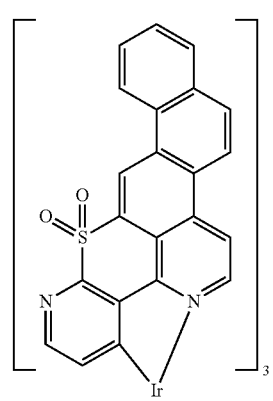
C-1
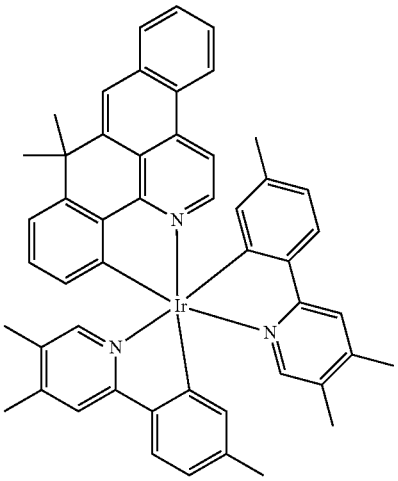
C-2
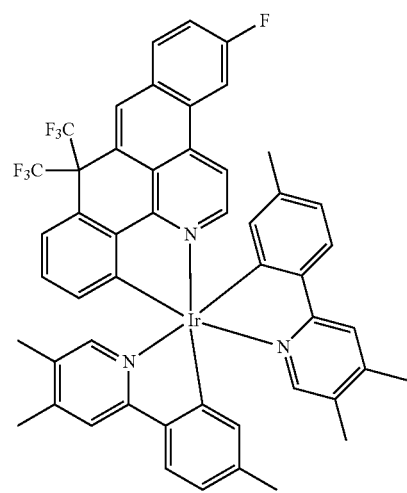

-continued
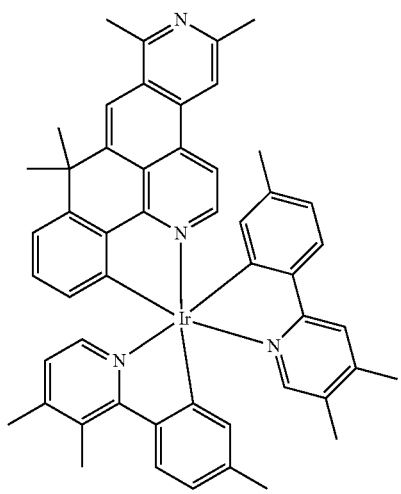
C-3
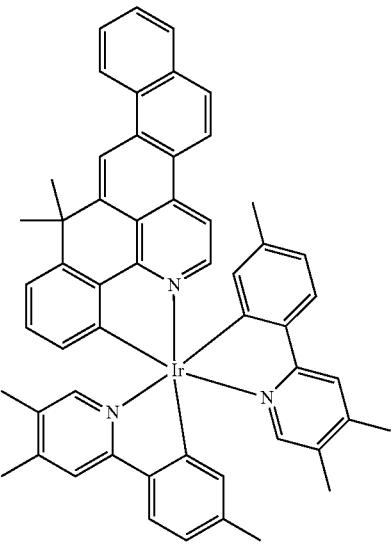
C-6
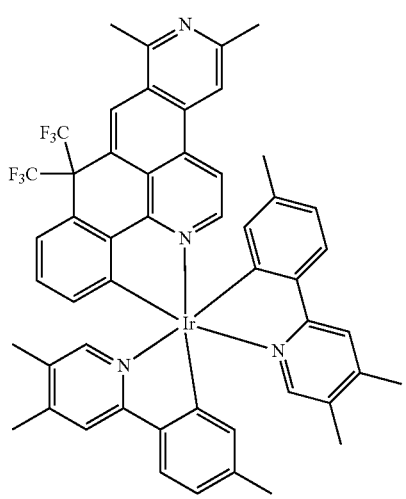
C-4
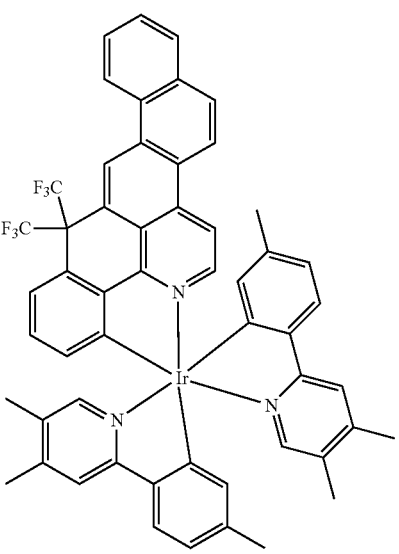
C-7
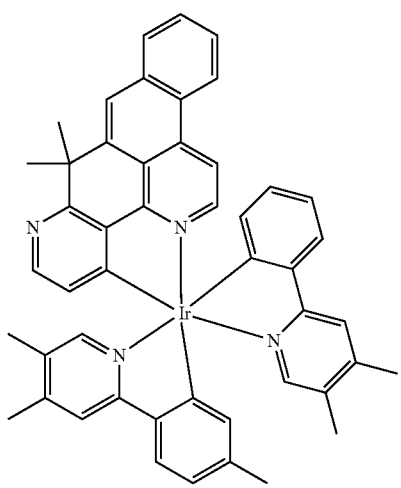
C-5
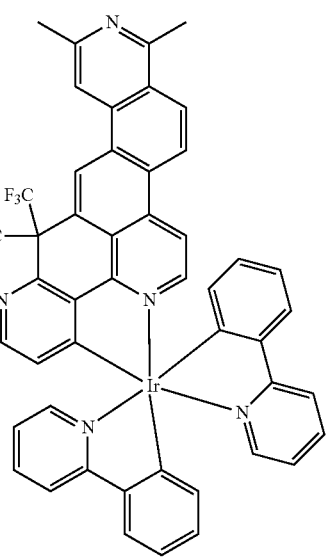
C-8

C-9
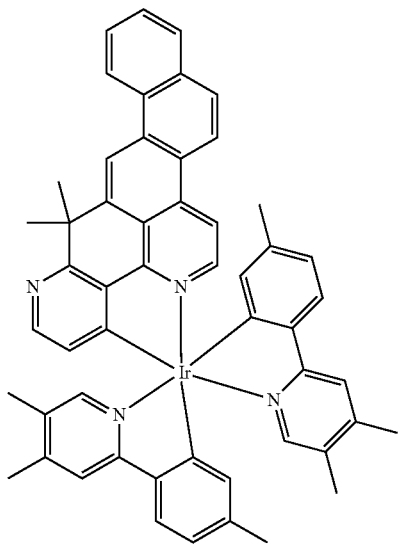
C-10
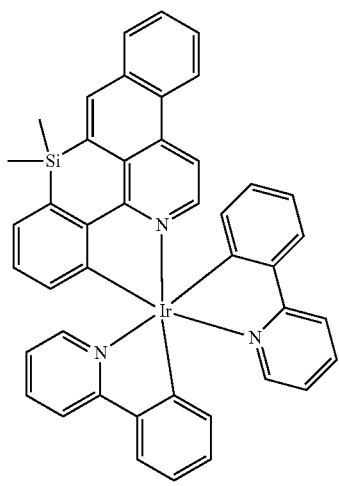
C-11
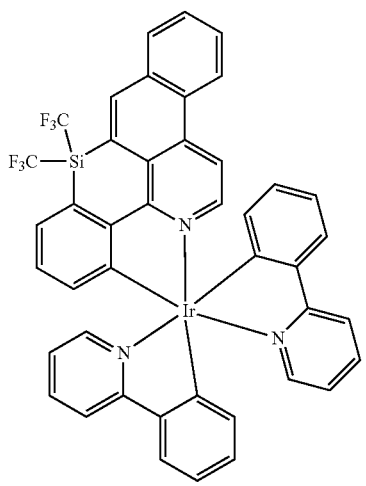
C-12
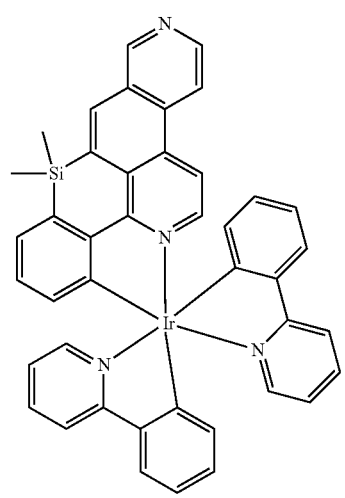
C-13
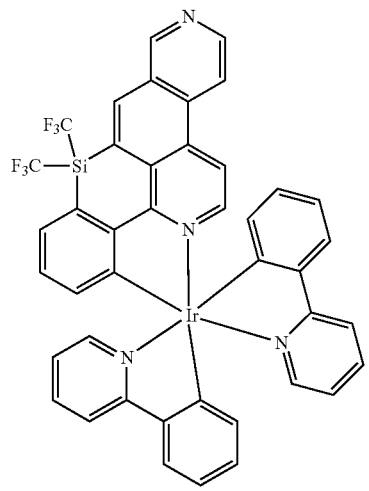
C-14
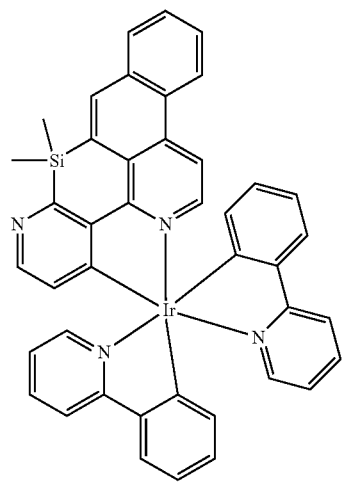

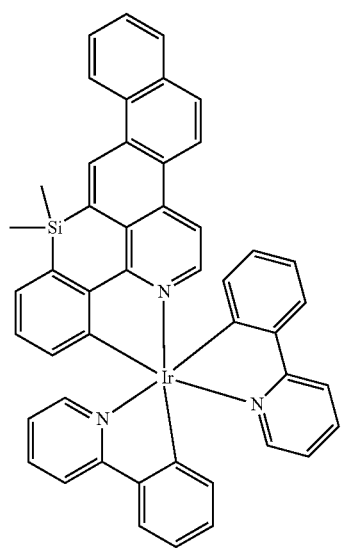
C-15
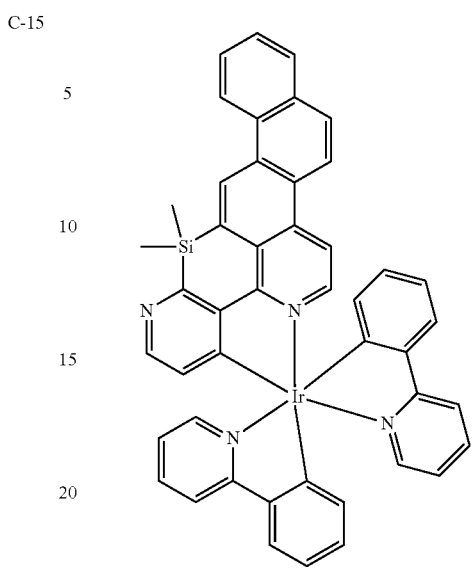
C-18
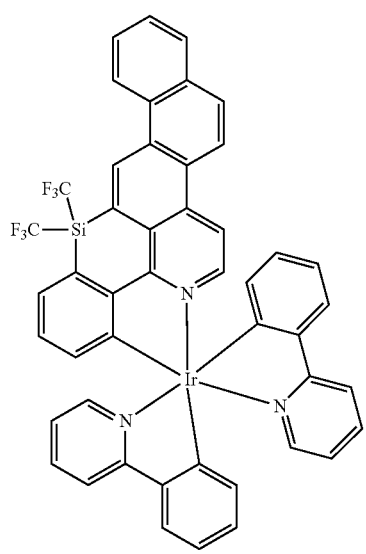
C-16
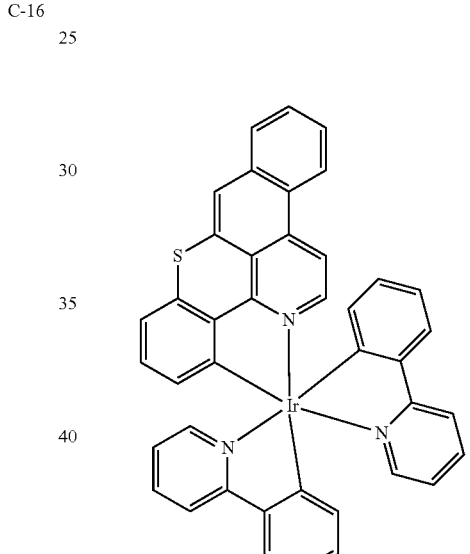
C-19
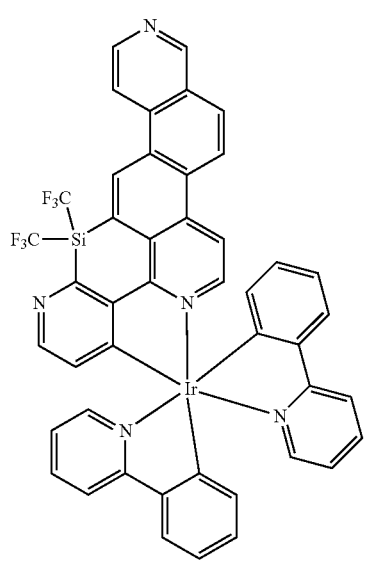
C-17
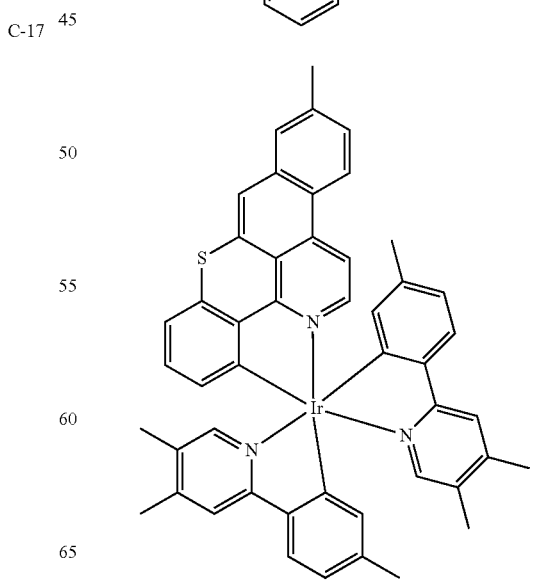
C-20

C-21
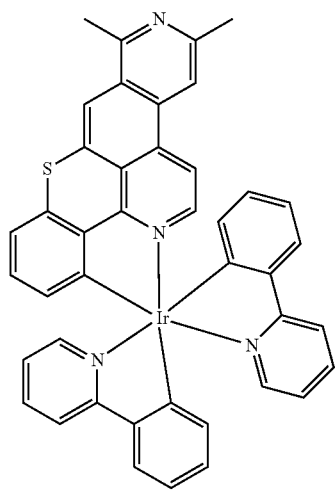
C-22
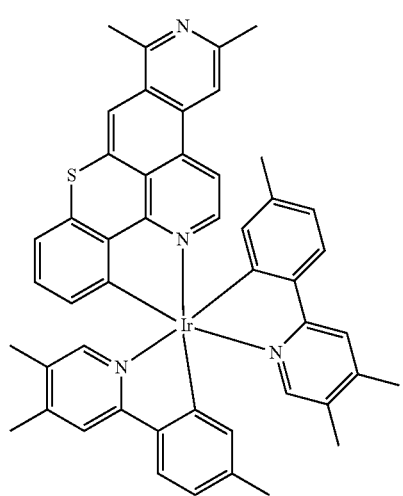
C-23
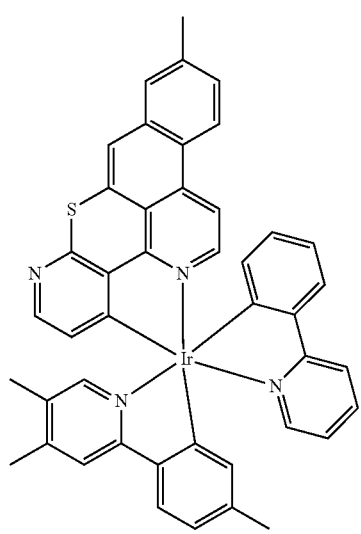
C-24
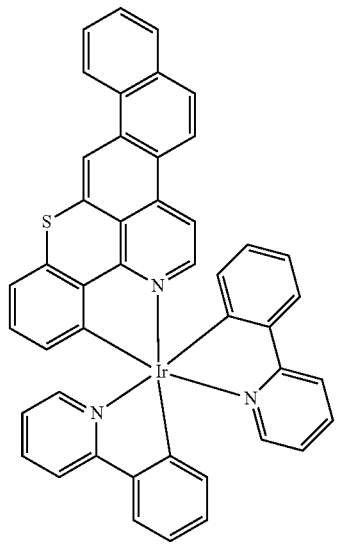
C-25
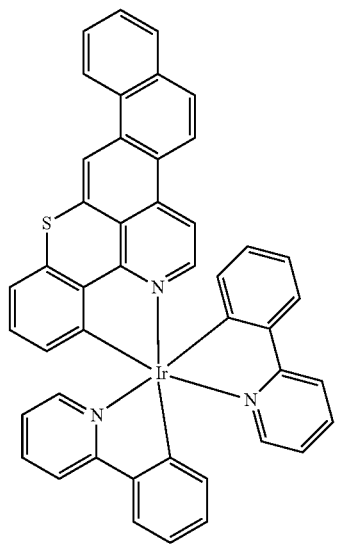
C-26
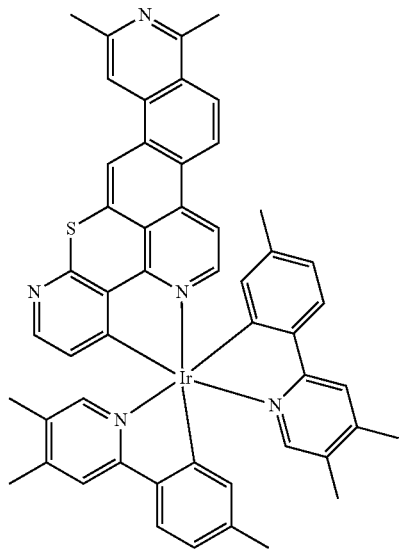

-continued
C-27
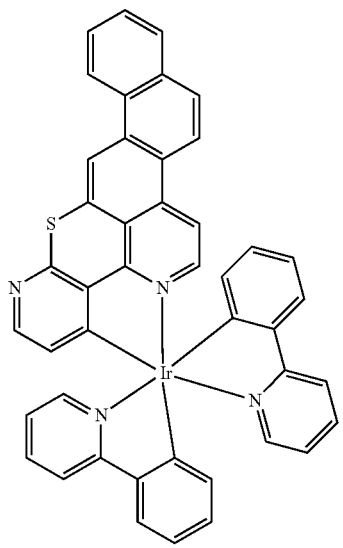
C-28
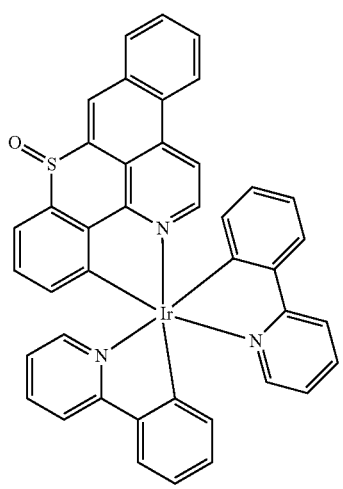
C-29
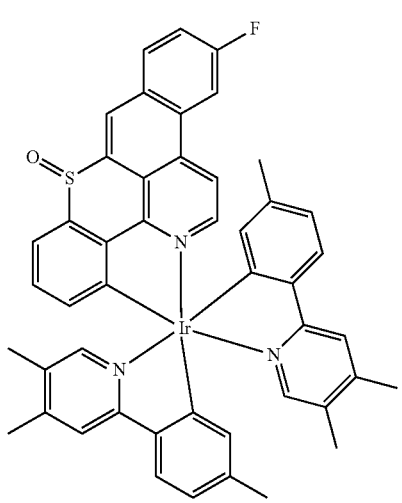
-continued
C-30
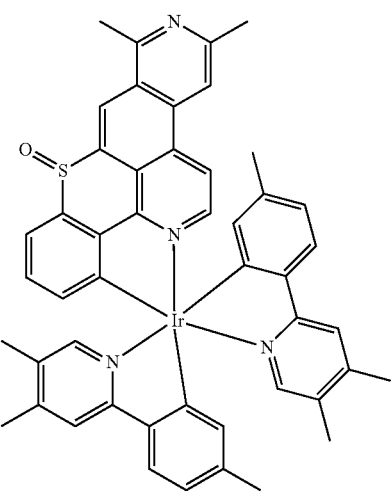
C-31
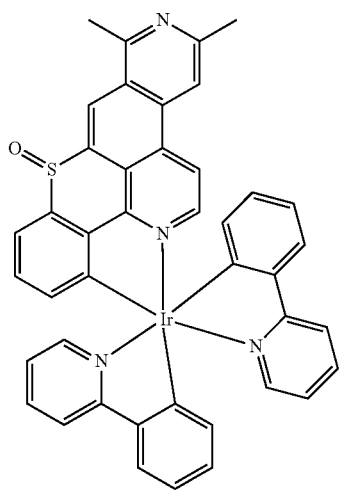
C-32
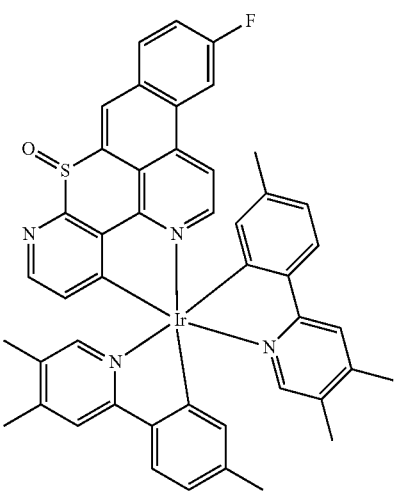

-continued
C-33
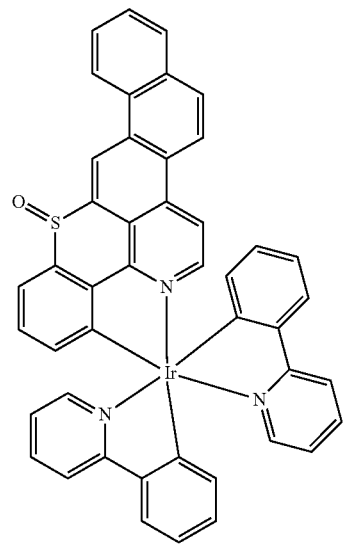
C-34
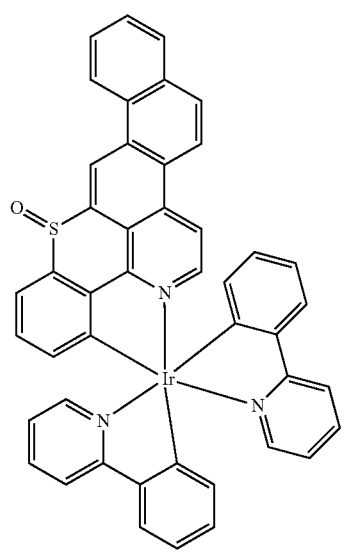
C-35
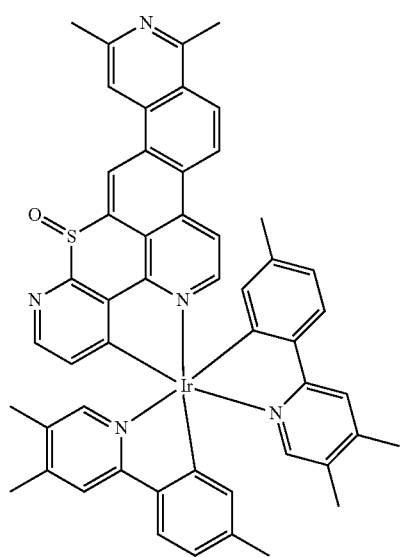
-continued
C-36
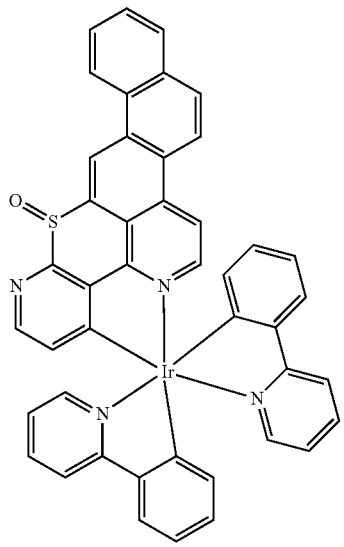
C-37
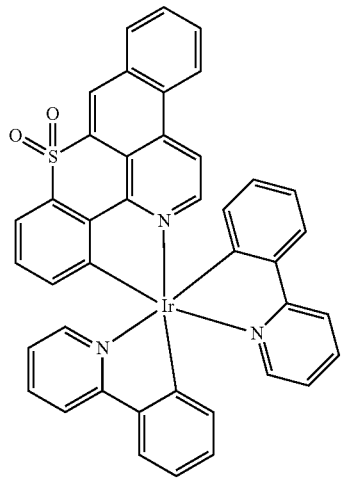
C-38
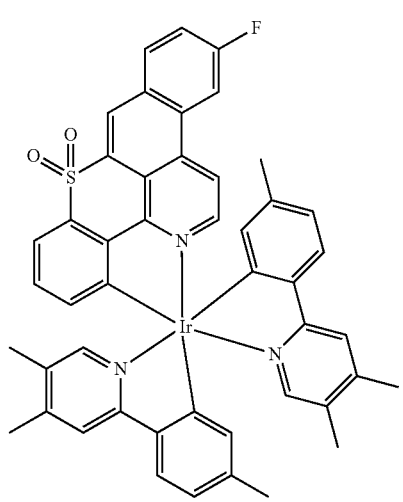

C-39
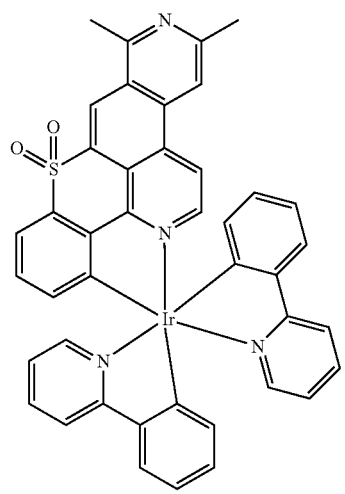
C-40
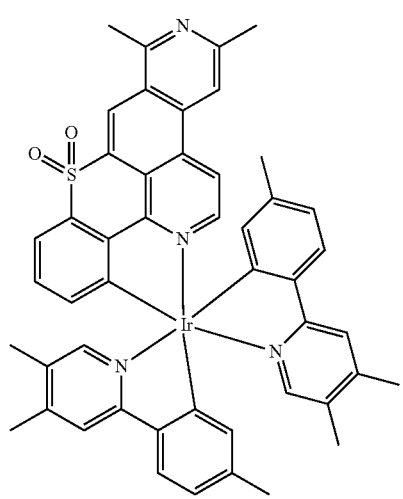
C-41
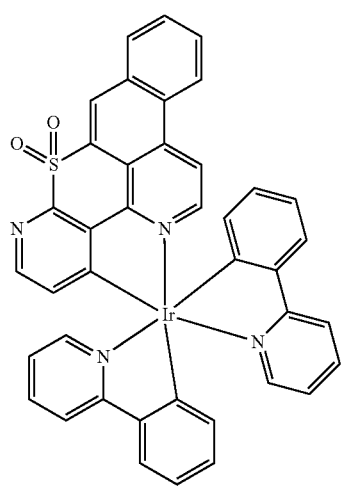
C-42
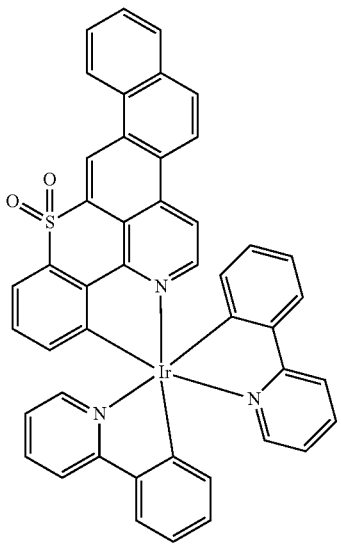
C-43
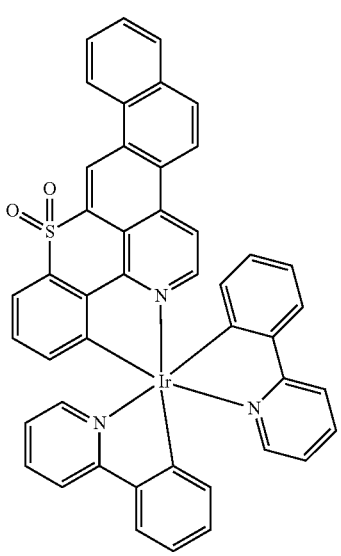
C-44
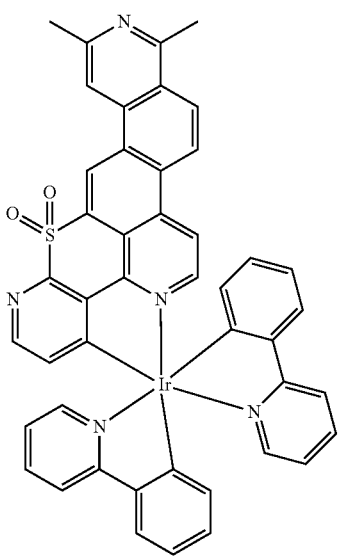

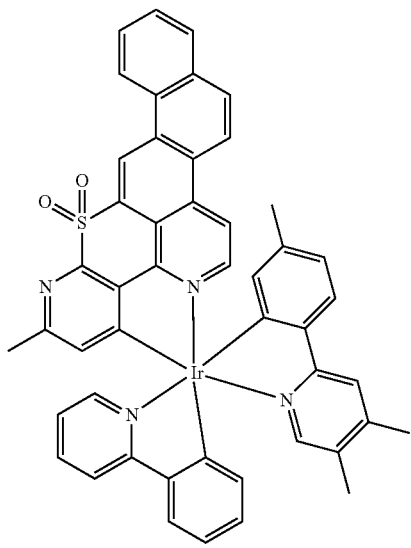
C-45
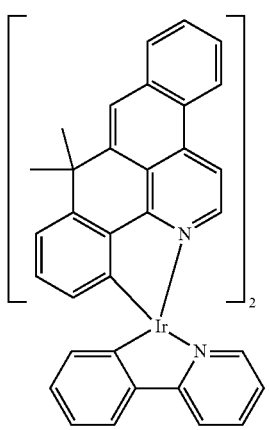
D-1
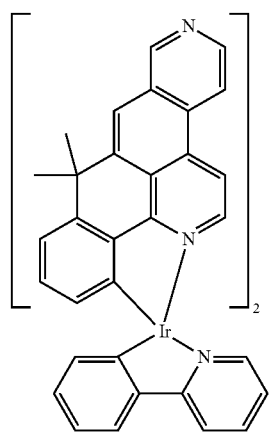
D-3
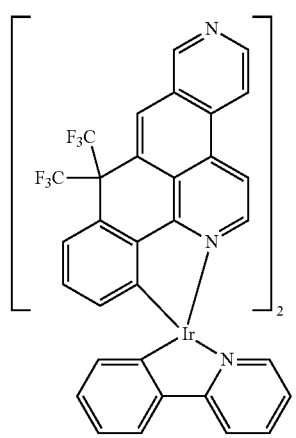
D-4
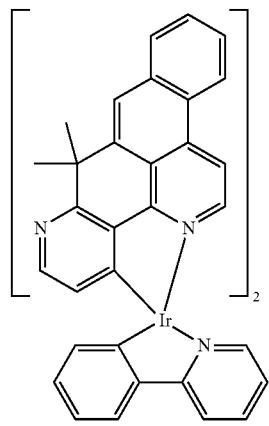
D-5

D-6
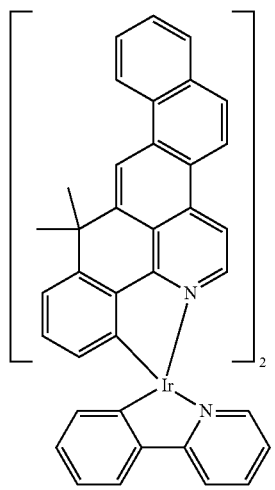
D-7
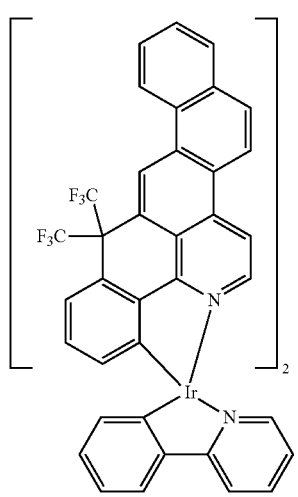
D-8
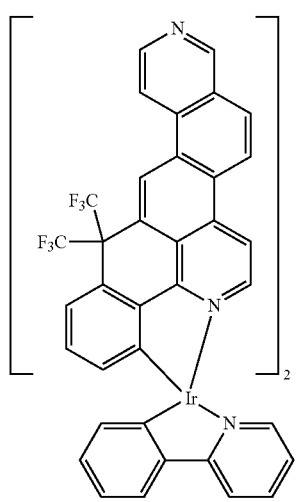
D-9
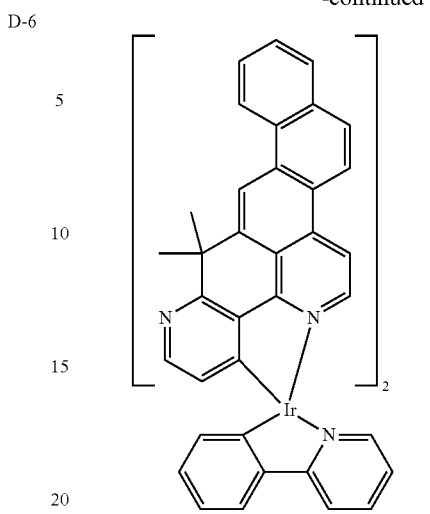
D-10
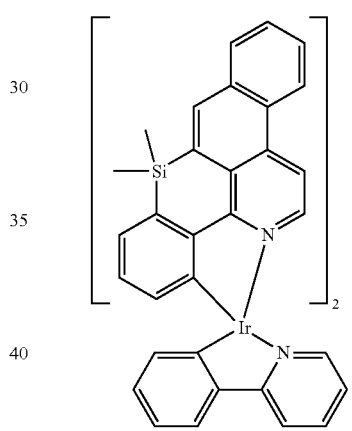
D-11
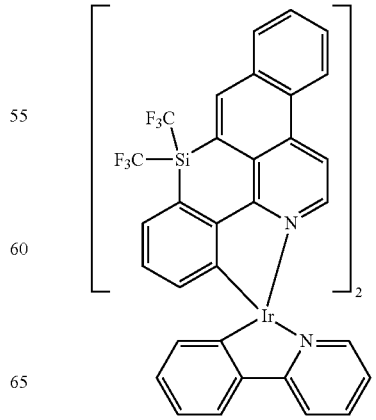

D-12
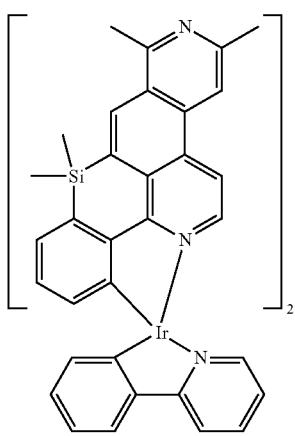
D-13
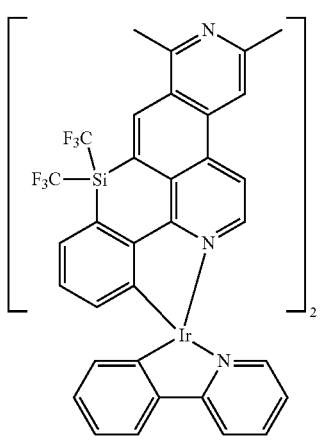
D-14
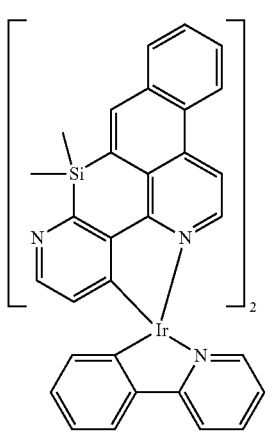
D-15
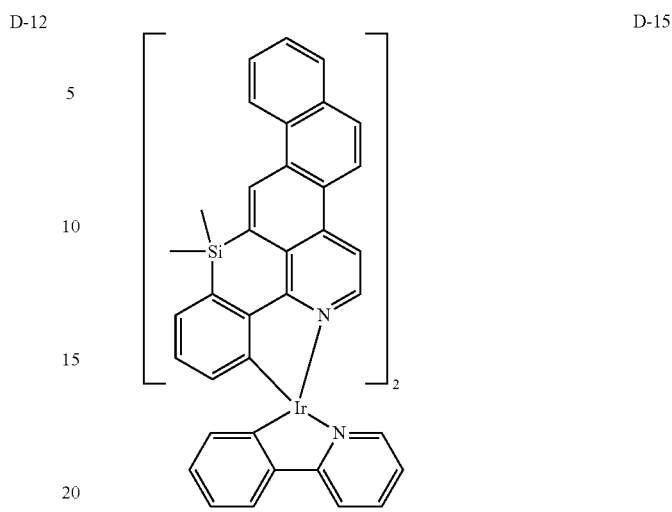
D-16
D-17

D-18
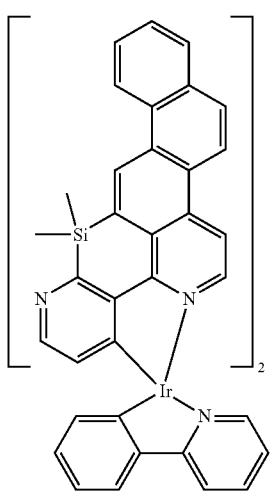
D-19
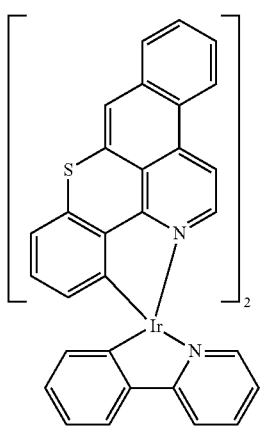
D-20
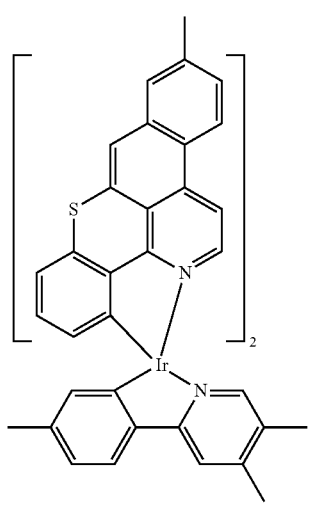
D-21
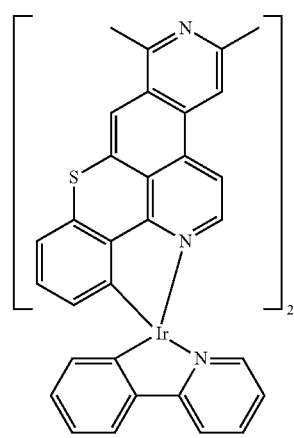
D-22
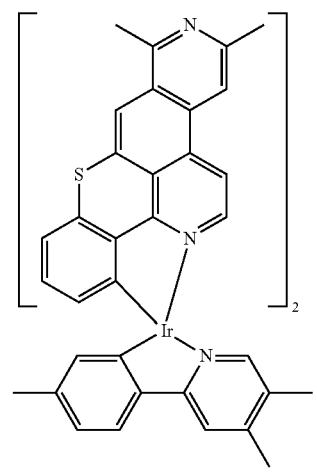
D-23
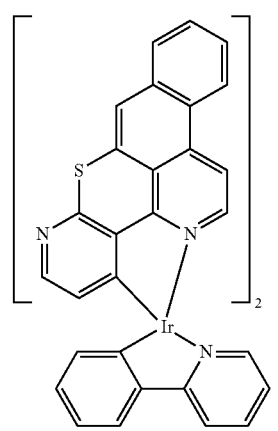

D-24
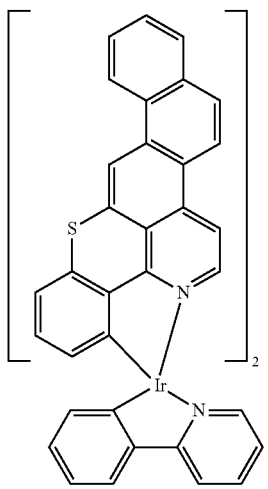
D-25
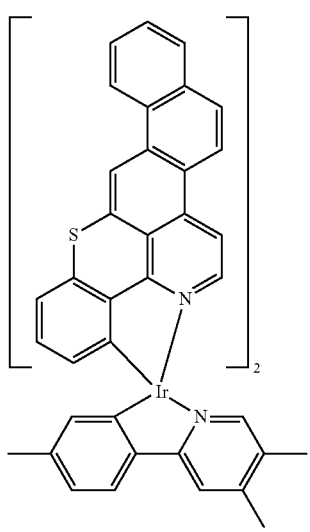
D-26
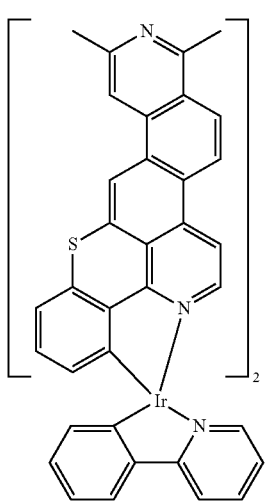
D-27
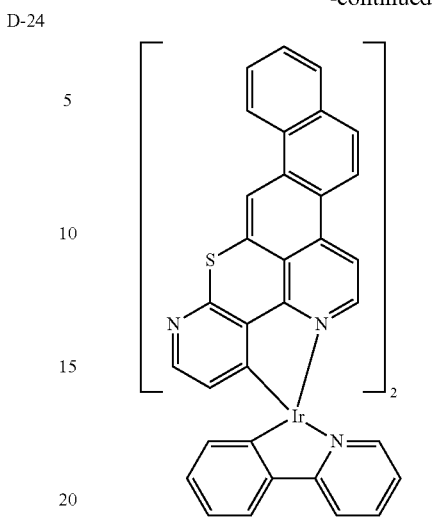
D-28
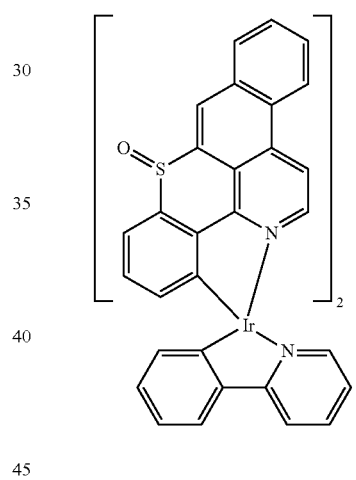
D-29
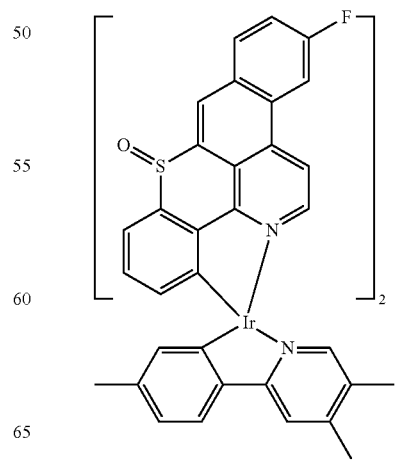

D-30
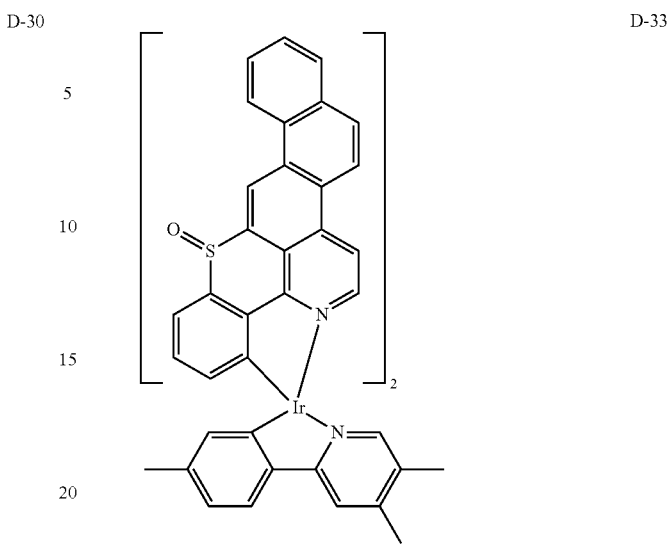
D-33
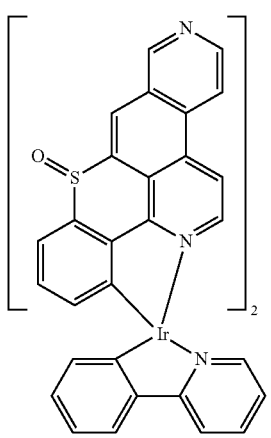
D-31
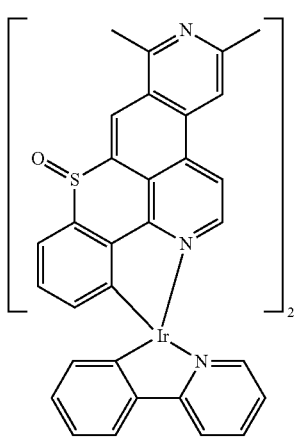
D-34
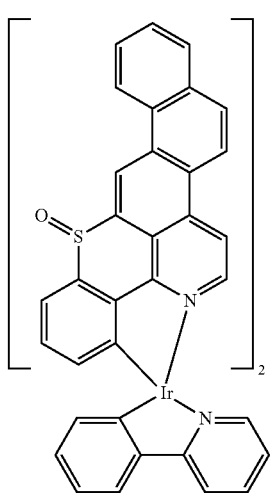
D-32
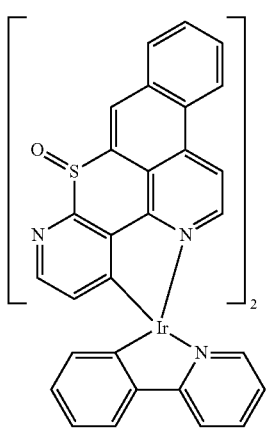
D-35
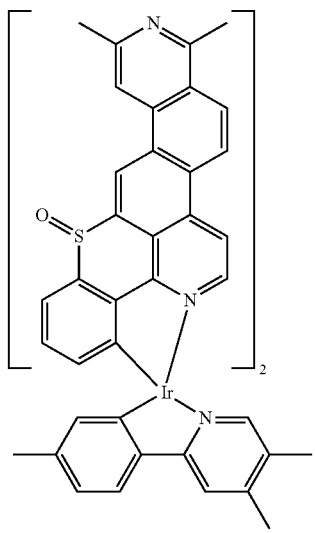

D-36
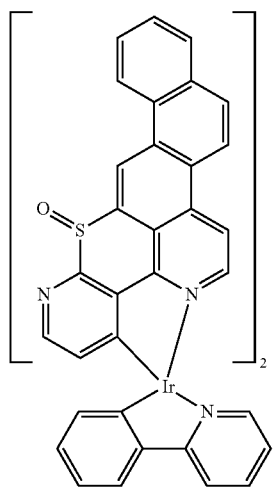
D-37
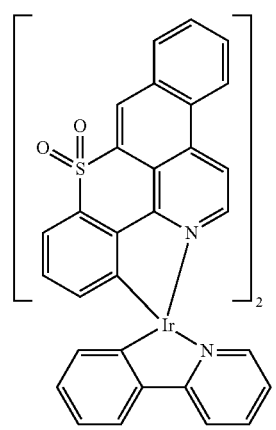
D-38
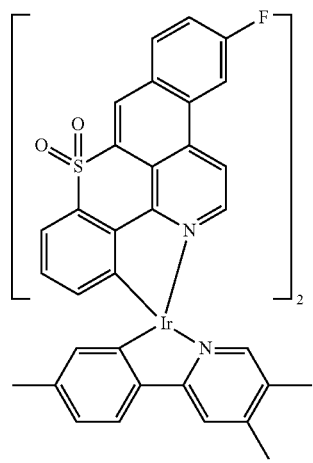
D-39
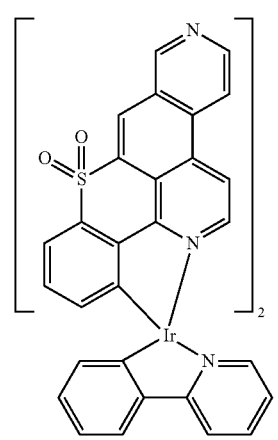
D-40
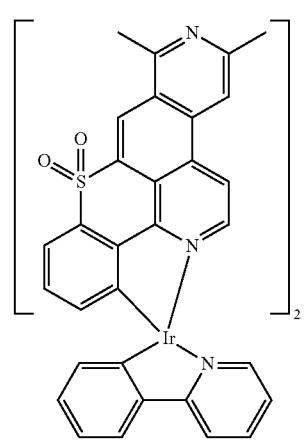
D-41
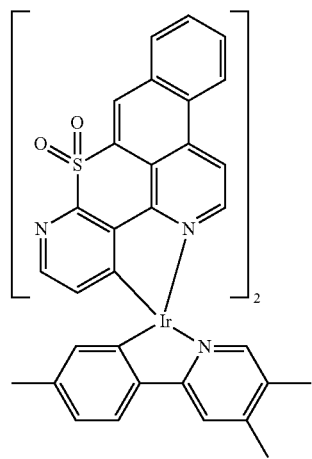

D-42
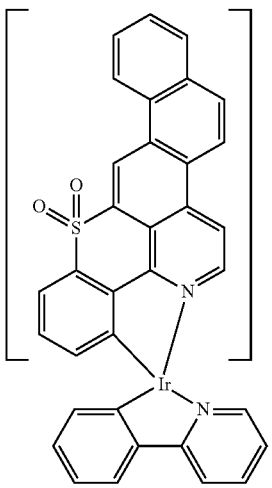

D-43
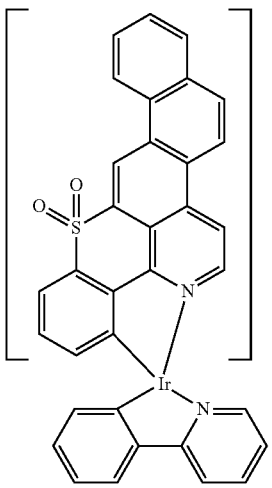

D-44
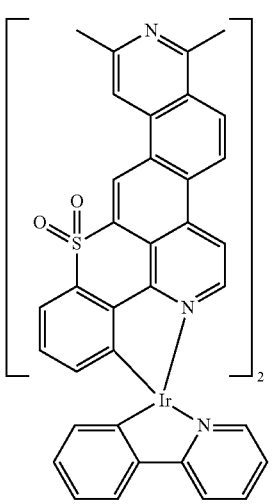

D-45
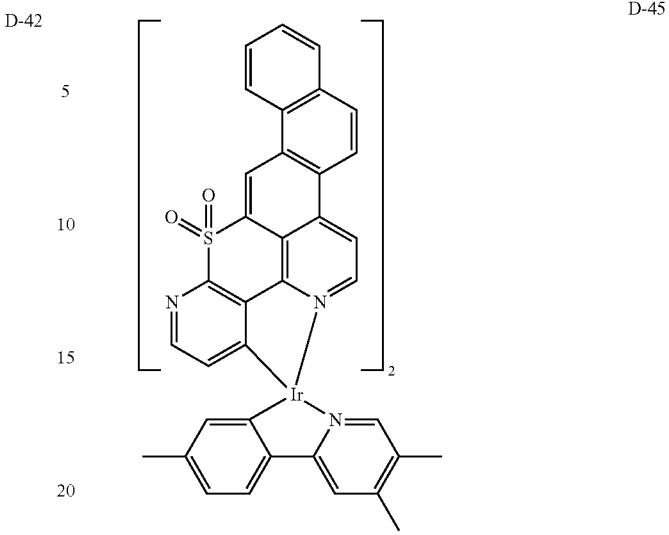

Exemplary compounds described in group A to group D are examples of the organic metal complex represented by formula (1).

The organic metal complexes belonging to group A are examples of a compound in which two main ligands L that mainly contribute to light emission and one auxiliary ligand L" formed of dipivaloylmethane coordinate to iridium. Since the organic metal complexes belonging to group A have molecular weights lower than those of organic metal complexes belonging to other groups, they are advantageous in that the vapor deposition temperature can be reduced. The organic compounds belonging to group B are examples of a compound in which three main ligands L coordinate to iridium. Since the organic compounds belonging to group B have high molecular symmetry, they are stable organic metal complexes. The organic compounds belonging to group C are examples of a compound in which one main ligand L and two auxiliary ligands L' each formed of 2-phenylpyridine coordinate to iridium. The organic compounds belonging to group D are examples of a compound in which two main ligands L and one auxiliary ligand L' formed of 2-phenylpyridine coordinate to iridium. By selecting appropriate main ligands L and auxiliary ligands L', the organic metal complexes belonging to groups C and D can be suitably used as compounds in which stability and the vapor deposition temperature are well-balanced.

In all the above organic compounds, the main ligands L that mainly contribute to light emission are each a cyclic ligand having a benzoisoquinoline or azachrysene skeleton. The above organic compounds each have a molecular structure that realizes both the effect of suppressing the structural change in the molecule and the effect of enhancing the oscillator strength to increase the emission quantum yield achieved by the optimization of the direction and length of the transition dipole moment due to the benzoisoquinoline or azachrysene skeleton. Accordingly, the organic metal complexes in this embodiment have two characteristics that the half-value width of the emission spectrum is likely to be steep and the emission quantum yield is very high.

Next, an organic light-emitting device of the present embodiment will be described. The organic light-emitting device of this embodiment includes at least a first electrode, a second electrode, and an organic compound layer disposed between the electrodes.

One of the first electrode and the second electrode is an anode and the other is a cathode. In the organic light-emitting device of this embodiment, the organic compound layer may be a single layer or a layered structure formed of a plurality of layers as long as a light-emitting layer is included. When the organic compound layer is a layered structure formed of a plurality of layers, the organic compound layer may include, besides the light-emitting layer, for example, a hole injection layer, a hole transport layer, an electron blocking layer, a hole/exciton blocking layer, an electron transport layer, and an electron injection layer. The light-emitting layer may be a single layer or a layered structure formed of a plurality of layers.

In the organic light-emitting device of this embodiment, at least one layer of the organic compound layer contains the organic metal complex according to this embodiment. Specifically, the organic compound (organic metal complex) according to this embodiment is contained in any of the light-emitting layer, the hole injection layer, the hole transport layer, the electron blocking layer, the hole/exciton blocking layer, the electron transport layer, the electron injection layer, and the like. The organic compound according to this embodiment may be contained in the light-emitting layer.

When the organic compound according to this embodiment is contained in a light-emitting layer in the organic light-emitting device of this embodiment, the light-emitting layer may be a layer composed only of the organic compound according to this embodiment or a layer that contains the organic metal complex according to this embodiment and another compound. When the light-emitting layer is a layer containing the organic metal complex according to this embodiment and another compound, the organic compound according to this embodiment may be used as a host of the light-emitting layer or a guest of the light-emitting layer. Alternatively, the organic compound may be used as an assist material that can be contained in the light-emitting layer. Herein, the host refers to, among the compounds that form the light-emitting layer, a compound having the highest mass ratio. The guest refers to, among the compounds that form the light-emitting layer, a compound that has a lower mass ratio than the host and that is responsible for main light emission. The assist material refers to, among the compounds that form the light-emitting layer, a compound that has a lower mass ratio than the host and that assists light emission of the guest. The assist material is also referred to as a second host. The host material may also be referred to as a first organic compound, and the assist material may also be referred to as a second organic compound. The first organic compound has a higher lowest excited singlet energy and a higher lowest excited triplet energy than the organic metal complex. The lowest excited triplet energy of the second organic compound may be higher than the lowest excited triplet energy of the organic metal complex and may be lower than the lowest excited triplet energy of the first organic compound.

When the organic compound according to this embodiment is used as the guest of the light-emitting layer, the concentration of the guest is preferably 0.01% by mass or more and 20% by mass or less and more preferably 0.1% by mass or more and 10% by mass or less of the total of the light-emitting layer.

As a result of various studies, the present inventors have found that the use of the organic compound according to this embodiment as the host or the guest of a light-emitting layer, in particular, as the guest of a light-emitting layer provides a device that produces optical output with high efficiently and high luminance and that has extremely high durability. This light-emitting layer may be formed of a single layer or may have a multilayer structure. The light-emitting layer may contain another light-emitting material having another emission color so as to emit light having a color mixed with red, which is the emission color of this embodiment. The multilayer structure refers to a state where the light-emitting layer and another light-emitting layer are stacked. In such a case, the emission color of the organic light-emitting device is not limited to red. More specifically, the emission color may be white or an intermediate color. When the emission color is white, the other light-emitting layer emits light having a color other than red, specifically, blue or green. The light-emitting layer is formed by a method such as vapor deposition or coating. Details of the method will be more specifically described in Examples below.

When the organic metal complex according to this embodiment is contained in the light-emitting layer, a first organic compound layer may be disposed between the light-emitting layer and the second electrode. The first organic compound layer may have a lowest excited triplet energy higher than that of the light-emitting layer. A second organic compound layer may be disposed between the light-emitting layer and the first electrode. The second organic compound layer may have a lowest excited triplet energy higher than that of the light-emitting layer.

The organic metal complex according to this embodiment can be used as a material that forms an organic compound layer other than the light-emitting layer included in the organic light-emitting device of this embodiment. Specifically, the organic metal complex may be used as a material that forms an electron transport layer, an electron injection layer, a hole transport layer, a hole injection layer, a hole blocking layer, or the like. In such a case, the emission color of the organic light-emitting device is not limited to red. More specifically, the emission color may be white or an intermediate color.

Herein, the organic compound according to this embodiment may be used in combination with, for example, a publicly known low-molecular-weight or high-molecular-weight compound such as a hole injection compound or hole transport compound, a compound serving as the host, a light-emitting compound, or an electron injection compound or electron transport compound, as required. Examples of these compounds will be described below.

A hole injection/transport material may be a material having a high hole mobility so as to facilitate hole injection from the anode and to enable the injected holes to be transported to the light-emitting layer. The hole injection/transport material may also be a material having a high glass transition temperature in order to suppress the deterioration of the film quality, such as crystallization in the organic light-emitting device. Examples of the low-molecular-weight or high-molecular-weight material having a hole injection/transport property include triarylamine derivatives, arylcarbazole derivatives, phenylenediamine derivatives, stilbene derivatives, phthalocyanine derivatives, porphyrin derivatives, poly(vinylcarbazole), poly(thiophene), and other electrically conductive polymers. The above hole injection/transport materials are also suitable for use in an electron blocking layer. Specific examples of the compound used as the hole injection/transport material are described below but are not limited thereto.

| HT1 | HT2 |
|---|---|
| 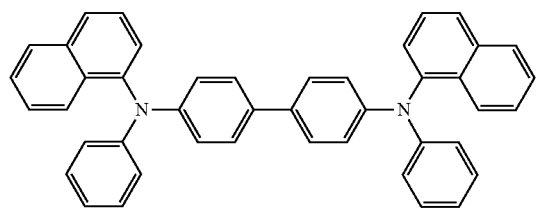 | 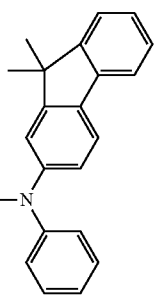 |
| HT3 | HT4 |
| 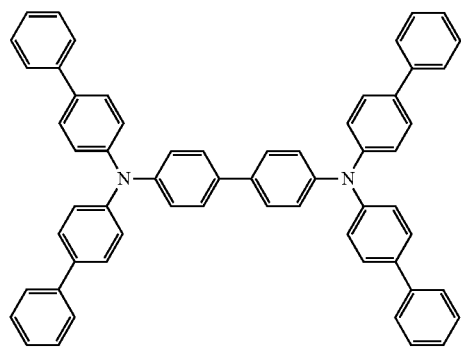 | 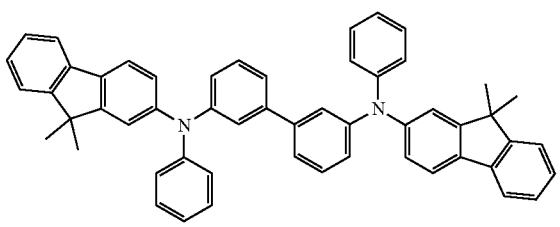 |
| HT5 | HT6 |
| 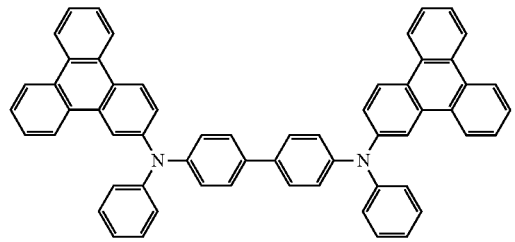 | 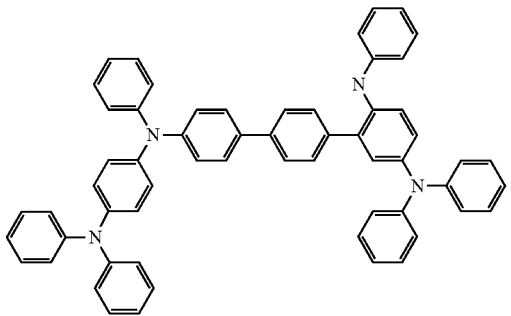 |
| HT7 | HT8 |
| 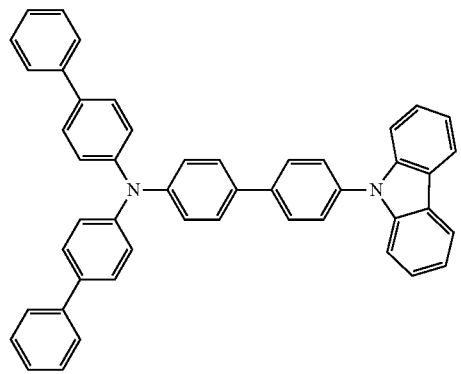 | 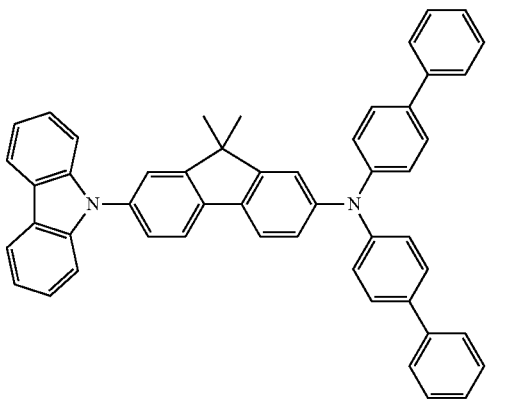 |

-continued
HT9
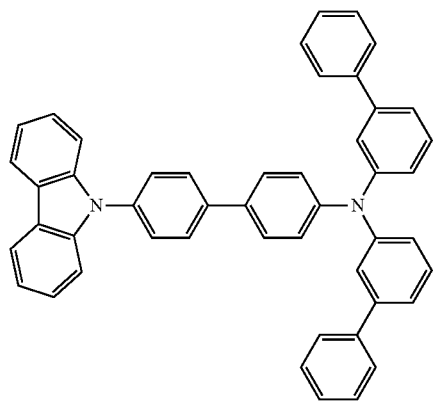
HT10
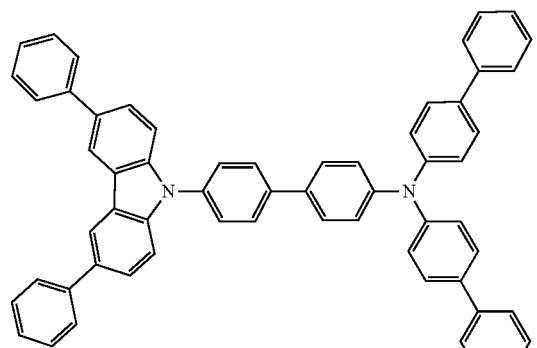
HT11
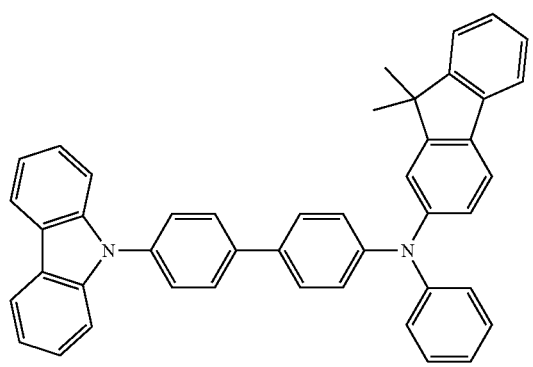
HT12
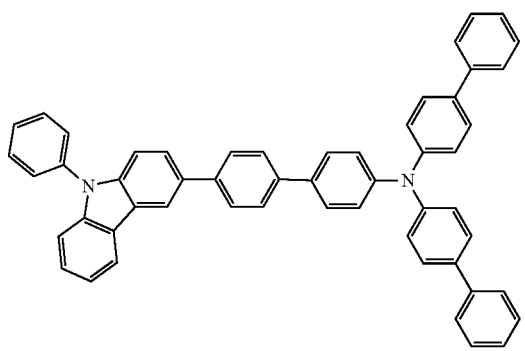
HT13
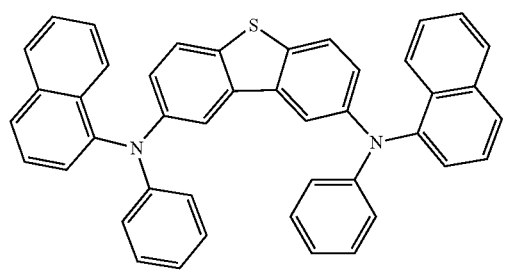
HT14
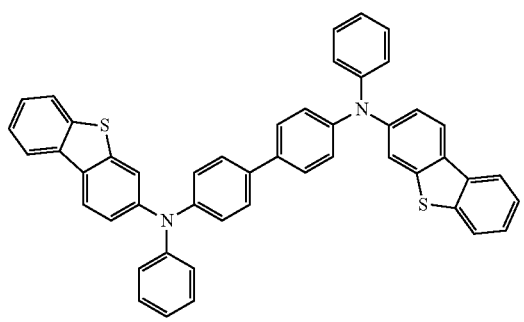
HT15
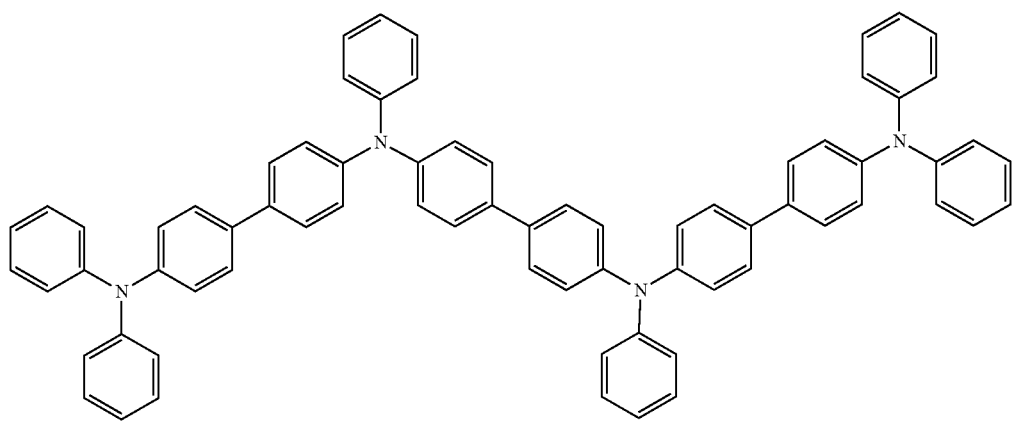

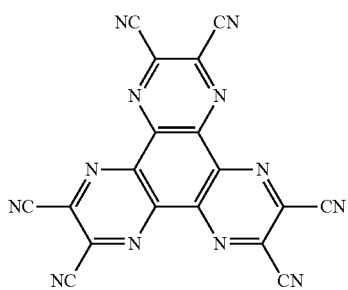

HT16

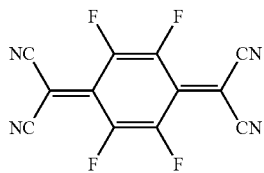

HT17

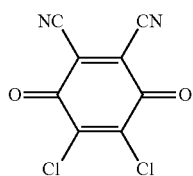

HT18

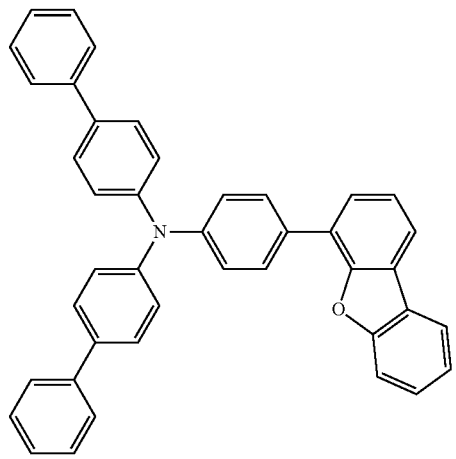

HT19

Among the hole transport materials listed above, HT16 to HT18 can decrease the drive voltage when used in a layer in contact with the anode. HT16 is widely used in organic light-emitting devices. HT2, HT3, HT4, HT5, HT6, HT10, and HT12 may be used in an organic compound layer adjacent to HT16. A plurality of materials may be used in one organic compound layer.

Examples of the light-emitting material that mainly relates to the function of light emission include fused ring compounds (such as fluorene derivatives, naphthalene derivatives, pyrene derivatives, perylene derivatives, tetracene derivatives, anthracene derivatives, and rubrene), quinacridone derivatives, coumarin derivatives, stilbene derivatives, organoaluminum complexes such as tris(8-quinolinolato) aluminum, iridium complexes, platinum complexes, rhenium complexes, copper complexes, europium complexes, ruthenium complexes, and polymer derivatives such as poly(phenylene vinylene) derivatives, poly(fluorene) derivatives, and poly(phenylene) derivatives.

Specific examples of the compound used as the light-emitting material are described below but are not limited thereto.

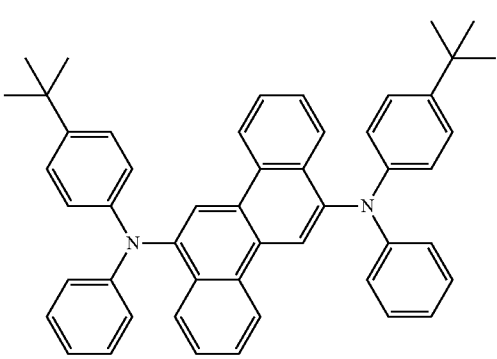

BD1

BD2
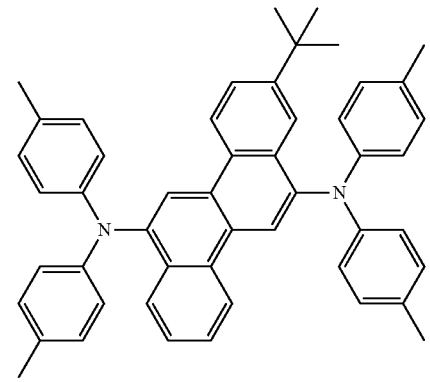
BD3
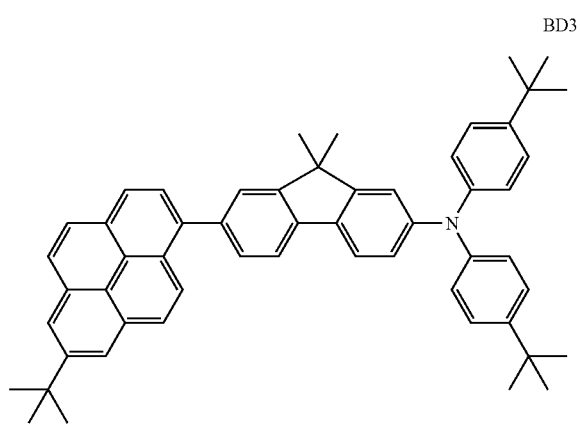
BD4
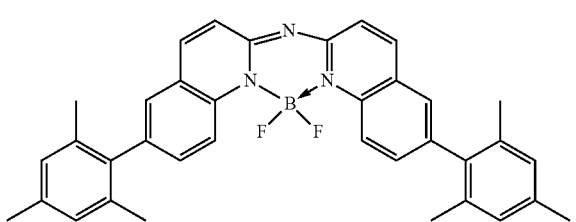
BD5
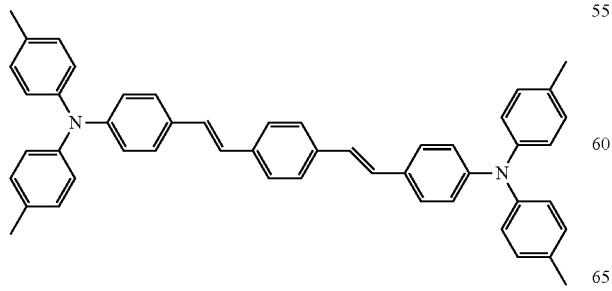
BD6
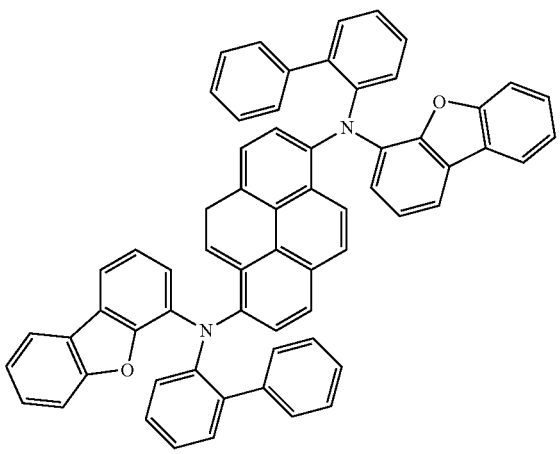
BD7
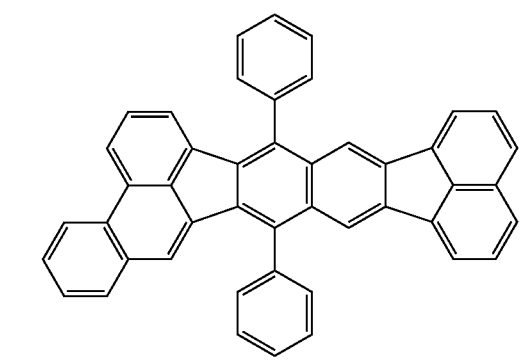
BD8
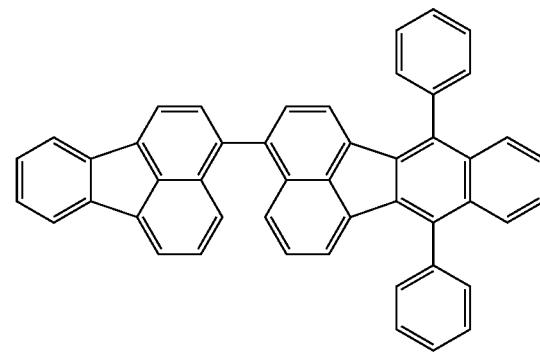
BD9
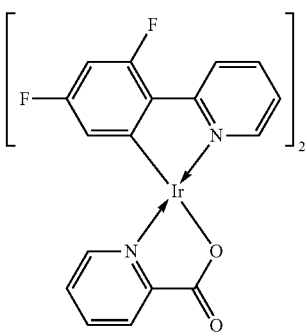

BD10
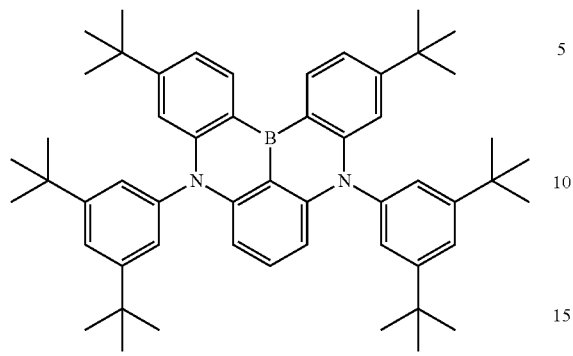
GD4
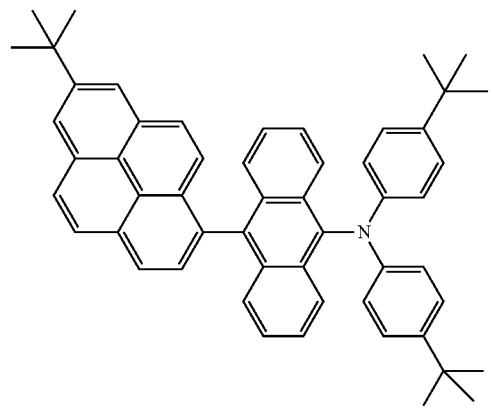
GD1
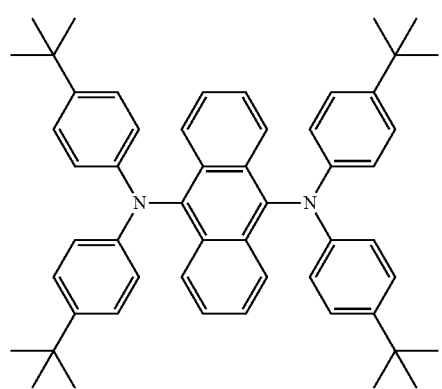
GD5
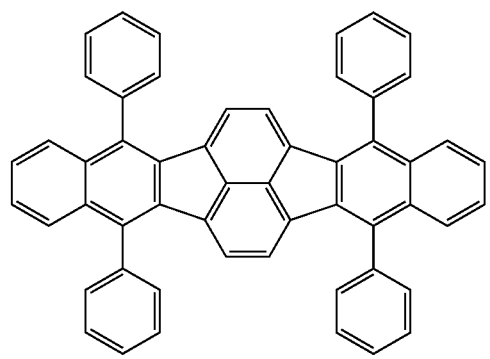
GD2
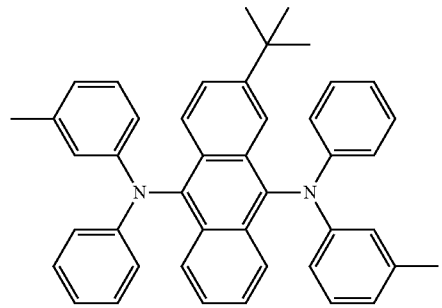
GD6
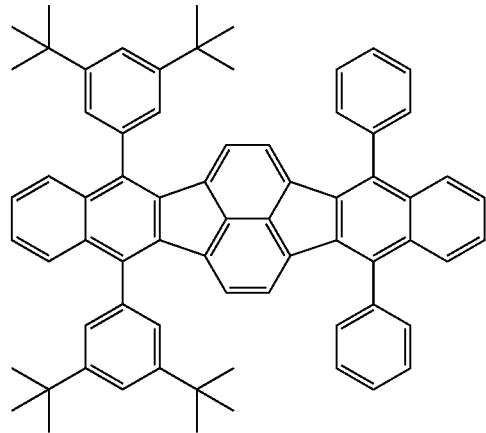
GD3
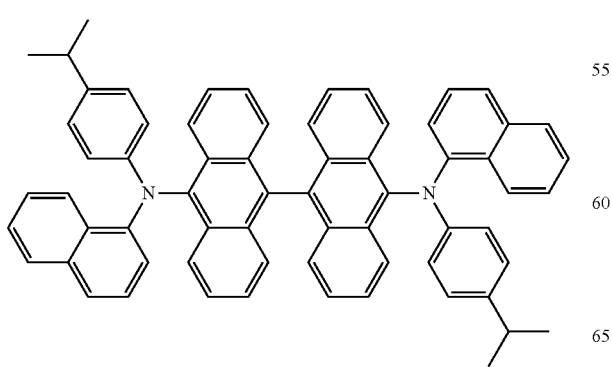

GD7 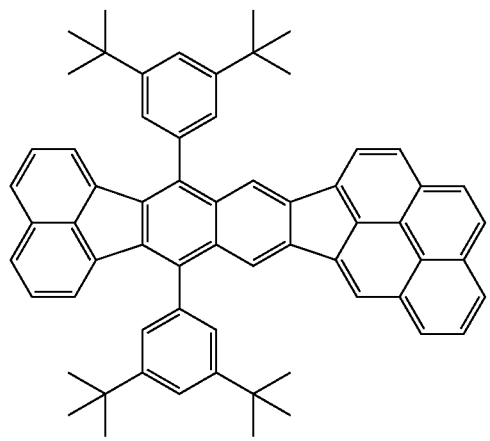
GD8 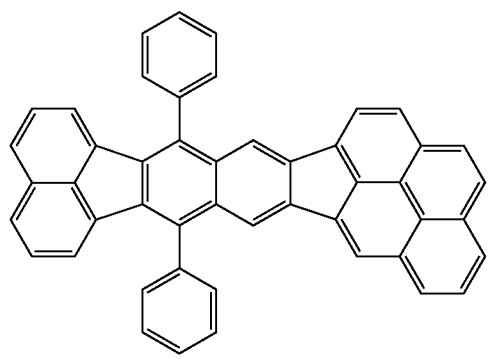
GD9 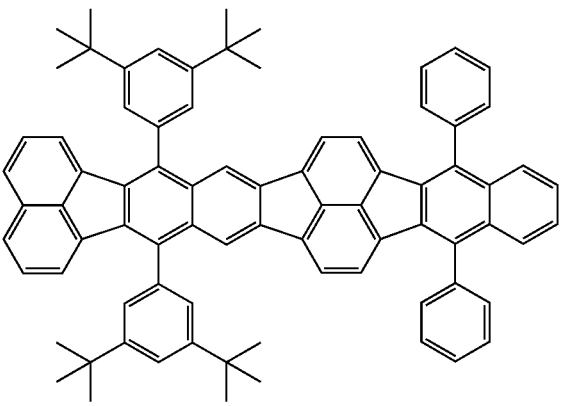
GD10 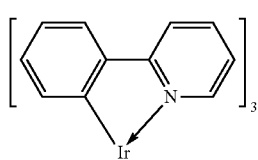
GD11 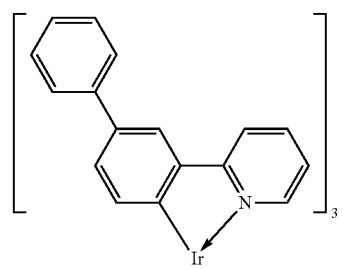
GD12 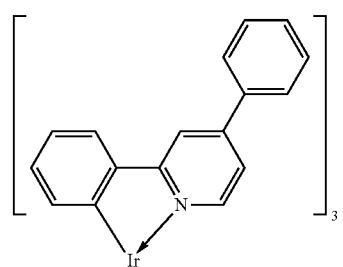
GD13 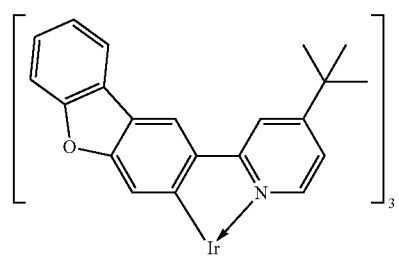
GD14 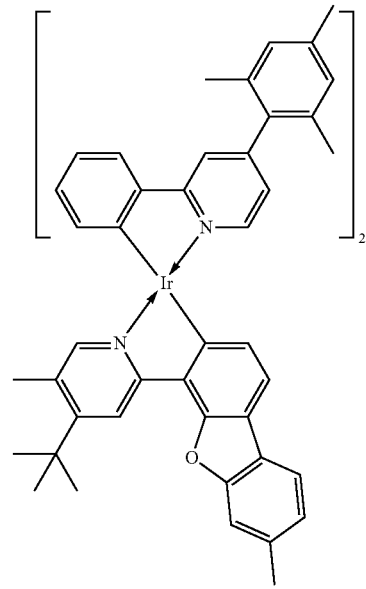

GD15
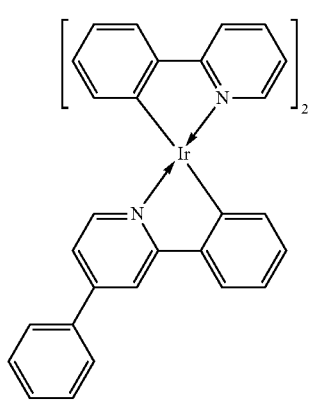
RD1
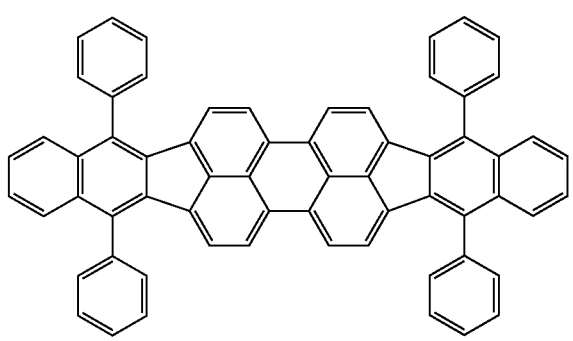
RD2
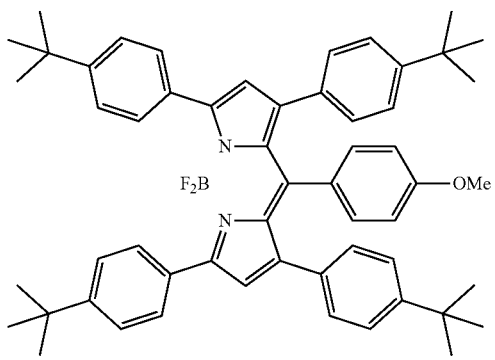
RD3
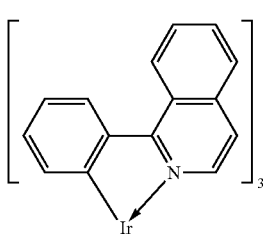
RD4
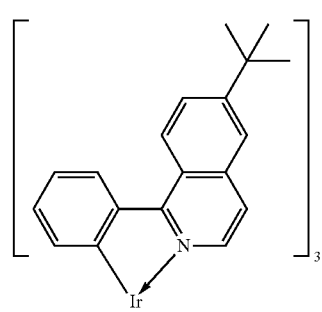
RD5
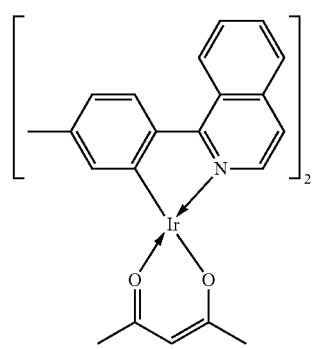
RD6
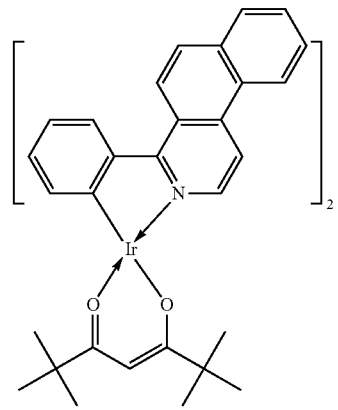

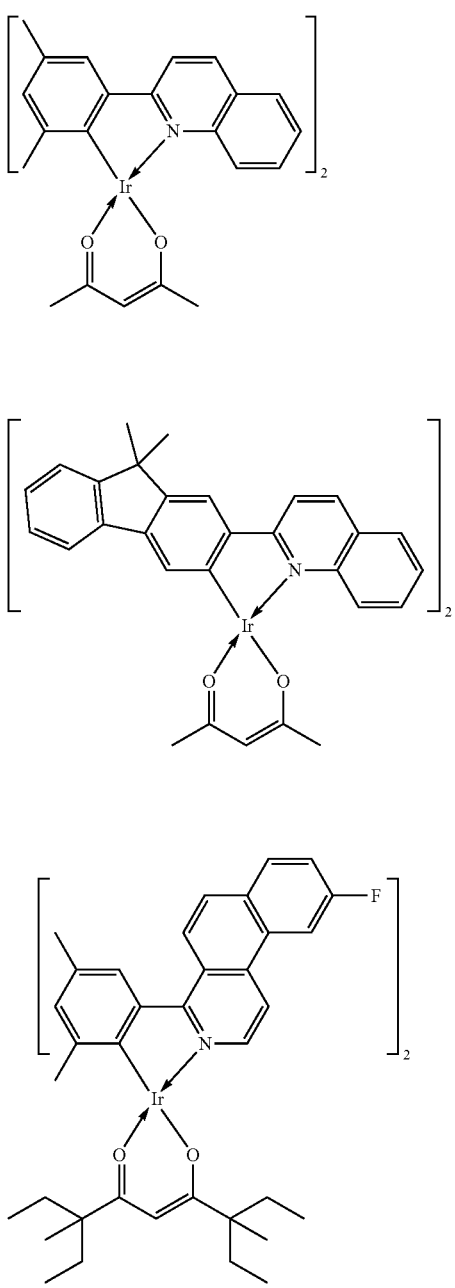

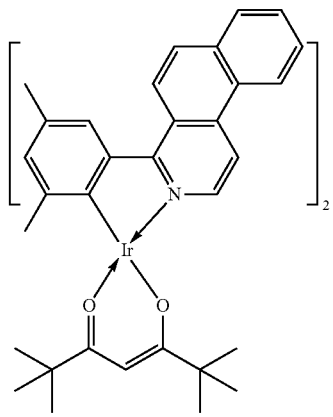

The light-emitting material may be a hydrocarbon compound because it is possible to reduce a decrease in the light emission efficiency due to the formation of an exciplex and a decrease in the color purity caused by a change in the emission spectrum of the light-emitting material due to the formation of an exciplex.

Hydrocarbon compounds are compounds composed only of carbon and hydrogen, and, among the exemplary compounds, BD7, BD8, GD5 to GD9, and RD1 are hydrocarbon compounds.

The light-emitting material may be a fused polycyclic compound including a five-membered ring because such a compound has a high ionization potential and is less likely to be oxidized to provide a highly durable device with a long life. Among the exemplary compounds, BD7, BD8, GD5 to GD9, and RD1 are such compounds.

Examples of the light-emitting layer host or light-emitting assist material that is contained in the light-emitting layer include, in addition to aromatic hydrocarbon compounds and derivatives thereof, carbazole derivatives, dibenzofuran derivatives, dibenzothiophene derivatives, organoaluminum complexes such as tris(8-quinolinolato)aluminum, and organoberyllium complexes.

Specific examples of the compound used as the light-emitting layer host or light-emitting assist material that is contained in the light-emitting layer are described below but are not limited thereto.

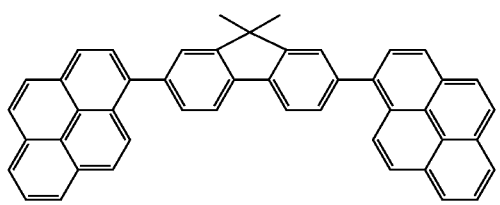

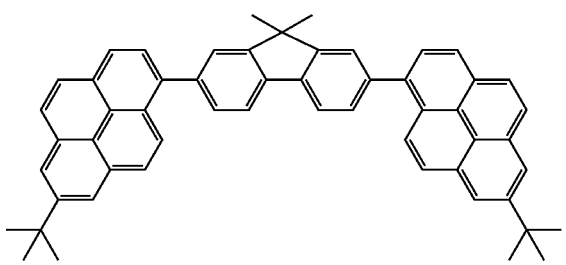

-continued
EM3
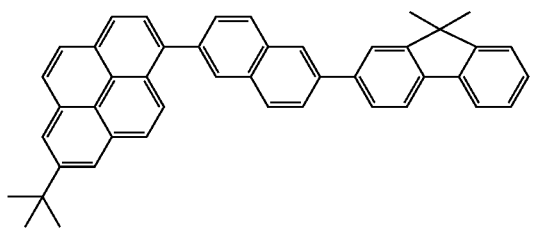
EM4
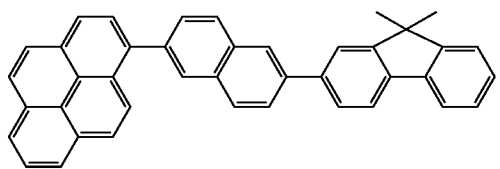
EM5
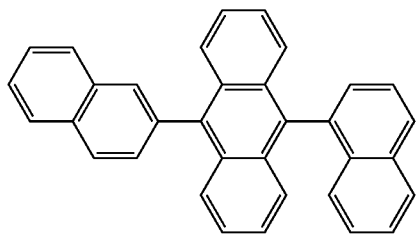
EM6
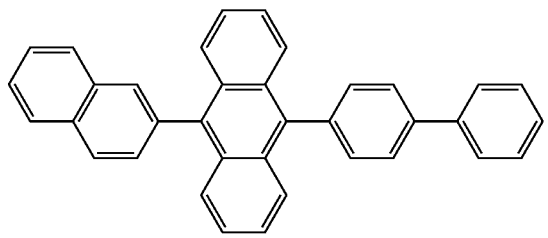
EM7
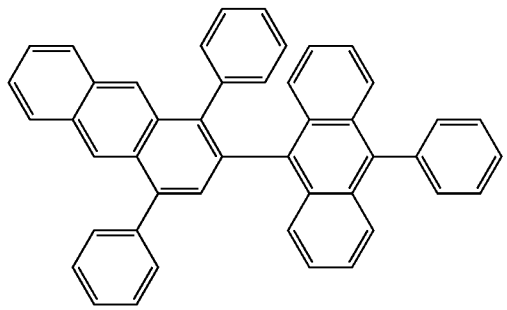
EM8
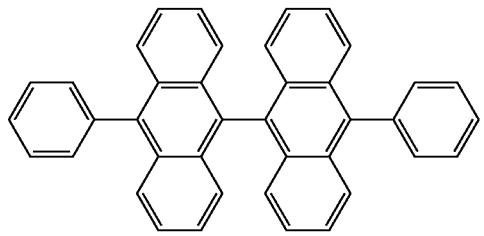
EM9
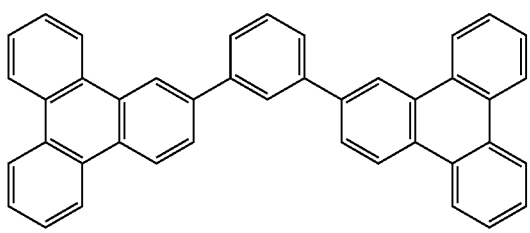
EM10
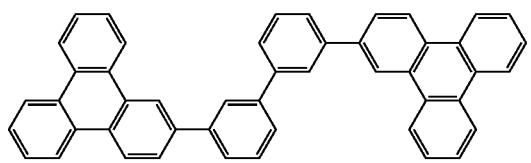
EM11
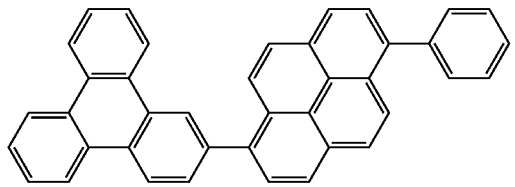
EM12
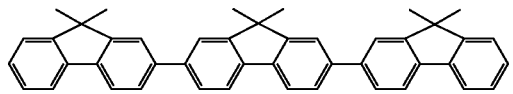
EM13
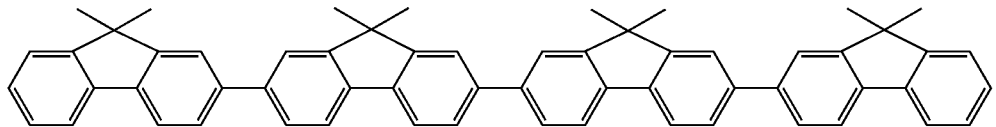
EM14
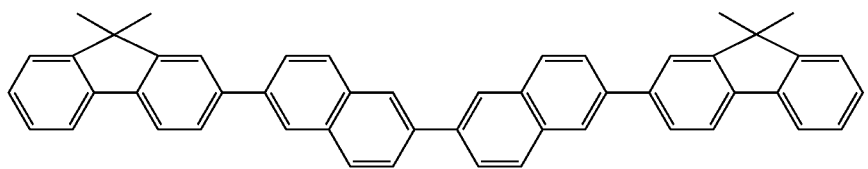

-continued
EM15
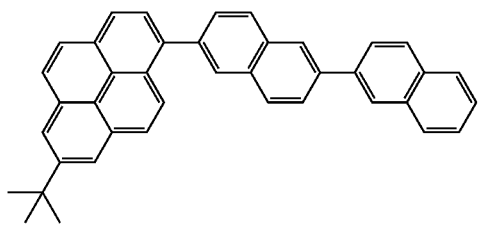
EM15
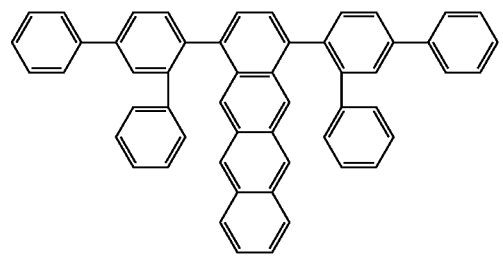
EM17
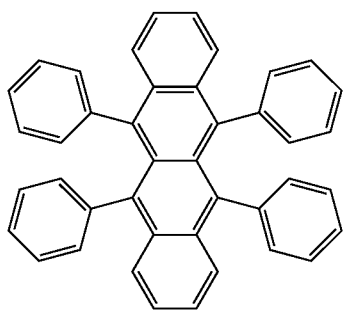
EM18
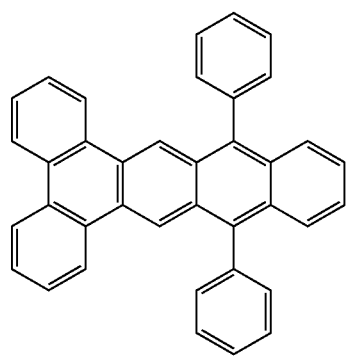
EM19
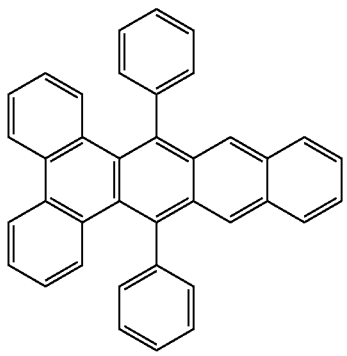
EM20
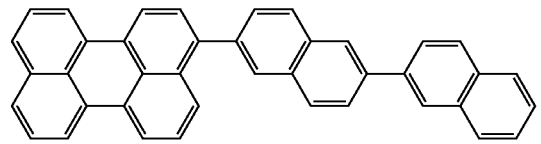
EM21
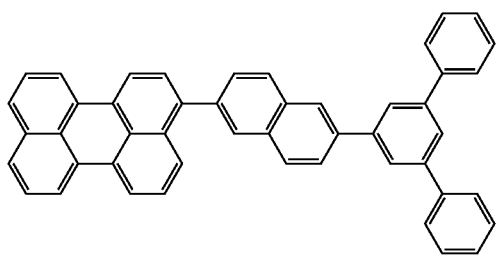
EM22
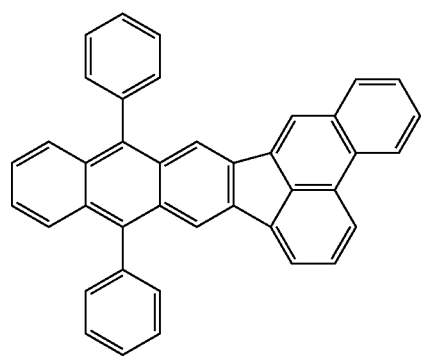

-continued
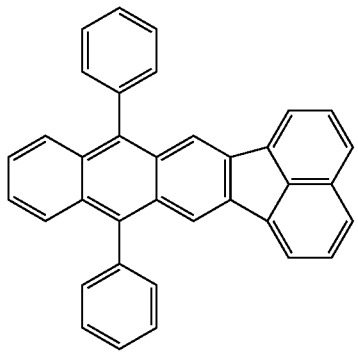
EM23
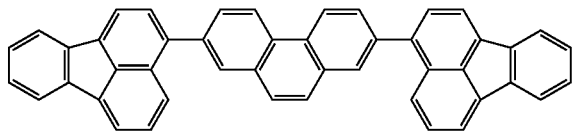
EM24
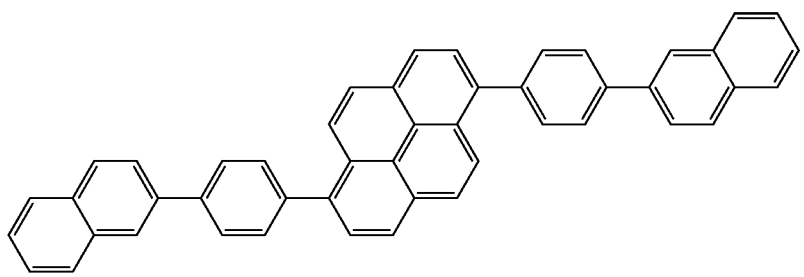
EM25
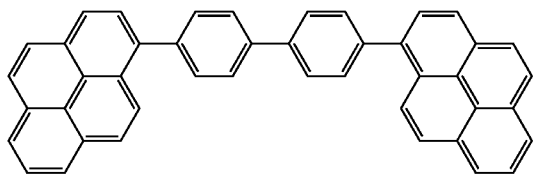
EM26
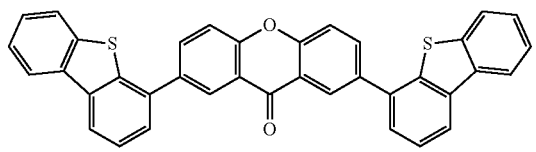
EM27
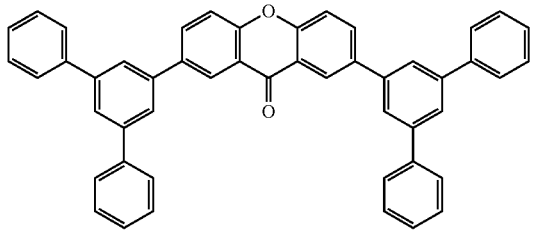
EM28
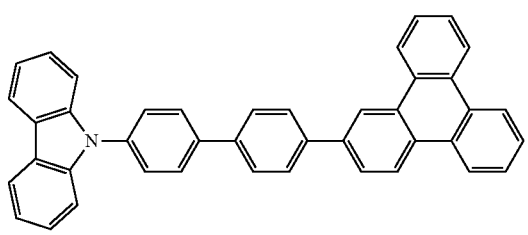
EM29
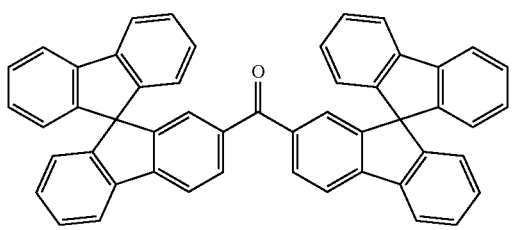
EM30
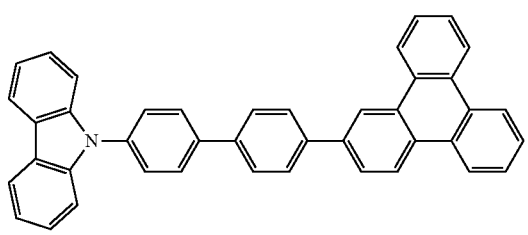
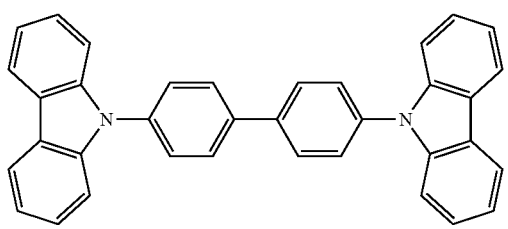
EM32

When the host material is a hydrocarbon compound, the compound according to the present disclosure easily traps electrons and holes, thus effectively achieving higher efficiency. Hydrocarbon compounds are compounds composed only of carbon and hydrogen, and, among the exemplary compounds, EM1 to EM26 are hydrocarbon compounds.

The electron transport material can be freely selected from materials capable of transporting electrons injected from the cathode to the light-emitting layer and is selected in consideration of, for example, the balance with the hole mobility of the hole transport material. Examples of the material having an electron transport property include oxadiazole derivatives, oxazole derivatives, pyrazine derivatives, triazole derivatives, triazine derivatives, quinoline derivatives, quinoxaline derivatives, phenanthroline derivatives, organoaluminum complexes, and fused ring compounds (such as fluorene derivatives, naphthalene derivatives, chrysene derivatives, and anthracene derivatives). The above electron transport materials are also suitable for use in a hole blocking layer.

Specific examples of the compound used as the electron transport material are described below but are not limited thereto.

ET1

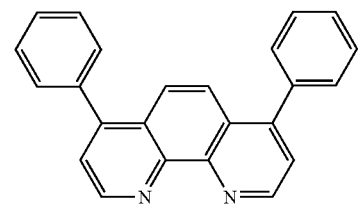

ET2

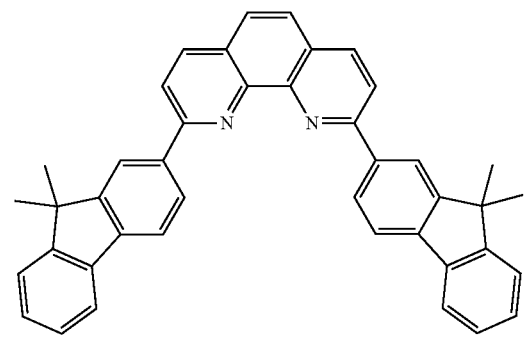

ET3

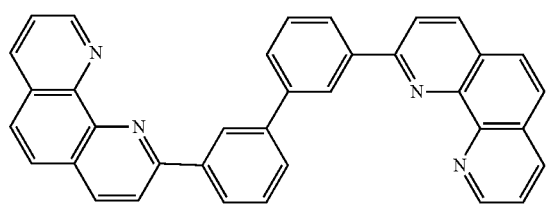

ET4

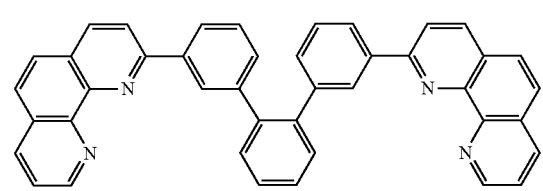

-continued

ET5

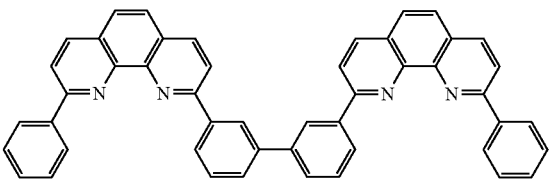

ET6

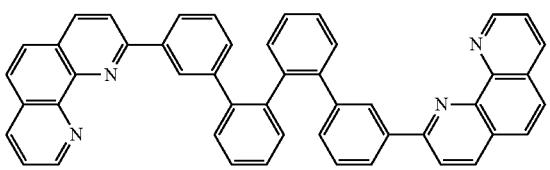

ET7

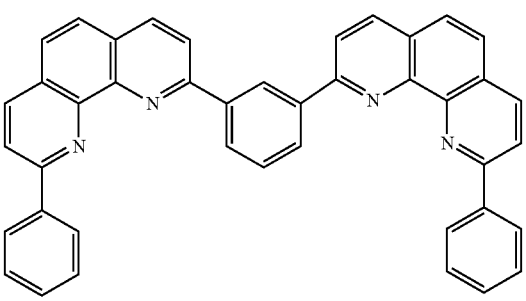

ET8

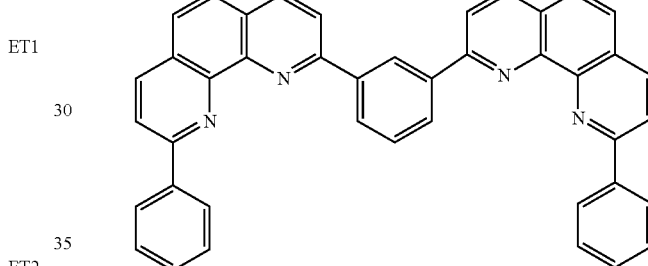

ET9

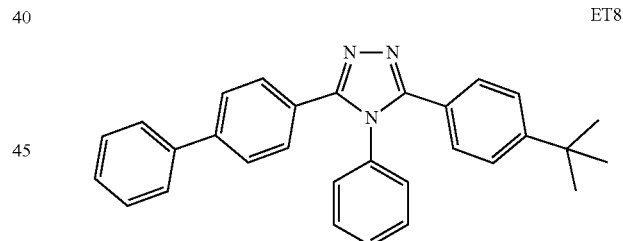

ET10

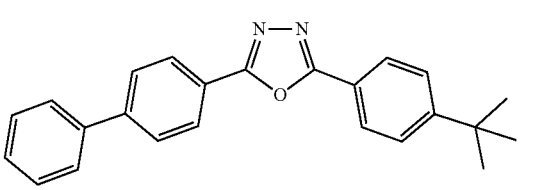

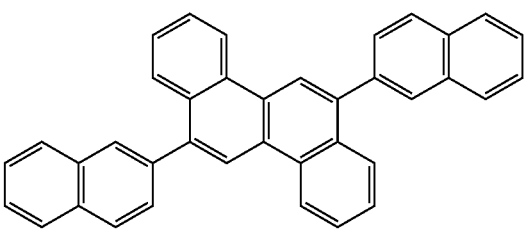

ET11
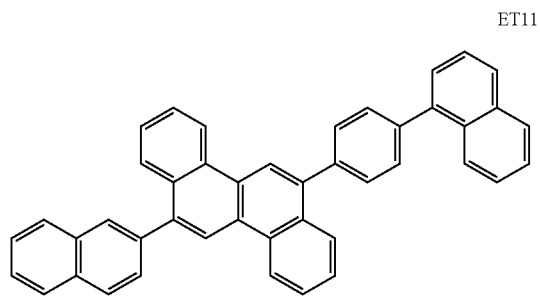
ET12
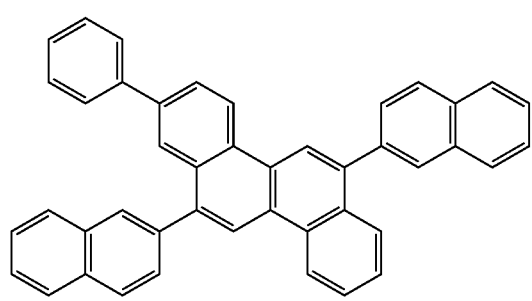
ET13
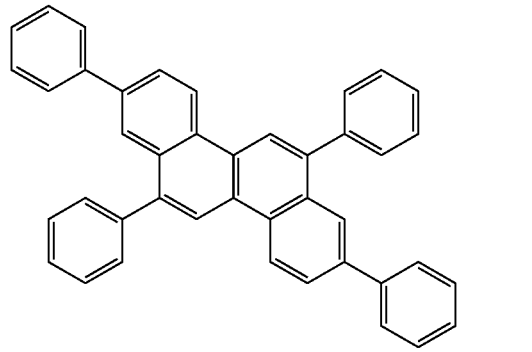
ET14
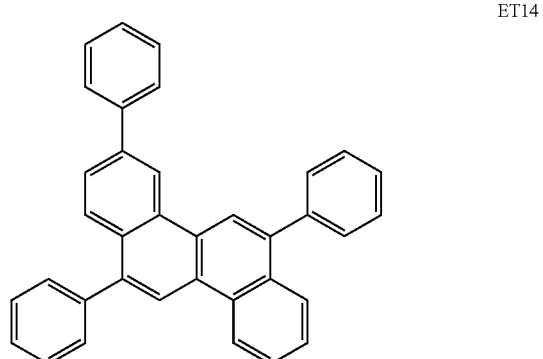
ET15
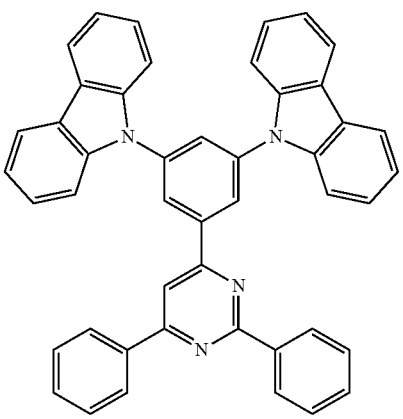
ET16
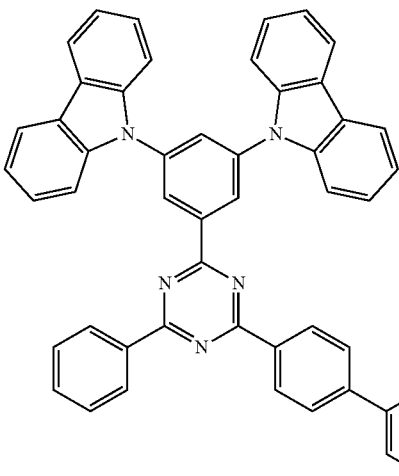
ET17
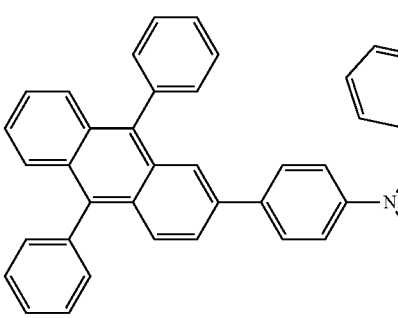
ET18
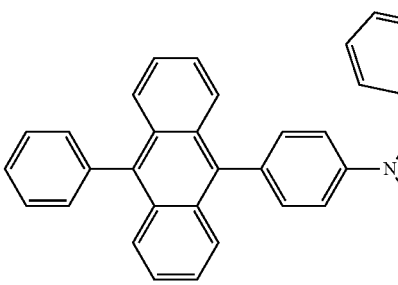

-continued

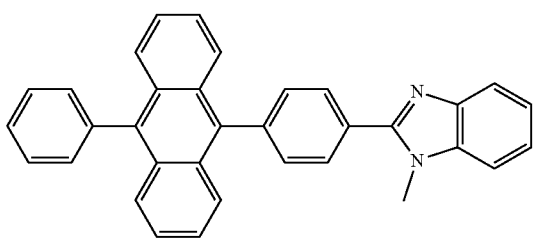
ET19

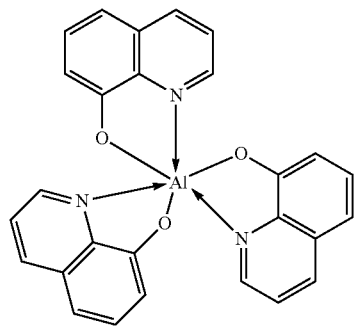
ET20

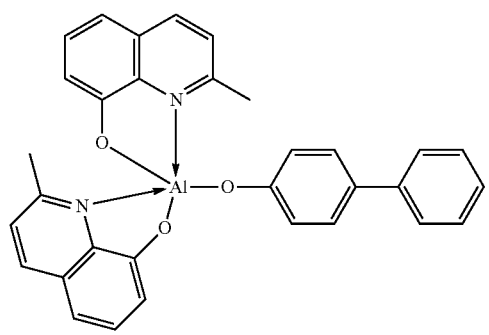
ET21

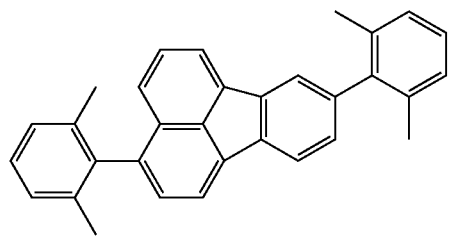
ET22

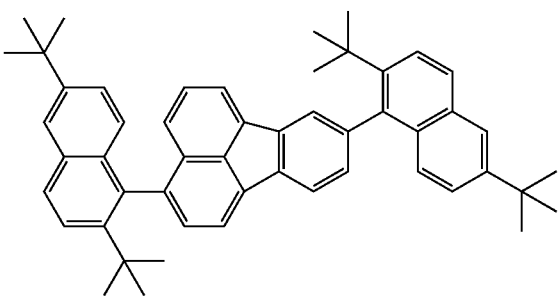
ET23

The electron injection material can be freely selected from materials capable of easily injecting electrons from the cathode and is selected in consideration of, for example, the balance with the hole injection property. As the organic compound, n-type dopants and reducing dopants are also included. Examples thereof include alkali metal-containing compounds such as lithium fluoride, lithium complexes such as lithium quinolinol, benzimidazolidene derivatives, imidazolidene derivatives, fulvalene derivatives, and acridine derivatives.

The above organic compound may be used in combination with the electron transport material.

Structure of Organic Light-Emitting Device

The organic light-emitting device is produced by forming an insulating layer, a first electrode, an organic compound layer, and a second electrode on a substrate. A protective layer, a color filter, a microlens, etc., may be disposed on the cathode.

When a color filter is provided, a planarization layer may be disposed between the color filter and the protective layer. The planarization layer can be formed of an acrylic resin or the like. This also applies to the case where a planarization layer is disposed between the color filter and the microlens.

Substrate

Examples of the substrate include quartz substrates, glass substrates, silicon wafers, resin substrates, and metal substrates. Furthermore, switching elements, such as transistors, and wiring lines may be disposed on the substrate, and an insulating layer may be disposed thereon. The insulating layer may be formed of any material as long as a contact hole can be formed therein so as to form a wiring line between the insulating layer and the first electrode and as long as the material can provide insulation from a wiring line that is not to be connected. Examples of the material include resins such as polyimide, silicon oxide, and silicon nitride.

Electrode

A pair of electrodes can be used as the electrodes. The pair of electrodes may be an anode and a cathode.

In the case where an electric field is applied in a direction in which the organic light-emitting device emits light, the electrode with a higher electric potential is the anode, and the other electrode is the cathode. To put it differently, the electrode that supplies holes to the light-emitting layer is the anode, and the electrode that supplies electrons is the cathode.

The material constituting the anode can have a work function that is as large as possible. Examples of the material include elemental metals such as gold, platinum, silver, copper, nickel, palladium, cobalt, selenium, vanadium, and tungsten; mixtures containing these metals; alloys of these metals; and metal oxides such as tin oxide, zinc oxide, indium oxide, indium tin oxide (ITO), and indium zinc oxide. Examples thereof further include conductive polymers such as polyaniline, polypyrrole, and polythiophene.

These electrode substances may be used alone or in combination of two or more thereof. The anode may be formed of a single layer or a plurality of layers.

When the anode is used as a reflective electrode, for example, chromium, aluminum, silver, titanium, tungsten, molybdenum, an alloy thereof, or a layered structure thereof can be used. The above materials may be used to function as a reflective film that does not have a role of an electrode. When the anode is used as a transparent electrode, a transparent conductive oxide layer such as an indium tin oxide (ITO) or indium zinc oxide layer may be used; however, the anode is not limited thereto.

The electrodes may be formed by photolithography.

In contrast, the material constituting the cathode can have a small work function. Examples of the material of the cathode include alkali metals such as lithium; alkaline earth metals such as calcium; elemental metals such as aluminum, titanium, manganese, silver, lead, and chromium; and mixtures containing these metals. Alloys of these elemental metals may also be used. For example, magnesium-silver, aluminum-lithium, aluminum-magnesium, silver-copper, and zinc-silver may be used. Metal oxides such as indium tin oxide (ITO) may also be used. These electrode substances may be used alone or in combination of two or more thereof. The cathode may have a single-layer structure or a multi-layer structure. In particular, silver can be used. To reduce the aggregation of silver, a silver alloy can be used. The alloying ratio is not limited as long as the aggregation of silver can be reduced. The ratio of silver to another metal may be, for example, 1:1 or 3:1.

The cathode is not particularly limited. The cathode may be a conductive oxide layer made of ITO or the like to provide a top-emission device. Alternatively, the cathode may be a reflective electrode made of aluminum (Al) or the like to provide a bottom-emission device. The method for forming the cathode is not particularly limited. For example, a DC or AC sputtering method can be used because good film coverage is achieved and thus the resistance is easily reduced.

Organic Compound Layer

The organic compound layer may be formed of a single layer or a plurality of layers. When the organic compound layer includes a plurality of layers, the layers may be referred to as a hole injection layer, a hole transport layer, an electron blocking layer, a light-emitting layer, a hole blocking layer, an electron transport layer, or an electron injection layer depending on their functions. The organic compound layer is mainly composed of an organic compound and may contain inorganic atoms and an inorganic compound. For example, the organic compound layer may contain copper, lithium, magnesium, aluminum, iridium, platinum, molybdenum, zinc, or the like. The organic compound layer may be disposed between the first electrode and the second electrode and may be disposed in contact with the first electrode and the second electrode.

Protective Layer

A protective layer may be disposed on the cathode. For example, a glass member having a moisture absorbent can be bonded to the cathode to reduce the entry of, for example, water into the organic compound layer, thereby reducing the occurrence of display defects. In another embodiment, a passivation film composed of silicon nitride or the like may be disposed on the cathode to reduce the entry of, for example, water into the organic compound layer. For example, after the formation of the cathode, the resulting substrate may be transferred to another chamber without breaking the vacuum, and a protective layer may be formed thereon by forming a silicon nitride film having a thickness of 2 µm by a CVD method. A protective layer may be formed by an atomic layer deposition method (ALD method) after the film deposition by a CVD method. The material of the film formed by the ALD method is not limited and may be, for example, silicon nitride, silicon oxide, or aluminum oxide. Silicon nitride may be further deposited by the CVD method on the film formed by the ALD method. The film formed by the ALD method may have a smaller thickness than the film formed by the CVD method. Specifically, the film thickness may be 50% or less, even 10% or less.

Color Filter

A color filter may be disposed on the protective layer. For example, a color filter that takes into account the size of the organic light-emitting device may be disposed on another substrate, and the substrate may be bonded to a substrate having the organic light-emitting device thereon. Alternatively, a color filter may be formed on the aforementioned protective layer by photolithographic patterning. The color filter may be formed of a polymer.

Planarization Layer

A planarization layer may be disposed between the color filter and the protective layer. The planarization layer is formed in order to reduce unevenness of the underlying layer. The planarization layer may be referred to as a material resin layer without limiting the purpose thereof. The planarization layer may be formed of an organic compound and may have a low molecular weight or a high molecular weight. The planarization layer can have a high molecular weight.

The planarization layer may be disposed above and below the color filter, and both the planarization layers may be formed of the same material or different materials. Specific examples of the material include polyvinylcarbazole resins, polycarbonate resins, polyester resins, acrylonitrile-butadiene-styrene (ABS) resins, acrylic resins, polyimide resins, phenolic resins, epoxy resins, silicone resins, and urea resins.

Microlens

An organic light-emitting apparatus may include an optical member such as a microlens on the light output side. The microlens can be composed of an acrylic resin, an epoxy resin, or the like. The microlens may be used to increase the amount of light extracted from the organic light-emitting apparatus and control the direction of the extracted light. The microlens may have a hemispherical shape. In the case of a hemispherical shape, among tangents in contact with the hemisphere, there is a tangent parallel to the insulating layer, and the contact point between the tangent and the hemisphere is the vertex of the microlens. The vertex of the microlens can be determined in the same manner in any sectional view. That is, among the tangents in contact with the semicircle of the microlens in the sectional view, there is a tangent parallel to the insulating layer, and the contact point between the tangent and the semicircle is the vertex of the microlens.

The midpoint of the microlens can also be defined. In a section of the microlens, a line segment from a point where the arc shape ends to another point where the arch shape ends is assumed, and the midpoint of the line segment can be referred to as the midpoint of the microlens. The section in which the vertex and the midpoint are determined may be a section perpendicular to the insulating layer.

Opposite Substrate

An opposite substrate may be disposed on the planarization layer. The opposite substrate is disposed at a position corresponding to the aforementioned substrate and thus is referred to as an opposite substrate. The opposite substrate may be composed of the same material as the aforementioned substrate. When the aforementioned substrate is defined as a first substrate, the opposite substrate may be defined as a second substrate.

Organic Layer

Organic compound layers (such as a hole injection layer, a hole transport layer, an electron blocking layer, a light-emitting layer, a hole blocking layer, an electron transport layer, and an electron injection layer) constituting the organic light-emitting device according to one embodiment of the present disclosure are formed by the methods described below.

The organic compound layers constituting the organic light-emitting device according to one embodiment of the present disclosure can be formed by a dry process, such as a vacuum deposition method, an ionized deposition method, sputtering, or plasma. Instead of the dry process, a wet process involving dissolving a material in an appropriate solvent, and then forming a layer by a publicly known coating method (for example, spin coating, dipping, a casting method, a Langmuir-Blodgett (LB) method, or an ink jet method) can also be employed.

When a layer is formed by a vacuum deposition method, a solution coating method, or the like, for example, crystallization is unlikely to occur, and good stability over time is obtained. When a film is formed by a coating method, a material can be combined with an appropriate binder resin to form the film.

Examples of the binder resin include, but are not limited to, polyvinylcarbazole resins, polycarbonate resins, polyester resins, ABS resins, acrylic resins, polyimide resins, phenolic resins, epoxy resins, silicone resins, and urea resins.

These binder resins may be used alone as a homopolymer or a copolymer or in combination as a mixture of two or more thereof. Furthermore, publicly known additives such as a plasticizer, an oxidation inhibitor, and an ultraviolet absorbent may be optionally used in combination.

Pixel Circuit

A light-emitting apparatus may include a pixel circuit connected to a light-emitting device. The pixel circuit may be an active matrix-type circuit that independently controls light emission of a first light-emitting device and a second light-emitting device. The active matrix-type circuit may be a voltage programming or current programming circuit. A driving circuit has a pixel circuit for each pixel. The pixel circuit may have a light-emitting device, a transistor that controls the emission luminance of the light-emitting device, a transistor that controls the timing of light emission, a capacitor that holds the gate voltage of the transistor that controls the emission luminance, and a transistor for connecting to GND without through the light-emitting device.

The light-emitting apparatus has a display region and a peripheral region around the display region. The display region includes a pixel circuit, and the peripheral region includes a display control circuit. The mobility of transistors constituting the pixel circuit may be smaller than the mobility of transistors constituting the display control circuit.

The slope of the current-voltage characteristics of the transistors constituting the pixel circuit may be smaller than the slope of the current-voltage characteristics of the transistors constituting the display control circuit. The slope of the current-voltage characteristics can be measured by the so-called Vg-Ig characteristics.

The transistors constituting the pixel circuit are transistors connected to light-emitting devices including the first light-emitting device.

Pixel

The organic light-emitting apparatus includes a plurality of pixels. The pixels include subpixels that emit light of a color different from the other colors. The subpixels may individually emit, for example, light of colors of RGB.

The pixels each emit light from an area that is also called a pixel aperture. This area is the same as a first area.

The pixel aperture may have a size of 15 µm or less and 5 µm or more. More specifically, the pixel aperture may be, for example, 11 µm, 9.5 µm, 7.4 µm, or 6.4 µm.

The distance between the subpixels may be 10 µm or less and may be specifically 8 µm, 7.4 µm, or 6.4 µm.

The pixels can have a publicly known arrangement form in plan view. For example, the arrangement form may be the stripe arrangement, the delta arrangement, the PenTile arrangement, or the Bayer arrangement. The subpixels may have any publicly known shape in plan view. For example, the shape may be a quadrangle such as a rectangle or a rhombus, or a hexagon. Of course, figures that are not exactly rectangles but are close to rectangles are also regarded as rectangles. The shape of the subpixels and the pixel arrangement can be used in combination.

Application of Organic Light-Emitting Device According to One Embodiment of the Present Disclosure The organic light-emitting device according to one embodiment of the present disclosure can be used as a constituent member of a display apparatus or an illumination apparatus. In addition, the organic light-emitting device is used in, for example, an exposure light source of an electrophotographic image forming apparatus, a backlight of a liquid crystal display apparatus, and a light-emitting apparatus including a white light source and a color filter.

The display apparatus may be an image information processing apparatus that includes an image input unit to which image information is input from an area CCD, a linear CCD, a memory card, or the like and an information processing unit configured to process the input information, and that displays an input image on a display unit.

The display unit included in an imaging apparatus or an ink jet printer may have a touch panel function. The touch panel function may be operated by using infrared, an electrostatic capacitance, a resistive film, or electromagnetic induction, and the operation method is not particularly limited. The display apparatus may be used in a display unit of a multifunctional printer.

Next, a display apparatus according to the present embodiment will be described with reference to the drawings.

Figure 2A:
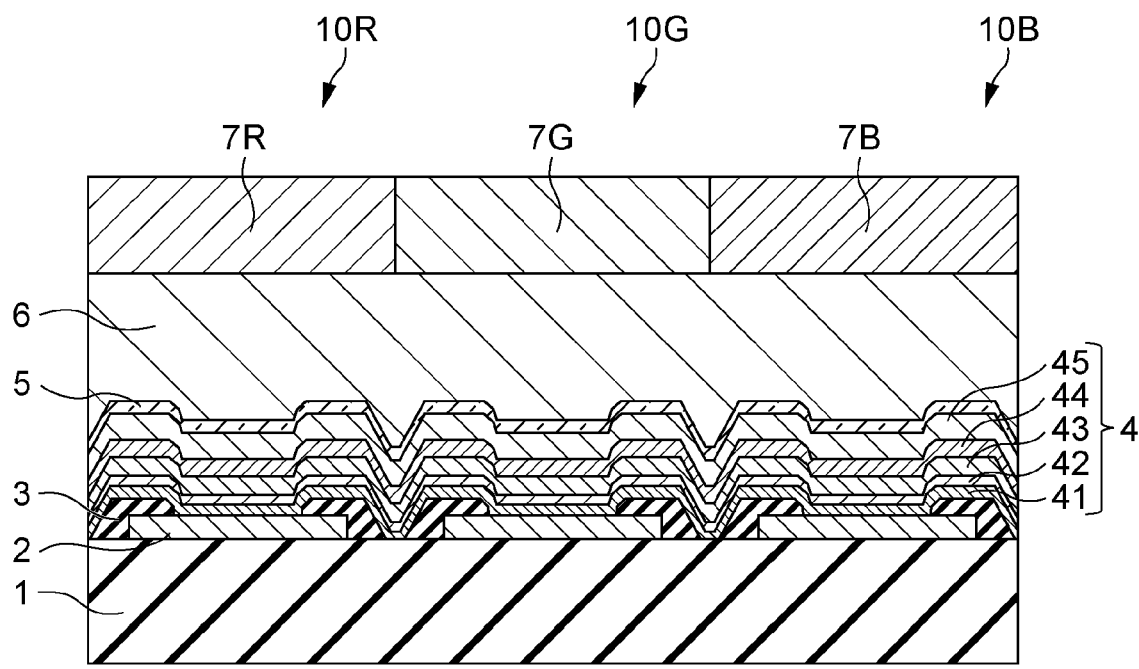
FIG. 2A is a schematic sectional view illustrating one example of a pixel of a display apparatus according one embodiment of the present disclosure.
Figure 2B:
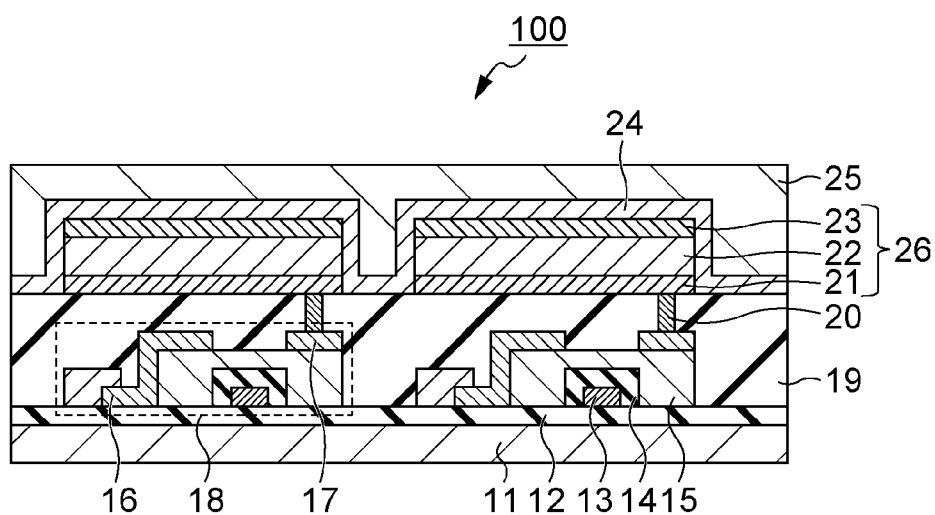
FIG. 2B is a schematic sectional view of one example of a display apparatus that uses an organic light-emitting device according to one embodiment of the present disclosure.

FIGS. 2A and 2B are schematic sectional views illustrating an example of a display apparatus including organic light-emitting devices and transistors connected to the organic light-emitting devices. Each of the transistors is one example of an active element. The transistors may be thin-film transistors (TFT).

FIG. 2A is one example of a pixel which is a component of the display apparatus according to this embodiment. A pixel has subpixels 10. The subpixels are separated into 10R, 10G, and 10B according to their light emission. The emission color may be distinguished on the basis of the wavelength of light emitted from the light-emitting layer, or the light emitted from the subpixels may be subjected to selective transmission or color conversion through a color filter or the like. Each of the subpixels includes, on an interlayer insulating layer 1, a reflective electrode 2 serving as a first electrode, an insulating layer 3 covering ends of the reflective electrode 2, an organic compound layer 4 covering the first electrode and the insulating layer, a transparent electrode 5 serving as a second electrode, a protective layer 6, and a color filter 7.

The interlayer insulating layer 1 may have transistors and capacitor elements arranged in a layer disposed thereunder or an interior thereof.

Each transistor and the first electrode may be electrically connected to each other through a contact hole or the like not illustrated in the drawing.

The insulating layer 3 is also called a bank or a pixel isolation film. The insulating layer 3 covers ends of the first electrode and is disposed so as to surround the first electrode. The portion where the insulating layer is not disposed is in contact with the organic compound layer 4 and serves as a light-emitting area.

The organic compound layer 4 includes a hole injection layer 41, a hole transport layer 42, a first light-emitting layer 43, a second light-emitting layer 44, and an electron transport layer 45.

The second electrode 5 may be a transparent electrode, a reflective electrode, or a semi-transparent electrode.

The protective layer 6 reduces the entry of moisture into the organic compound layer. Although the protective layer is illustrated as a single layer in the drawing, the protective layer may be formed of a plurality of layers. Each layer may be an inorganic compound layer or an organic compound layer.

The color filter 7 is separated into 7R, 7G, and 7B according to the colors thereof. The color filter may be formed on a planarizing film not illustrated in the drawing. Furthermore, a resin protective layer not illustrated in the drawing may be disposed on the color filter. The color filter may be formed on the protective layer 6. Alternatively, the color filter may be formed on an opposite substrate such as a glass substrate and may then be bonded.

A display apparatus 100 illustrated in FIG. 2B includes organic light-emitting devices 26 and TFTs 18 serving as one example of transistors. A substrate 11 composed of glass, silicon, or the like and an insulating layer 12 on top of the substrate 11 are provided. Active elements 18 such as TFTs are disposed on the insulating layer. A gate electrode 13, a gate insulating film 14, and a semiconductor layer 15 of each of the active elements are disposed on the insulating layer. Each of the TFTs 18 includes the semiconductor layer 15, a drain electrode 16, and a source electrode 17. An insulating film 19 is disposed on the TFTs 18. An anode 21 included in each of the organic light-emitting emitting devices 26 is connected to the source electrode 17 through a contact hole 20 formed in the insulating film.

The form of the electrical connection between the electrodes (anode and cathode) included in each organic light-emitting device 26 and the electrodes (source electrode and drain electrode) included in the corresponding one of the TFTs is not limited to the form illustrated in FIG. 2B. In other words, it is sufficient that one of the anode and the cathode is electrically connected to one of the source electrode and the drain electrode of the TFT. Here, the TFT indicates a thin-film transistor.

In the display apparatus 100 in FIG. 2B, an organic compound layer is illustrated as if the organic compound layer 22 is formed of a single layer. Alternatively, the organic compound layer 22 may be formed of a plurality of layers. A first protective layer 24 and a second protective layer 25 for reducing deterioration of the organic light-emitting devices are disposed over cathodes 23.

Although transistors are used as the switching elements in the display apparatus 100 illustrated in FIG. 2B, different switching elements may be used instead of the transistors.

The transistors used in the display apparatus 100 illustrated in FIG. 2B are not limited to transistors that use a single-crystal silicon wafer but may be thin-film transistors that have active layers on an insulating surface of a substrate. Examples of the active layers include layers of single-crystal silicon, non-single-crystal silicon such as amorphous silicon and microcrystalline silicon, and non-single-crystal oxide semiconductors such as indium zinc oxide and indium gallium zinc oxide. Thin-film transistors are also referred to as TFT elements.

The transistors included in the display apparatus 100 illustrated in FIG. 2B may be formed inside a substrate such as a Si substrate. The expression "formed inside a substrate" as used herein means that transistors are produced by processing a substrate, such as a Si substrate, itself. In other words, having transistors inside a substrate can also be considered that a substrate and transistors are integrally formed.

With the organic light-emitting device according to this embodiment, the emission luminance is controlled by the TFTs, which are one example of switching elements, and thus an image can be displayed at respective emission luminance levels by arranging a plurality of organic light-emitting devices in the plane. The switching elements according to this embodiment are not limited to TFTs and may be transistors formed of low-temperature polysilicon or active-matrix drivers formed on a substrate such as a Si substrate. The expression "on a substrate" can also be referred to as "inside the substrate". Whether transistors are formed inside a substrate or TFTs are used is selected on the basis of the size of the display unit. For example, when the size is about 0.5 inches, organic light-emitting devices can be disposed on a Si substrate.

Figure 3:
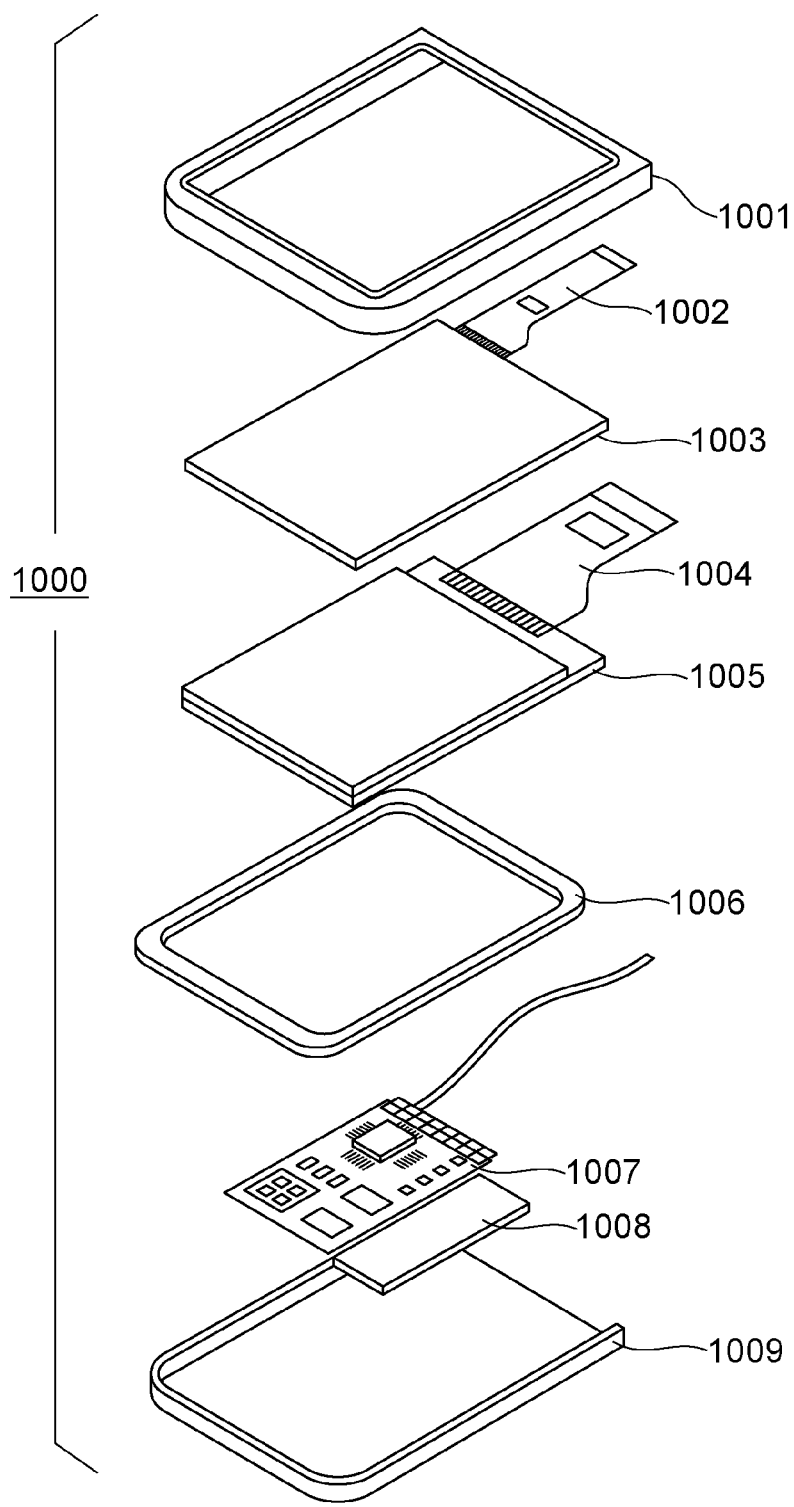
FIG. 3 is a schematic view illustrating one example of a display apparatus according to one embodiment of the present disclosure.

FIG. 3 is a schematic view illustrating one example of a display apparatus according to this embodiment. A display apparatus 1000 may include an upper cover 1001 and a lower cover 1009, and a touch panel 1003, a display panel 1005, a frame 1006, a circuit substrate 1007, and a battery 1008 that are disposed between the upper cover 1001 and the lower cover 1009. The touch panel 1003 and the display panel 1005 are connected to flexible printed circuits FPC 1002 and 1004, respectively. Transistors are printed onto the circuit substrate 1007. The battery 1008 is not necessarily installed unless the display apparatus is a portable apparatus or may be installed in a different position even if the display apparatus is a portable apparatus.

The display apparatus according to this embodiment may include a color filter having red, green, and blue portions. The red, green, and blue portions of the color filter may be arranged in the delta arrangement.

The display apparatus according to this embodiment may be used in a display unit of a portable terminal. In such a case, the display apparatus may have both a display function and an operation function. Examples of the portable terminal include mobile phones such as smart phones, tablets, and head mount displays.

The display apparatus according to this embodiment may be used in a display unit of an imaging apparatus including an optical unit that includes a plurality of lenses and an imaging device that receives light that has passed through the optical unit. The imaging apparatus may include a display unit that displays information acquired by the imaging device. The display unit may be a display unit exposed to the outside of the imaging apparatus or a display unit disposed in a viewfinder. The imaging apparatus may be a digital camera or a digital camcorder.

Figure 4A:
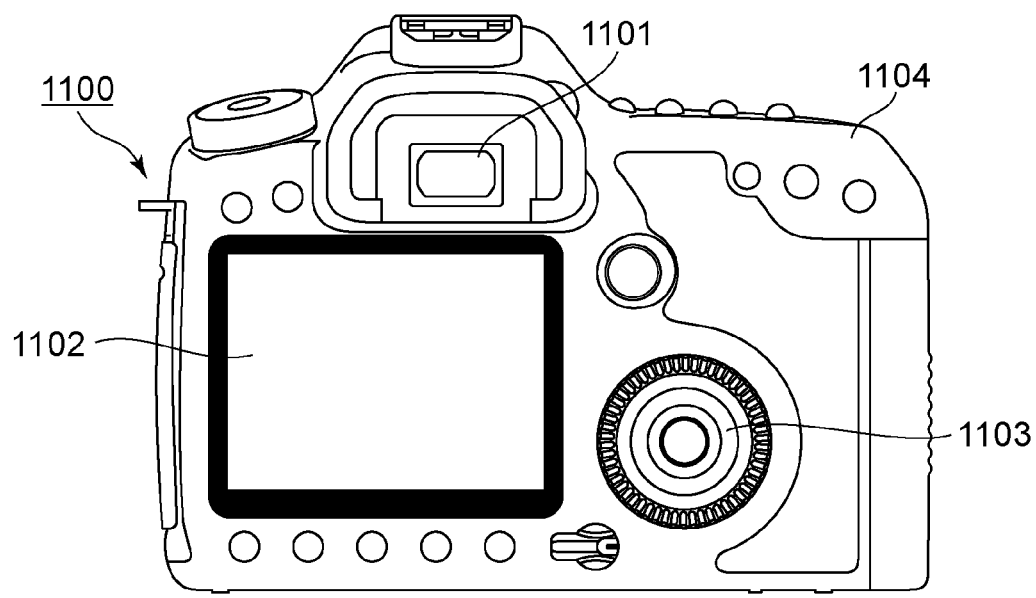
FIG. 4A is a schematic view illustrating one example of an imaging apparatus according to one embodiment of the present disclosure.

FIG. 4A is a schematic view illustrating one example of an imaging apparatus according to this embodiment. An imaging apparatus 1100 may include a viewfinder 1101, a rear surface display 1102, an operation unit 1103, and a housing 1104. The viewfinder 1101 may include a display apparatus according to this embodiment. In such a case, the display apparatus may display not only an image to be captured but also, for example, environmental information and imaging instructions. The environmental information may include, for example, the intensity of external light, the direction of external light, the moving speed of the subject, and the possibility that the subject may hide behind an obstacle.

Since the suitable timing for capturing an image is a very short period of time, it is desirable to display information as quickly as possible. Accordingly, a display apparatus that uses the organic light-emitting device according to the present disclosure can be used. This is because the organic light-emitting device has a high response speed. The display apparatus that uses an organic light-emitting device is more suitable than liquid crystal display apparatuses for use in apparatuses for which a high display speed is required.

The imaging apparatus 1100 includes an optical unit not illustrated in the drawing. The optical unit includes a plurality of lenses and is configured to form an image on an imaging device contained in the housing 1104. The optical unit includes multiple lenses and is configured to form an image on an image pickup device in the housing 1104. The plurality of lenses can adjust the focal point by adjusting their relative positions. This operation can be automatically performed. The imaging apparatus may also be referred to as a photoelectric conversion apparatus. The photoelectric conversion apparatus can employ, instead of a method of successively capturing images, image capturing methods such as a method of detecting a difference from the previous image and a method of extracting images from continuously recorded images.

Figure 4B:
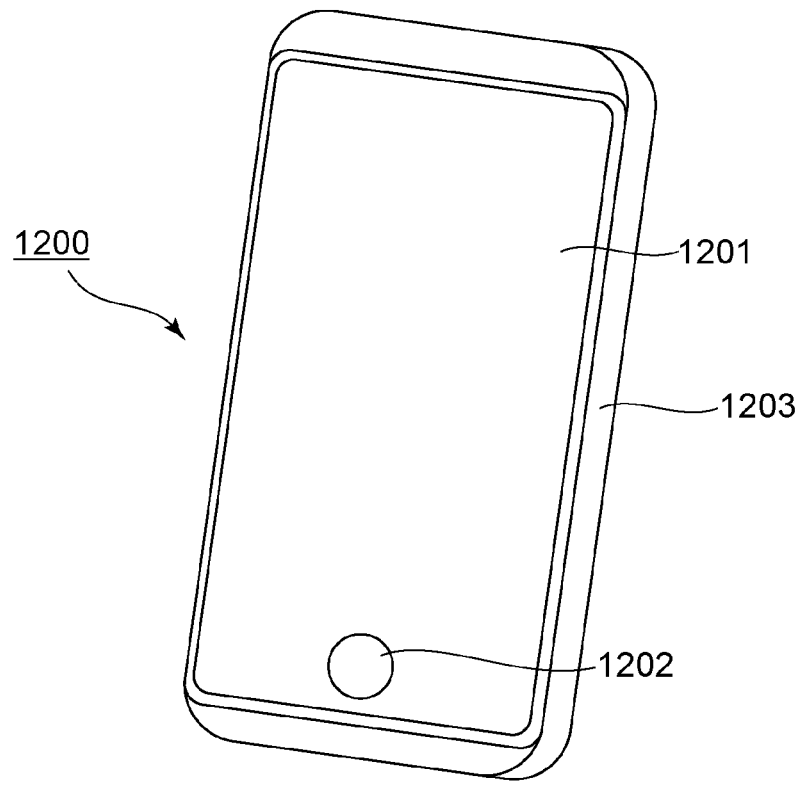
FIG. 4B is a schematic view illustrating one example of an electronic apparatus according to one embodiment of the present disclosure.

FIG. 4B is a schematic view of one example of an electronic apparatus according to this embodiment. An electronic apparatus 1200 includes a display unit 1201, an operation unit 1202, and a housing 1203. The housing 1203 may include therein circuits, a print substrate having the circuits, a battery, and a communication unit. The operation unit 1202 may be a button or a touch panel-type responsive unit. The operation unit may be a biometric authentication unit configured to, for example, recognize the fingerprints and release the lock. The electronic apparatus that includes a communication unit can also be referred to as a communication apparatus. The electronic apparatus may include a lens and an imaging device so as to further have a camera function. An image captured by the camera function is displayed on the display unit. Examples of the electronic apparatus include smart phones and notebook computers.

Figure 5A:
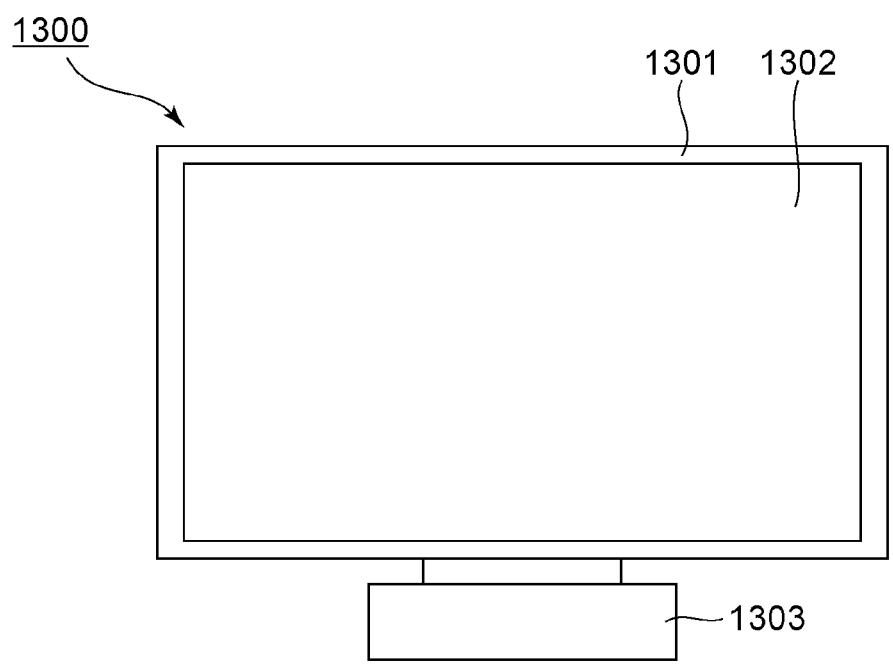
FIG. 5A is a schematic view illustrating one example of a display apparatus according to one embodiment of the present disclosure.
Figure 5B:
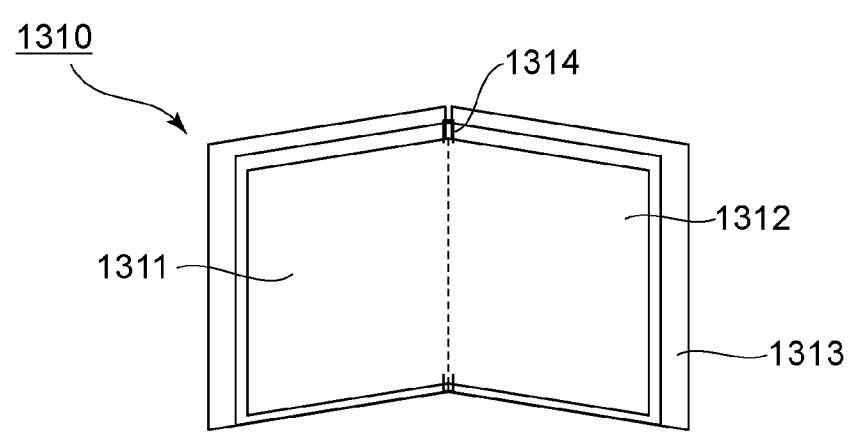
FIG. 5B is a schematic view illustrating one example of a foldable display apparatus.

FIGS. 5A and 5B are schematic views each illustrating one example of a display apparatus according to this embodiment. FIG. 5A illustrates a display apparatus such as a television monitor or a PC monitor. A display apparatus 1300 includes a frame 1301 and a display unit 1302. The light-emitting apparatus according to this embodiment may be used in the display unit 1302.

The display apparatus 1300 further includes a base 1303 that supports the frame 1301 and the display unit 1302. The base 1303 is not limited to the form illustrated in FIG. 5A. The lower side of the frame 1301 may also function as the base.

The frame 1301 and the display unit 1302 may be curved. The radius of curvature thereof may be 5,000 mm or more and 6,000 mm or less.

FIG. 5B is a schematic view of another example of the display apparatus according to this embodiment. A display apparatus 1310 illustrated in FIG. 5B is configured to be foldable and is the so-called foldable display apparatus. The display apparatus 1310 has a first display unit 1311, a second display unit 1312, a housing 1313, and an inflexion point 1314. Each of the first display unit 1311 and the second display unit 1312 may include the light-emitting apparatus accordion to this embodiment. The first display unit 1311 and the second display unit 1312 may be a single display apparatus without a joint. The first display unit 1311 and the second display unit 1312 can be separated at the inflexion point. The first display unit 1311 and the second display unit 1312 may respectively display different images. Alternatively, one image may be displayed on a set of the first display unit 1311 and the second display unit 1312.

Figure 6A:
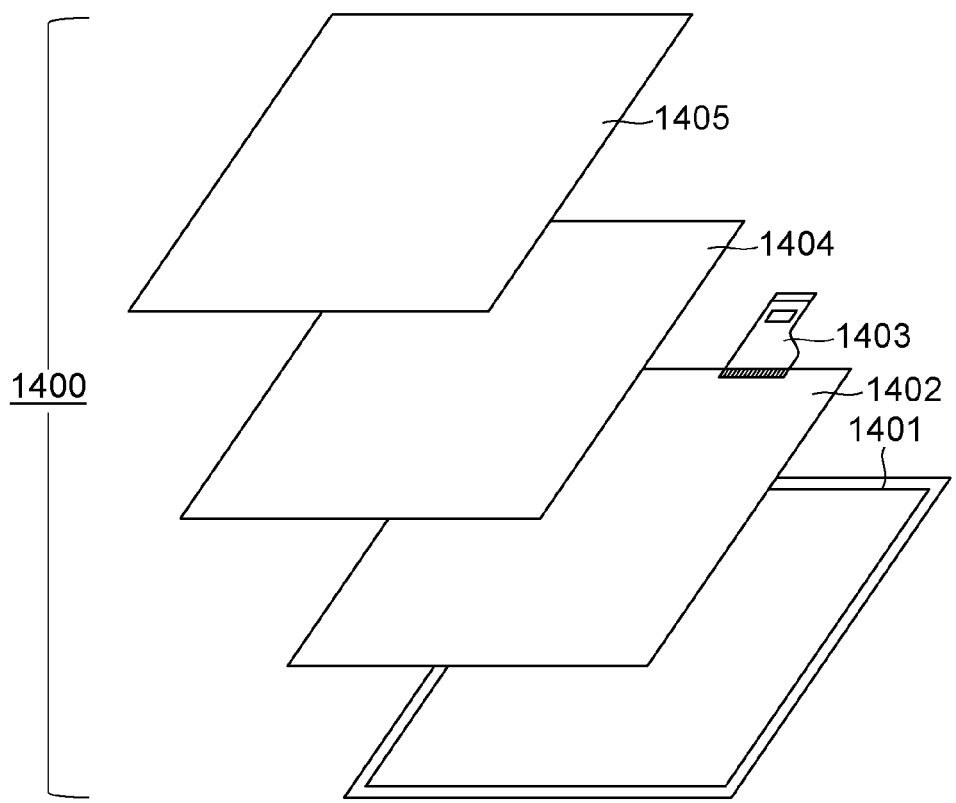
FIG. 6A is a schematic view illustrating one example of an illumination apparatus according to one embodiment of the present disclosure.

FIG. 6A is a schematic view illustrating one example of an illumination apparatus according to this embodiment. An illumination apparatus 1400 may include a housing 1401, a light source 1402, a circuit substrate 1403, an optical film 1404, and a light diffusion unit 1405. The light source may include the organic light-emitting device according to this embodiment. The optical filter may be a filter that improves the color rendering properties of the light source. The light diffusion unit can effectively diffuse light emitted from the light source and allow the light to reach a wide range, for example, for lighting up. The optical filter and the light diffusion unit may be disposed on the light output side of the illumination. A cover may be optionally disposed on the outermost portion.

The illumination apparatus is, for example, an apparatus that illuminates a room. The illumination apparatus may emit light of a color such as white, natural white, or any other color from blue to red. The illumination apparatus may include a light modulating circuit configured to modulate the light.

The illumination apparatus may include the organic light-emitting device according to the present disclosure and a power supply circuit connected to the organic light-emitting device. The power supply circuit is a circuit configured to convert alternating current voltage to direct current voltage. The white is a color having a color temperature of 4,200 K, and the natural white is a color having a color temperature of 5,000 K. The illumination apparatus may include a color filter.

The illumination apparatus according to this embodiment may include a heat dissipation unit. The heat dissipation unit dissipates heat in the apparatus to the outside of the apparatus. The heat dissipation unit may be formed of, for example, a metal having a high specific heat or liquid silicon.

Figure 6B:
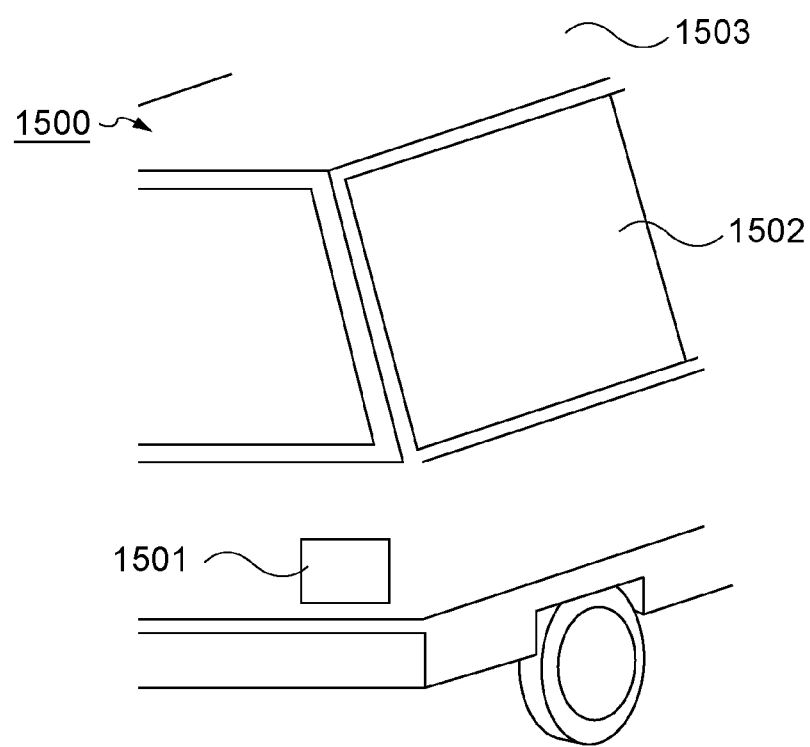
FIG. 6B is a schematic view illustrating one example of an automobile including a vehicle lighting fixture according to one embodiment of the present disclosure.

FIG. 6B is a schematic view of an automobile, which is one example of a moving object according to this embodiment. The automobile has a tail lamp, which is one example of a lighting fixture. An automobile 1500 has a tail lamp 1501, and the tail lamp 1501 may light up when, for example, the brakes are applied.

The tail lamp 1501 may include the organic light-emitting device according to this embodiment. The tail lamp may include a protective member that protects the organic EL device. The protective member may be composed of any material that has high strength to a certain extent and is transparent, and can be composed of a polycarbonate or the like. The polycarbonate may be mixed with a furandicarboxylic acid derivative, an acrylonitrile derivative, or the like.

The automobile 1500 may include a car body 1503 and a window 1502 installed to the car body 1503. The window may be a transparent display unless it is a window for checking of the front and rear of the automobile. The transparent display may include the organic light-emitting device according to this embodiment. In such a case, the components, such as the electrodes, of the organic light-emitting device are formed of transparent members.

The moving object according to this embodiment may be, for example, a ship, an aircraft, or a drone. The moving object may include a body and a lighting fixture installed to the body. The lighting fixture may emit light to indicate the position of the body. The lighting fixture includes the organic light-emitting device according to this embodiment.

Examples of applications of the display apparatuses according to the embodiments described above will be described with reference to FIGS. 7A and 7B. The display apparatuses are applicable to systems that can be worn as wearable devices, such as smart glasses, head mount display (HMDs), and smart contact lenses. An imaging and display apparatus used in such an example of the application includes an imaging apparatus that can photoelectrically convert visible light and a display apparatus that can emit visible light.

Figure 7A:
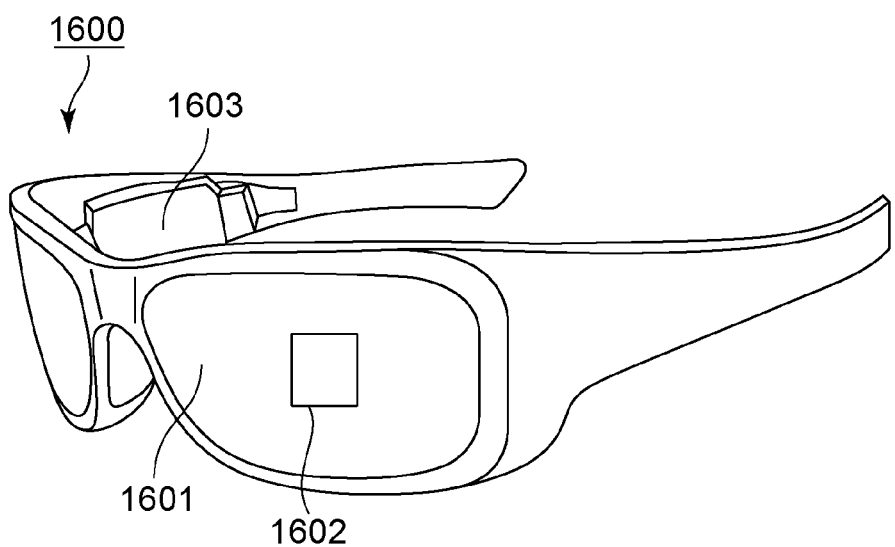
FIG. 7A is a schematic view illustrating one example of a wearable device according to one embodiment of the present disclosure.

FIG. 7A illustrates glasses 1600 (smart glasses) according to one example of applications. An imaging apparatus 1602 such as a complementary metal-oxide semiconductor (CMOS) sensor or a single-photon avalanche diode (SPAD) is provided on the front side of a lens 1601 of the glasses 1600. The display apparatus according to any of the above-described embodiments is provided on the back side of the lens 1601.

The glasses 1600 further include a control unit 1603. The control unit 1603 functions as a power supply that supplies electric power to the imaging apparatus 1602 and the display apparatus according to the embodiment. The control unit 1603 controls the operation of the imaging apparatus 1602 and the display apparatus. An optical system for focusing light on the imaging apparatus 1602 is formed on the lens 1601.

Figure 7B:
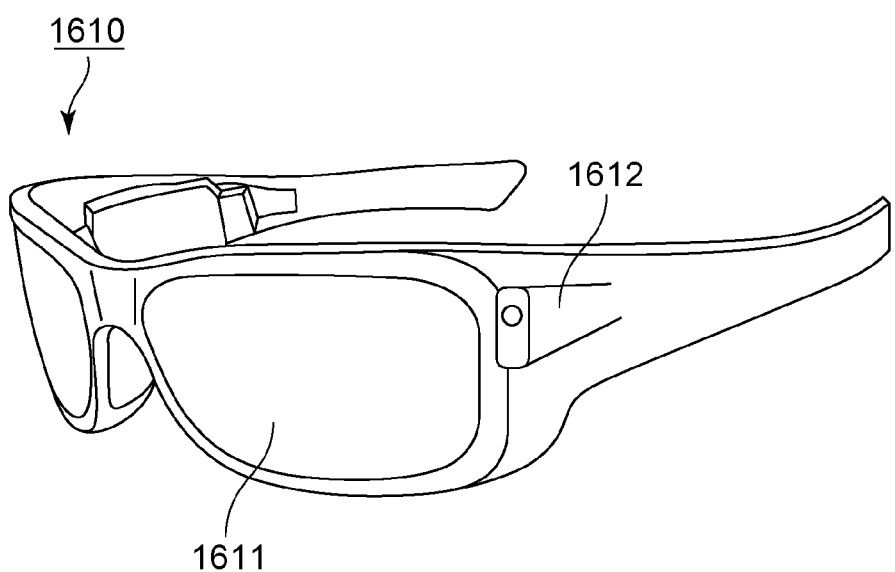
FIG. 7B is a schematic view illustrating one example of a wearable device according to one embodiment of the present disclosure, the wearable device including an imaging apparatus.

FIG. 7B illustrates glasses 1610 (smart glasses) according to one example of applications. The glasses 1610 have a control unit 1612. The control unit 1612 includes an imaging apparatus corresponding to the imaging apparatus 1602 and a display apparatus. An optical system for projecting light emitted from the imaging apparatus and the display apparatus in the control unit 1612 is formed on a lens 1611, and an image is projected on the lens 1611. The control unit 1612 functions as a power supply that supplies electric power to the imaging apparatus and the display apparatus and controls the operation of the imaging apparatus and the display apparatus. The control unit may have a gaze detection unit that detects the gaze of the wearer. Infrared rays may be used to detect the gaze. An infrared light-emitting unit emits infrared light to an eyeball of the user who is gazing at a displayed image. The emitted infrared light is reflected by the eyeball, and the reflected light is detected by an imaging unit including a light-receiving device to provide a captured image of the eyeball. The deterioration of the image quality is reduced by providing a reducing unit that reduces light from the infrared light-emitting unit to a display unit in plan view.

The gaze of the user to the displayed image is detected from the captured image of the eyeball captured with the infrared light. Any publicly known method is applicable to the gaze detection using the captured image of the eyeball. As one example, a gaze detection method based on the Purkinje image formed by the reflection of irradiation light on the cornea can be employed.

More specifically, a gaze detection process based on a pupil-corneal reflection method is performed. The pupil-corneal reflection method is used, on the basis of the image of the pupil and the Purkinje image included in the captured image of the eyeball, to calculate a gaze vector representing the direction (rotation angle) of the eyeball, thereby detecting the gaze of the user.

A display apparatus according to one embodiment of the present disclosure may include an imaging apparatus having a light-receiving device, and may control a displayed image of the display apparatus on the basis of the gaze information of the user from the imaging apparatus.

Specifically, in the display apparatus, a first field-of-view region at which the user gazes and a second field-of-view region other than the first field-of-view region are determined on the basis of the gaze information. The first field-of-view region and the second field-of-view region may be determined by the control unit of the display apparatus or may be determined by receiving those determined by an external control unit. In the display region of the display apparatus, the display resolution of the first field-of-view region may be controlled to be higher than the display resolution of the second field-of-view region. That is, the resolution of the second field-of-view region may be controlled to be lower than that of the first field-of-view region.

The display region includes a first display region and a second display region different from the first display region. An area of higher priority is determined from the first display region and the second display region on the basis of the gaze information. The first display region and the second display region may be determined by the control unit of the display apparatus or may be determined by receiving those determined by an external control unit. The resolution of an area of higher priority may be controlled to be higher than the resolution of an area other than the area of higher priority. That is, the resolution of an area of a relatively low priority may be controlled to be low.

The first field-of-view region or the area of higher priority may be determined by artificial intelligence (AI). The AI may be a model configured to estimate the angle of the gaze and the distance to a target object located in the gaze direction from images of the eyeball by using, as teaching data, images of the eyeball and the actual gaze direction of the eyeball in the images. The AI program may be stored in the display apparatus, the imaging apparatus, or an external apparatus. When the AI program is stored in the external apparatus, the AI program is transmitted through communication to the display apparatus.

In the case of controlling the display on the basis of visual recognition detection, smart glasses further including an imaging apparatus that captures an external image can be applied. The smart glasses can display the captured external information in real time.

As described above, the use of an apparatus that uses the organic light-emitting device according to this embodiment can achieve a stable display with good image quality even for a long time.

EXAMPLES

The organic metal complex according to the present disclosure can be synthesized by, for example, a synthetic method described below. The following shows the synthesis of exemplary compound A-1 as an example.

(8)
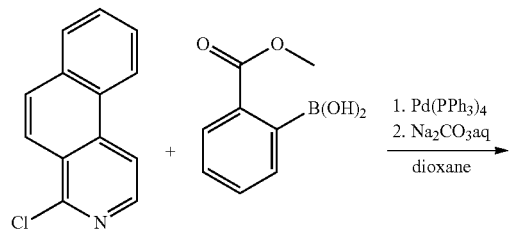
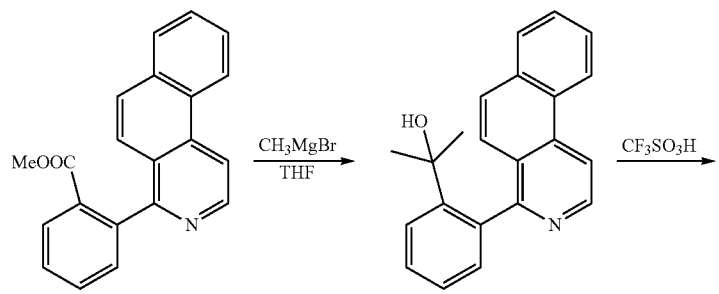
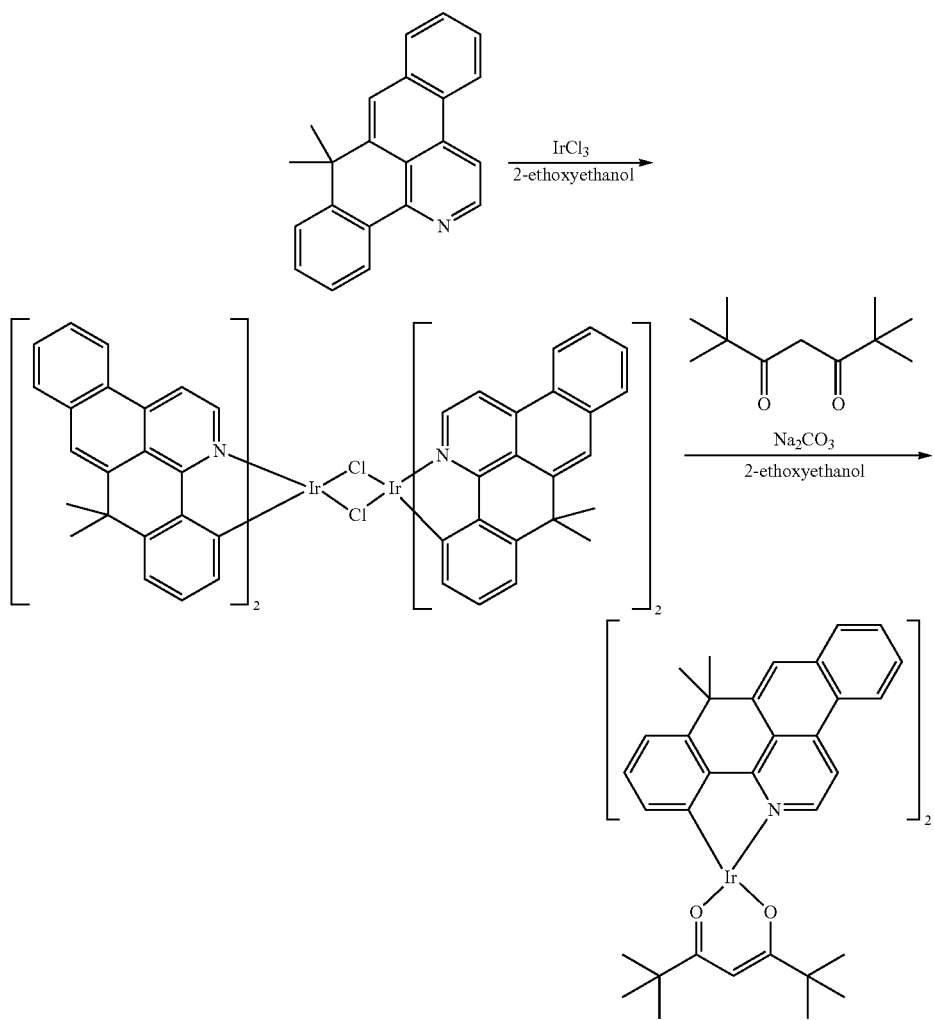

Example 1

Synthesis of Exemplary Compound A-1

Exemplary compound A-1 was synthesized through the following procedure.

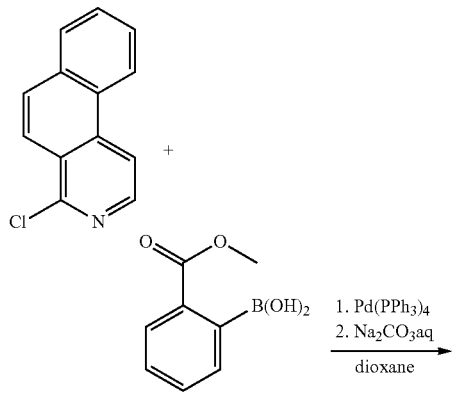

In a nitrogen atmosphere, 2.19 g of 2-(methoxycarbonyl)phenylboronic acid, 2.0 g of 4-chlorobenzo[f]isoquinoline, 0.54 g of tetrakis(triphenylphosphine)palladium, 100 ml of 1,4-dioxane, 30 ml of pure water, and 3.00 g of sodium carbonate were added to a 200 ml recovery flask. The temperature of this solution was elevated from room temperature to 90° C., and stirring was performed for 12 hours. Chloroform and water were added to the resulting product to extract an organic layer. Magnesium sulfate was added to the organic layer, and filtration was conducted. After concentration, the resulting product was put through a column with a hexane solution containing 10% ethyl acetate. The resulting liquid was concentrated to obtain 1.61 g of intermediate 1. The structure was identified by $^1$H-NMR and GC-MS.

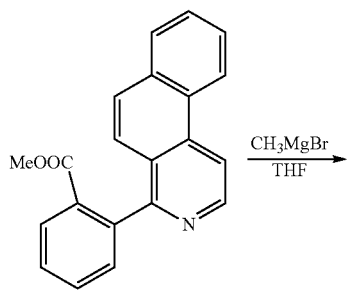

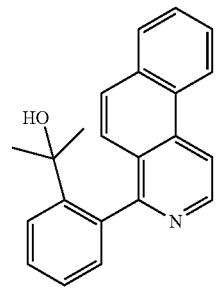

In a nitrogen atmosphere, 1.5 g of intermediate 1, 50 ml of dehydrated THF, and 40 ml of a 1.06 M methylmagnesium bromide/tetrahydrofuran solution were added to a 300 ml recovery flask. This solution was stirred at room temperature for 12 hours. The reaction was terminated with a saturated aqueous ammonium chloride solution. Chloroform and water were added to the resulting product, magnesium sulfate was added to an extracted organic layer, and filtration was conducted. The solvent was concentrated, and the resulting product was then put through a column with a hexane solution containing 10% ethyl acetate. The resulting liquid was concentrated to obtain 1.11 g of intermediate 2. The structure was identified by $^1$H-NMR and GC-MS.

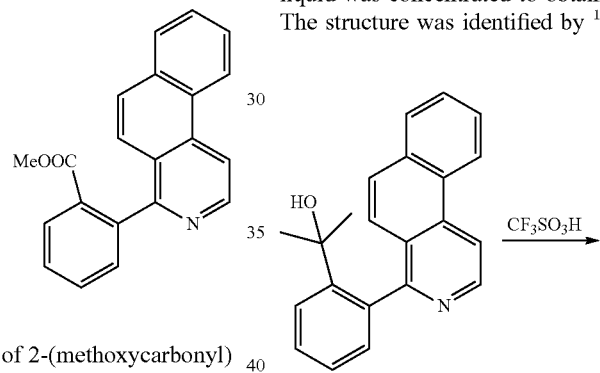

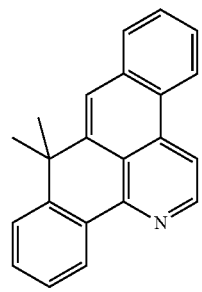

In a nitrogen atmosphere, 1.0 g of intermediate 2 and 10 ml of trifluoromethanesulfonic acid were added to a 100 ml recovery flask. Subsequently, stirring was performed at room temperature for one hour. Dichloromethane and water were added to the resulting product, magnesium sulfate was added to an extracted organic layer, and filtration was conducted. The solvent was concentrated to obtain 0.85 g of intermediate 3. The structure was identified by $^1$H-NMR and GC-MS.

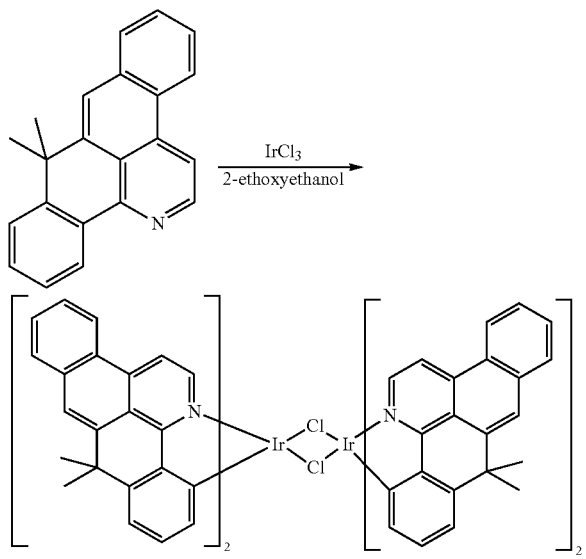

In a nitrogen atmosphere, 0.80 g of intermediate 3, 0.48 g of iridium chloride trihydrate, 30 ml of 2-ethoxyethanol, and 10 ml of pure water were added to a 200 ml recovery flask. The temperature of this solution was elevated from room temperature to 120° C., and stirring was performed for 20 hours. Water was added to the resulting product, and a precipitated solid was filtered. The filtered solid was washed with methanol and hexane to obtain 1.00 g of intermediate 4.

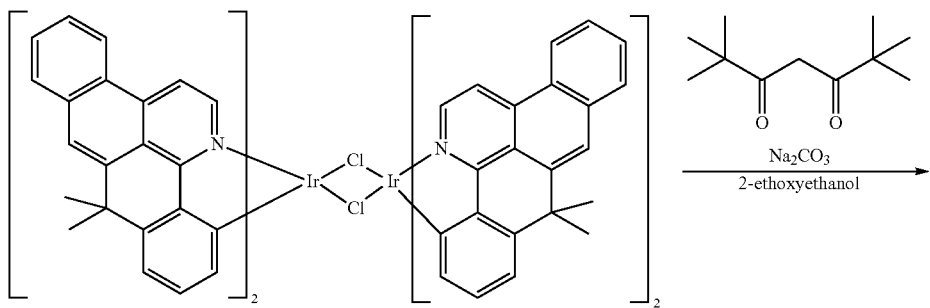

In a nitrogen atmosphere, 0.5 g of intermediate 4, 0.28 g of dipivaloylmethane, 10 ml of 2-ethoxyethanol, and 0.16 g of sodium carbonate were added to a 100 ml recovery flask. The temperature of this solution was elevated from room temperature to 120° C., and stirring was performed for 20 hours. Water was added to the resulting product, and a precipitated solid was filtered. The filtered solid was washed with methanol to obtain 0.47 g of exemplary compound A-1.

As a result of NMR measurement, the ratio of integrated values of peaks were well in accord with that of the structure of exemplary compound A-1, which demonstrated that the obtained compound was exemplary compound A-1. The measurement results of the NMR spectrum are as follows.

1H-NMR (deuterochloroform) δ (ppm): 7.20 (t, 1H), 6.99-6.83 (m, 5H), 6.74 (d, 1H), 6.72-6.65 (m, 2H), 4.45 (sep, 2H), 3.69 (s, 3H), 3.25 (sep, 1H), 2.28 (s, 3H), 1.62 (d, 6H), 1.42-1.02 (d, br, 12H)

Example 2

Evaluation of Light Emission Characteristics and Light Emission Efficiency

A toluene solution ($1.0 \times 10^{-5}$ M) of exemplary compound A-1 obtained in Example 1 was prepared, and an emission spectrum and a quantum yield were measured. The emission wavelength, the half-value width (full width at half maximum FWHM) of the emission spectrum, the chromaticity coordinates, and the emission quantum yield of the iridium complex were calculated from the obtained results and shown in Table 3. Similarly, the measurement results of compound A and compound B used as comparative compounds are shown. The half-value width of the emission

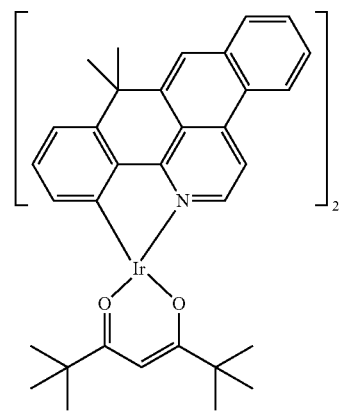

spectrum is a peak width of the emission spectrum. Since the width was measured at about half of the maximum emission intensity, the peak width was represented in terms of the half-value width.

TABLE 3

| | Comparative Example 1 | Comparative Example 2 | Example 1 |
|---|---|---|---|
| Structure | Compound B | Compound A | Exemplary compound A-1 |
| $\lambda_{max}$ | 620 nm | 619 nm | 572 nm |
| FWHM | 68 nm | 68 nm | 35 nm |
| Color purity CIE (x, y) | (0.66, 0.34) | (0.66, 0.34) | (0.52, 0.480) |
| Emission quantum yield (PL) | 0.59 | 0.84 | 0.91 |

Example 3

Synthesis of Exemplary Compound A-52

Exemplary compound A-52 was synthesized through the following procedure.

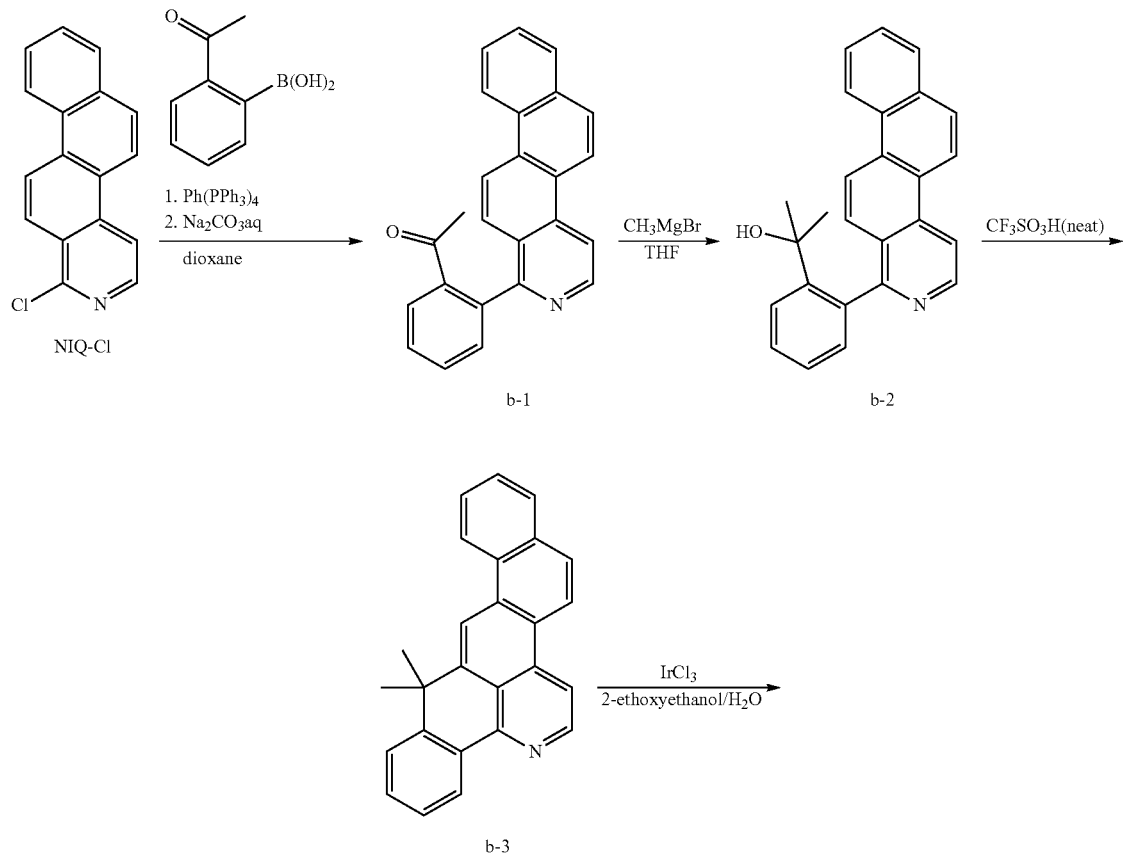

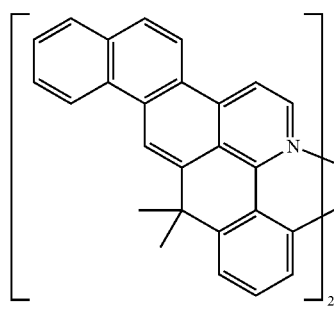

b-4

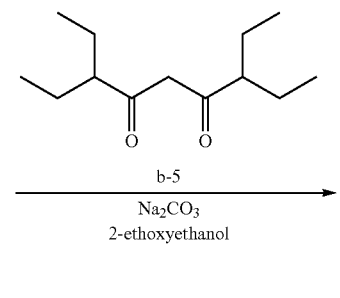

b-5
Na₂CO₃
2-ethoxyethanol

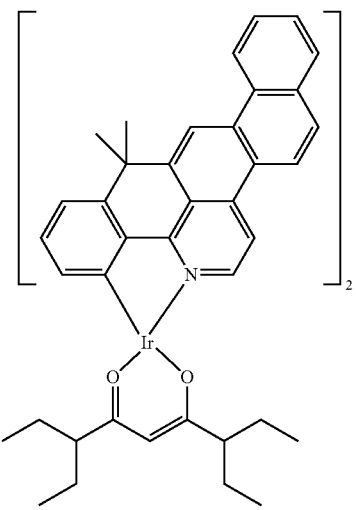

A-52

In a nitrogen atmosphere, 0.5 g (1.90 mmol) of NIQ-Cl, 0.37 g (2.28 mmol) of 2-acetoxyphenylboronic acid, 0.11 g (0.095 mmol) of tetrakis(triphenylphosphine)palladium, 15 ml of 1,4-dioxane, 5 ml of pure water, and 0.40 g (3.80 mmol) of sodium carbonate were added to a 100 ml recovery flask. The temperature of this solution was elevated from room temperature to 110° C., and stirring was performed for six hours. Chloroform and water were added thereto to extract an organic layer. Magnesium sulfate was added to the organic layer, and filtration was conducted. After concentration, the resulting product was purified with a column to obtain 0.56 g of intermediate b-1.

Subsequently, in a nitrogen atmosphere, 0.5 g (1.44 mmol) of intermediate b-1 and 20 ml of dehydrated THF were added to a 100 ml recovery flask and stirred in an ice bath. After 4.1 ml (4.32 mmol) of a 1.06 M methylmagnesium bromide/tetrahydrofuran solution was added dropwise thereto, the temperature of the solution was elevated to room temperature, and stirring was performed for 12 hours. The reaction was terminated with a saturated aqueous ammonium chloride solution. Chloroform and water were added thereto, magnesium sulfate was added to an extracted organic layer, and filtration was conducted. The solvent was concentrated, and the resulting product was then purified with a column to obtain 0.26 g of intermediate b-2.

In a nitrogen atmosphere, 0.2 g (0.56 mmol) of intermediate b-2 was suspended in 5 ml of trifluoromethanesulfonic acid in a 100 ml recovery flask, and stirring was performed at 120° C. for five hours. After completion of the reaction, the reaction solution was neutralized with an aqueous sodium hydroxide solution while stirring in an ice bath, chloroform and water were added thereto, magnesium sulfate was added to an extracted organic layer, and filtration was conducted. After concentration, the resulting product was purified with a column to obtain 0.17 g of intermediate b-3.

In a nitrogen atmosphere, 0.15 g (0.44 mmol) of intermediate b-3, 1.5 mg (0.44 mmol) of iridium chloride trihydrate, 10 ml of 2-ethoxyethanol, and 5 ml of pure water were mixed, and the resulting solution was stirred at 120° C. for 20 hours. Water was added thereto, and a precipitated solid was filtered. The filtered solid was washed with methanol and hexane to obtain 0.15 g of intermediate b-4. This intermediate b-4 was mixed with 10 ml of 2-ethoxyethanol, and 199 mg of a diketone compound b-5 and 78 mg of sodium carbonate were added thereto. The resulting mixture was then stirred at 120° C. for five hours. Water was added thereto, and a precipitated solid was filtered. The filtered solid was washed with methanol to obtain 0.10 g of exemplary compound A-52.

Example 4
Synthesis of Exemplary Compound A-53
Exemplary compound A-53 was synthesized through the following procedure.
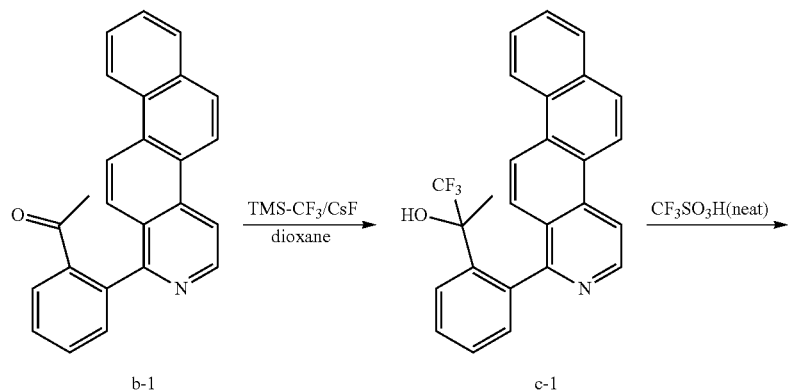
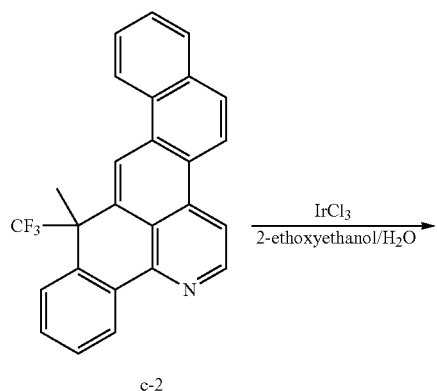
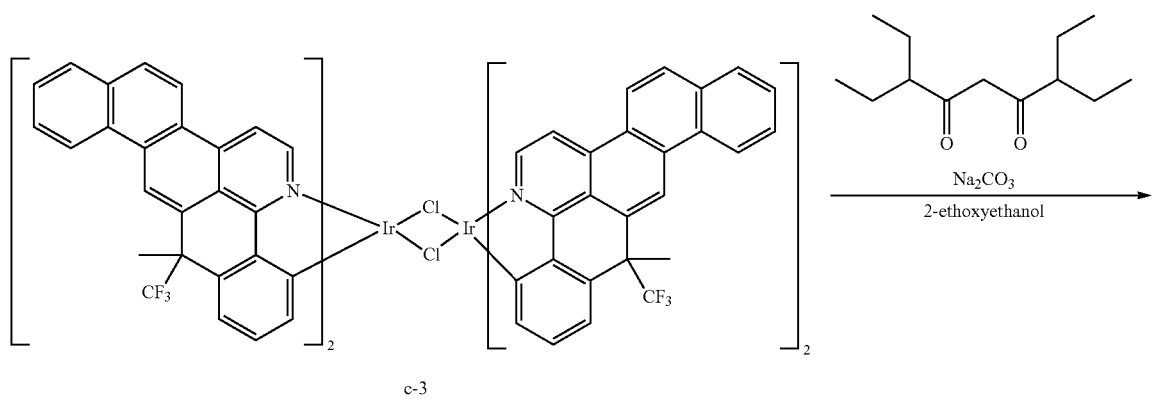

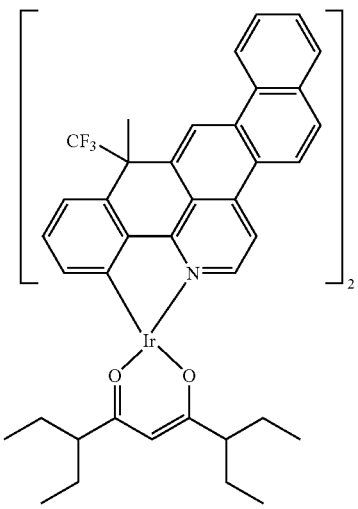

A-53

In a nitrogen atmosphere, 0.5 g (1.44 mmol) of intermediate b-1 in Example 3, 437 mg (2.88 mmol) of cesium fluoride, and 20 ml of dehydrated 1,4-dioxane were mixed and stirred in a 100 ml recovery flask. After dropwise addition of 410 mg (2.88 mmol) of (trifluoromethyl)trimethylsilane, the resulting solution was stirred at room temperature for three hours. A saturated aqueous sodium hydroxide solution was added thereto, and stirring was performed at 50° C. for 30 minutes. Subsequently, distilled water and chloroform were added to the residue, magnesium sulfate was added to an extracted organic layer, and filtration was conducted. The solvent was concentrated to obtain 0.54 g of intermediate c-1.

In a nitrogen atmosphere, 0.50 g (1.20 mmol) of intermediate c-1 was suspended in 5 ml of trifluoromethanesulfonic acid in a 100 ml recovery flask, and stirring was performed at 120° C. for five hours. After completion of the reaction, the reaction solution was neutralized with an aqueous sodium hydroxide solution while stirring in an ice bath, chloroform and water were added thereto, magnesium sulfate was added to an extracted organic layer, and filtration was conducted. After concentration, the resulting product was purified with a column to obtain 0.33 g of intermediate c-2.

In a nitrogen atmosphere, 0.25 g (0.63 mmol) of intermediate c-2, 90 mg (0.30 mmol) of iridium chloride trihydrate, 20 ml of 2-ethoxyethanol, and 7 ml of pure water were mixed, and the resulting solution was stirred at 120° C. for 20 hours. Water was added thereto, and a precipitated solid was filtered. The filtered solid was washed with methanol and hexane to obtain 0.21 g of intermediate c-3. This intermediate c-3 was mixed with 10 ml of 2-ethoxyethanol, and 177 mg of a diketone compound b-5 and 88 mg of sodium carbonate were added thereto. The resulting mixture was then stirred at 120° C. for five hours. Water was added thereto, and a precipitated solid was filtered. The filtered solid was washed with methanol to obtain 0.10 g of exemplary compound A-53.

Example 5

Evaluation of Light Emission Characteristics and Light Emission Efficiency

Exemplary compound A-52 obtained in Example 3 and exemplary compound A-53 obtained in Example 4 were each dissolved in toluene ($1.0 \times 10^{-5}$ M), and emission spectra and quantum yields were measured as in Example 2. The obtained results are shown in Table 4.

TABLE 4

| | Exemplary compound A-52 | Exemplary compound A-53 |
|---|---|---|
| Structure | A-52 | A-53 |

TABLE 4-continued

|  | Exemplary compound A-52 | Exemplary compound A-53 |
|---|---|---|
| $\lambda$max | 582 nm | 589 nm |
| FWHM | 32 nm | 33 nm |
| Color purity CIE (x, y) | (0.57, 0.43) | (0.59, 0.41) |
| Emission quantum yield (PL) | 0.89 | 0.91 |

As described above, the organic metal complex according to the present disclosure can achieve both a small half-value width of the emission spectrum and a high emission quantum yield.

The present disclosure can provide an organic metal complex having a small half-value width of a peak of the emission spectrum and having high light emission efficiency.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-043285 filed Mar. 17, 2021, which is hereby incorporated by reference herein in its entirety.

What is claimed is:

1. An organic metal complex represented by formula (1):

where in formula (1), M represents a transition metal, and $L_m$, $L'_n$, and $L''_l$ represent ligands different from each other; m is an integer of 1 to 3, n is an integer of 0 to 2, l is an integer of 0 to 2, and m+n+l=3; and $ML_m$ is a structure represented by formula (2):

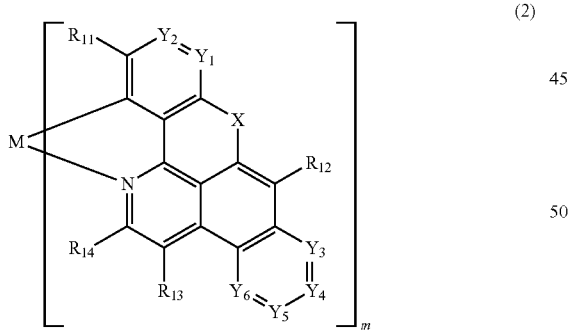

where in formula (2), $R_{11}$ to $R_{14}$ are each independently selected from the group consisting of a hydrogen atom, a deuterium atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted aralkyl group, a substituted or unsubstituted amino group, a silyl group, and a cyano group;

X is selected from the group consisting of CRR', SiRR', S, SO, and $SO_2$; R and R' are each independently selected from the group consisting of a substituted or unsubstituted alkyl group, a substituted or unsubstituted aryl group, and a halogen atom;

$Y_1$ to $Y_6$ are each independently selected from the group consisting of a carbon atom and a nitrogen atom;

when $Y_1$ to $Y_6$ are carbon atoms, the carbon atoms may each be substituted with an alkyl group or an aryl group;

when $Y_3$ to $Y_6$ are carbon atoms, each of the carbon atoms may be bound to a carbon atom adjacent to the carbon atom to form a ring structure; and $ML'_n$ and $ML''_l$ are each independently selected from the group consisting of formulae (4) and (5):

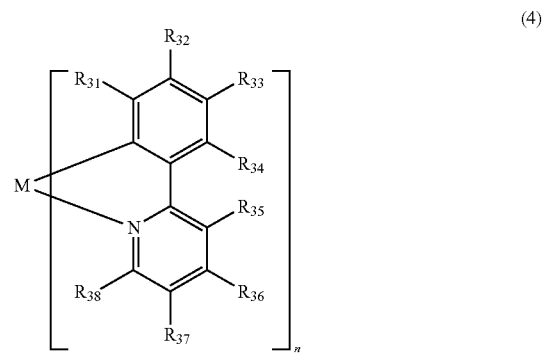

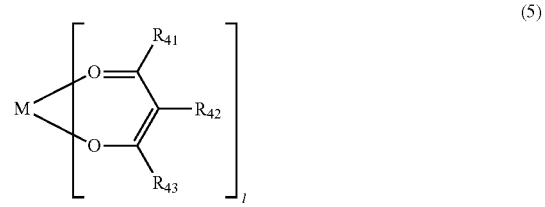

where in formulae (4) and (5), $R_{31}$ to $R_{38}$ and $R_{41}$ to $R_{43}$ are each independently selected from the group consisting of a hydrogen atom, a deuterium atom, a halogen atom, a substituted or unsubstituted alkyl group, a substituted or unsubstituted alkoxy group, a substituted or unsubstituted aralkyl group, a substituted amino group, a substituted or unsubstituted aryl group, and a substituted or unsubstituted heterocyclic group.

2. The organic metal complex according to claim 1, wherein $ML_m$ is a structure represented by formula (3):

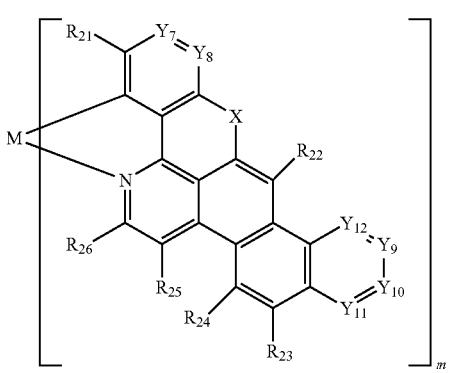

where in formula (3), $R_{21}$ to $R_{26}$ are each independently selected from the group consisting of a hydrogen atom, a deuterium atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted aralkyl group, a substituted or unsubstituted amino group, a silyl group, and a cyano group;

X is selected from the group consisting of CRR', SiRR', S, SO, and $SO_2$; R and R' are each independently selected from the group consisting of a substituted or unsubstituted alkyl group, a substituted or unsubstituted aryl group, and a halogen atom;

$Y_7$ to $Y_{12}$ are each independently selected from the group consisting of a carbon atom and a nitrogen atom; and when $Y_7$ to $Y_{12}$ are carbon atoms, the carbon atoms may each be substituted with an alkyl group or an aryl group.

3. The organic metal complex according to claim 1, wherein M is Ir.

4. The organic metal complex according to claim 1, wherein X is CRR', and R and R' are each independently selected from the group consisting of a substituted or unsubstituted alkyl group, a substituted or unsubstituted aryl group, and a halogen atom.

5. The organic metal complex according to claim 1, wherein $Y_1$ to $Y_6$ are all carbon atoms.

6. The organic metal complex according to claim 1, wherein $Y_1$ is a nitrogen atom.

7. The organic metal complex according to claim 1, wherein $Y_4$ is a nitrogen atom.

8. The organic metal complex according to claim 1, wherein a half-value width of an emission spectrum is 40 nm or less.

9. The organic metal complex according to claim 1, wherein in formula (2), $R_{11}$ to $R_{14}$ are each independently selected from the group consisting of the hydrogen atom, the deuterium atom, and the aryl group.

10. An organic light-emitting device comprising:
a first electrode;
a second electrode; and
an organic compound layer disposed between the first electrode and the second electrode,
wherein the organic compound layer contains the organic metal complex according to claim 1.

11. The organic light-emitting device according to claim 10,
wherein the organic compound layer includes a light-emitting layer, and
the light-emitting layer contains the organic metal complex and a first organic compound having a lowest excited singlet energy higher than that of the organic metal complex.

12. The organic light-emitting device according to claim 11,
wherein the light-emitting layer contains a second organic compound different from the first organic compound, and
the second organic compound has a lowest excited triplet energy lower than that of the first organic compound and higher than that of the organic metal complex.

13. The organic light-emitting device according to claim 11,
wherein the organic compound layer includes a first organic compound layer between the light-emitting layer and the second electrode, and
the first organic compound layer has a lowest excited triplet energy higher than that of the light-emitting layer.

14. The organic light-emitting device according to claim 13, wherein the first organic compound layer is composed of a hydrocarbon compound.

15. The organic light-emitting device according to claim 11,
wherein the organic compound layer includes a second organic compound layer between the light-emitting layer and the first electrode, and
the second organic compound layer has a lowest excited triplet energy higher than that of the light-emitting layer.

16. The organic light-emitting device according to claim 15, wherein the second organic compound layer is composed of a hydrocarbon compound.

17. A display apparatus comprising:
a plurality of pixels,
wherein at least one of the plurality of pixels includes the organic light-emitting device according to claim 10 and a transistor connected to the organic light-emitting device.

18. An imaging apparatus comprising:
an optical unit including a plurality of lenses;
an imaging device that receives light that has passed through the optical unit; and
a display unit that displays an image captured by the imaging device,
wherein the display unit includes the organic light-emitting device according to claim 10.

19. An electronic apparatus comprising:
a display unit that includes the organic light-emitting device according to claim 10,
a housing in which the display unit is disposed; and
a communication unit that is disposed in the housing and communicates with an external unit.

20. An illumination apparatus comprising:
a light source that includes the organic light-emitting device according to claim 10; and
a light diffusion unit or optical filter that transmits light emitted from the light source.

21. A moving object comprising:
a lighting fixture that includes the organic light-emitting device according to claim 10; and
a body on which the lighting fixture is disposed.

* * * * *